(12) United States Patent
Tan et al.

(10) Patent No.: US 12,300,774 B2
(45) Date of Patent: May 13, 2025

(54) MICRODISPLAY ARCHITECTURE WITH LIGHT EXTRACTION EFFICIENCY ENHANCEMENT

(71) Applicant: Meta Platforms Technologies, LLC, Menlo Park, CA (US)

(72) Inventors: Wei Sin Tan, Plymouth (GB); Andrea Pinos, Plymouth (GB); Samir Mezouari, Swindon (GB); Kathleen Bonnie Vinden, Exeter (GB); John Lyle Whiteman, St. Austell (GB)

(73) Assignee: Meta Platforms Technologies, LLC, Menlo Park, CA (US)

( * ) Notice: Subject to any disclaimer, the term of this patent is extended or adjusted under 35 U.S.C. 154(b) by 482 days.

(21) Appl. No.: 17/681,241

(22) Filed: Feb. 25, 2022

(65) Prior Publication Data

US 2023/0282789 A1 Sep. 7, 2023

(51) Int. Cl.
*H01L 33/60* (2010.01)
*G02B 27/01* (2006.01)
(Continued)

(52) U.S. Cl.
CPC .......... *H01L 33/60* (2013.01); *H01L 25/0753* (2013.01); *H01L 33/005* (2013.01); *G02B 27/0172* (2013.01); *H01L 2933/0058* (2013.01)

(58) Field of Classification Search
CPC ... H01L 33/60; H01L 25/0753; H01L 33/005; H01L 2933/0058; H01L 33/0093; H01L 33/46; H01L 33/56; G02B 27/0172
See application file for complete search history.

(56) References Cited

U.S. PATENT DOCUMENTS 6,410,942 B1   6/2002   Thibeault et al.
10,483,430 B1  11/2019  Lutgen et al.
(Continued)

FOREIGN PATENT DOCUMENTS

WO   WO-2021086935 A1   5/2021
WO   WO-2021088125 A1   5/2021

OTHER PUBLICATIONS

Chen P., et al., "Improved Performance of Passive-Matrix Micro-LED Displays using a Multi-Function Passivation Structure," IEEE Photonics Journal, Aug. 2020, vol. 12, No. 4, 12 pages.
(Continued)

*Primary Examiner* — Mohammad A Rahman
(74) *Attorney, Agent, or Firm* — Greenberg Traurig, LLP

(57) ABSTRACT

A light source comprises a backplane wafer with electrical circuits fabricated thereon, and an array of LEDs coupled to the backplane wafer. Each LED of the array of LEDs comprises a mesa structure including semiconductor epitaxial layers and characterized by inwardly tilted mesa sidewalls, a high-refractive index material region (e.g., with a refractive index greater than about 1.75, such as equal to or greater than a refractive index of the semiconductor epitaxial layers) surrounding the semiconductor epitaxial layers of the mesa structure and including outwardly tilted sidewalls, and a reflective layer on the outwardly tilted sidewalls of the high-refractive index material region. In one example, each LED of the array of LEDs also include a passivation layer on the inwardly tilted mesa sidewalls of the mesa structure.

18 Claims, 25 Drawing Sheets

(51) Int. Cl.
*H01L 25/075* (2006.01)
*H01L 33/00* (2010.01)

(56) References Cited

U.S. PATENT DOCUMENTS

2018/0090058 A1* 3/2018 Chen .................. G09G 3/32
2021/0288212 A1  9/2021 Young et al.
2021/0328116 A1* 10/2021 Li ....................... G09G 3/32

OTHER PUBLICATIONS

Guo Y., et al., "Enhancing the Light Extraction of AlGaN-Based Ultraviolet Light-Emitting Diodes in the Nanoscale," Journal of Nanophotonics, 2018, vol. 12, No. 4, 13 pages.
International Search Report and Written Opinion for International Application No. PCT/US2023/013426, mailed May 30, 2023, 10 pages.
Tan L., et al., "Light Extraction Enhancement of InGaN Based Micro Light-Emitting Diodes with Concave-Convex Circular Composite Structure Sidewall," Applied Sciences, 2019, vol. 9, No. 17, 10 pages.
Yu J., et al., "Investigations of Sidewall Passivation Technology on the Optical Performance for Smaller Size GaN-Based Micro-LEDs," Crystals, 2021, vol. 11, No. 4, 9 pages.

* cited by examiner

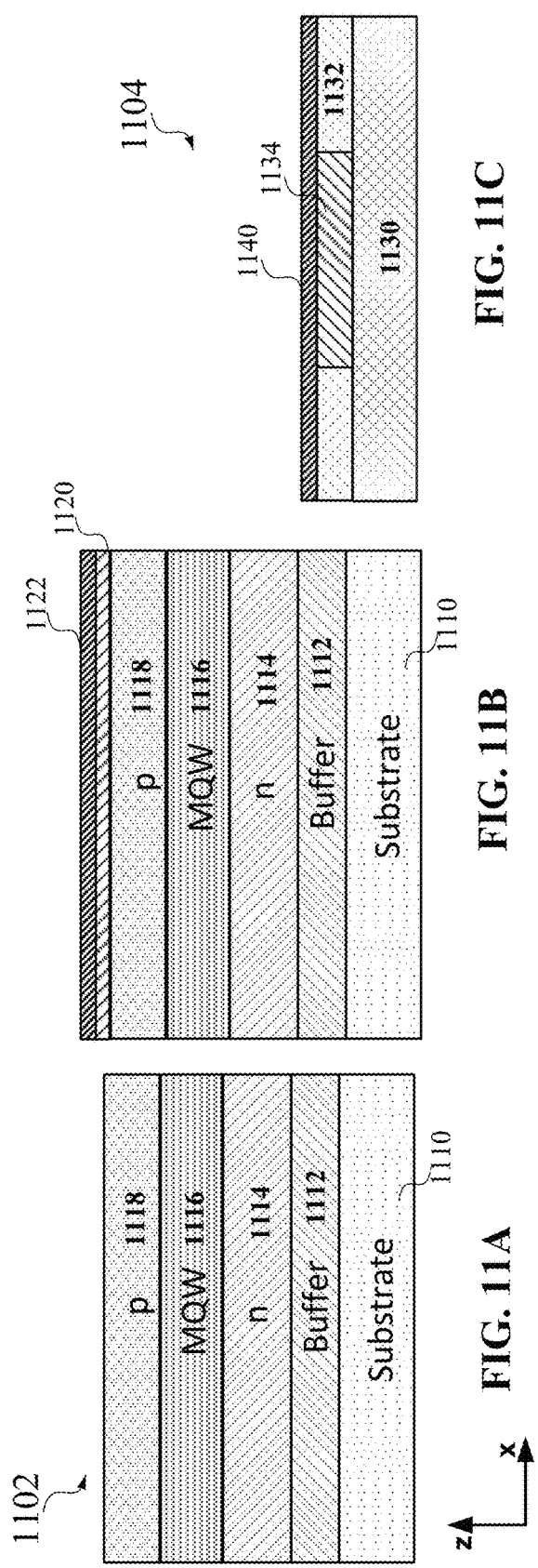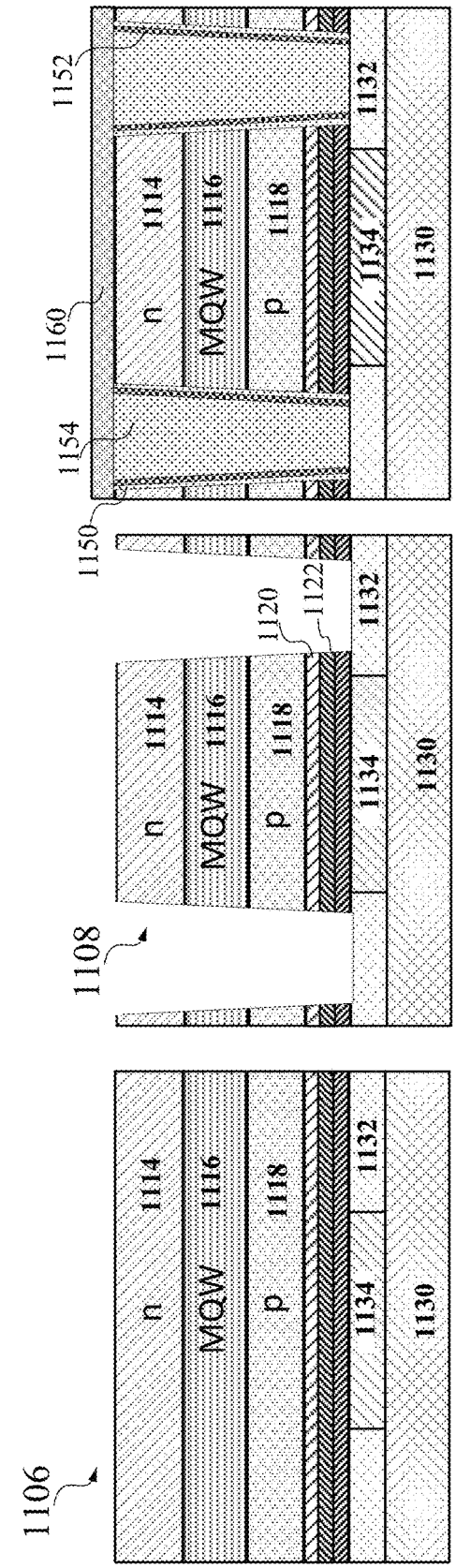
FIG. 11A  FIG. 11B  FIG. 11C  FIG. 11D  FIG. 11E  FIG. 11F

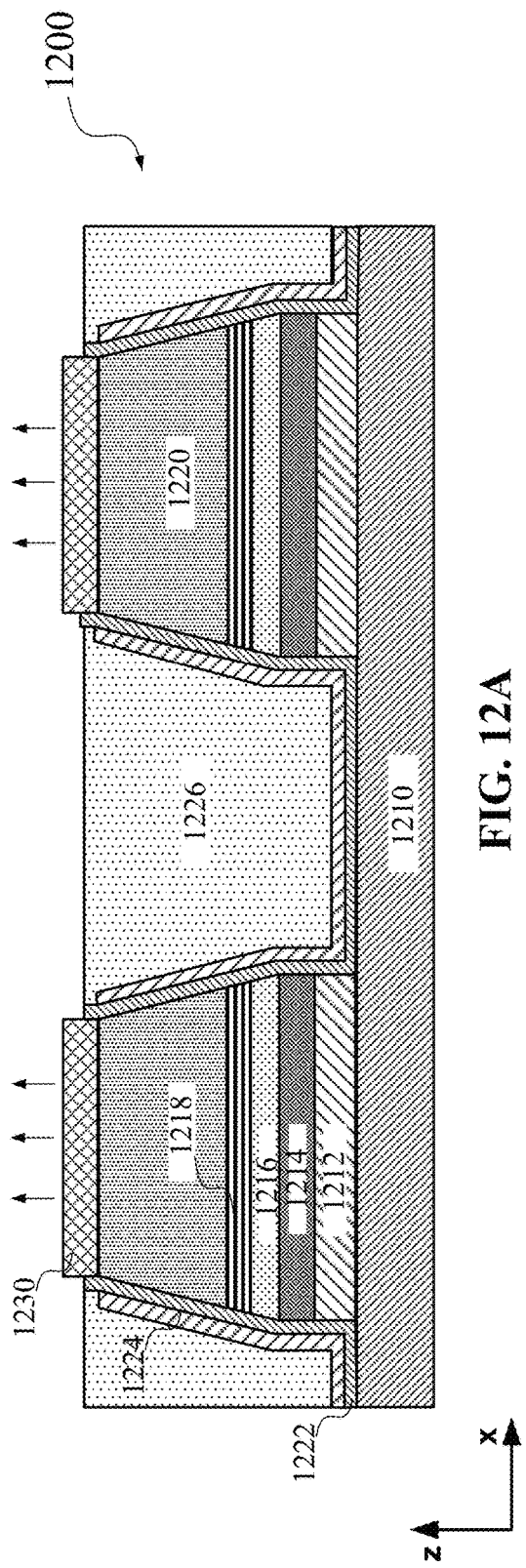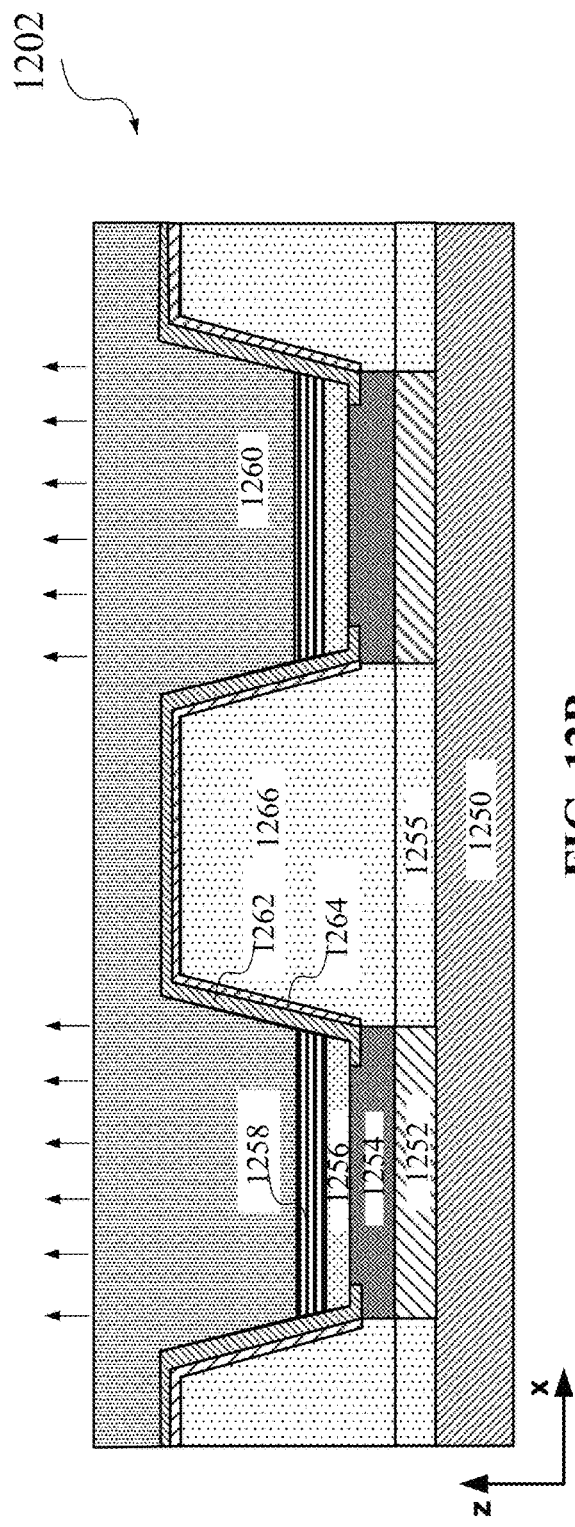

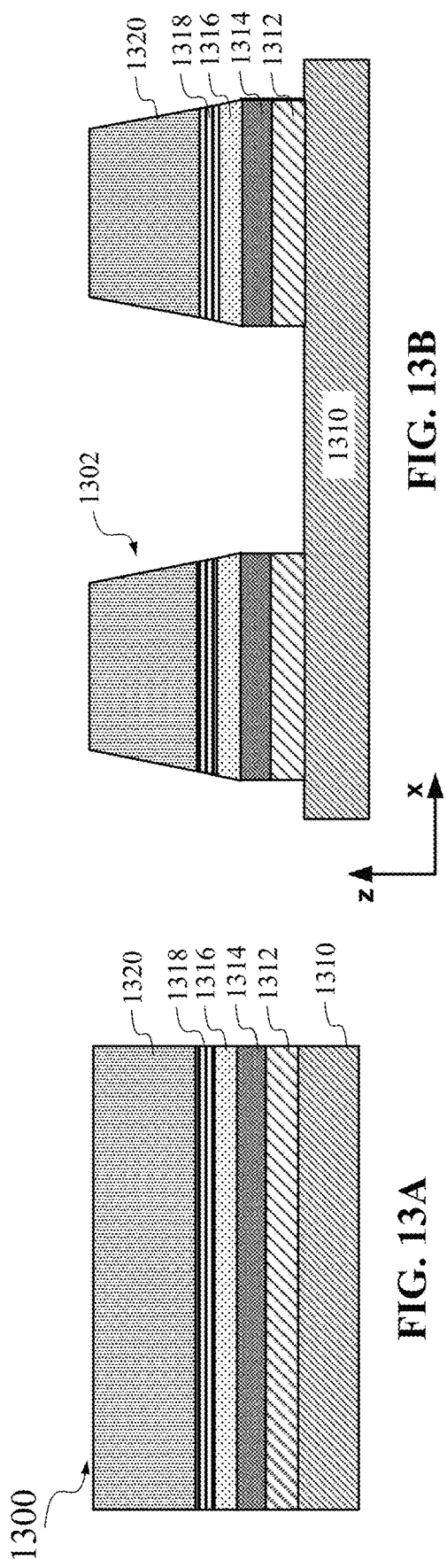

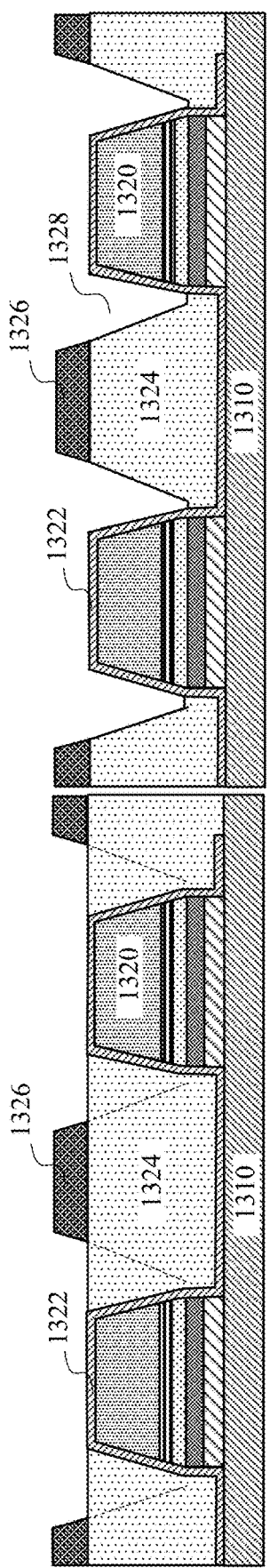
FIG. 13E
FIG. 13G
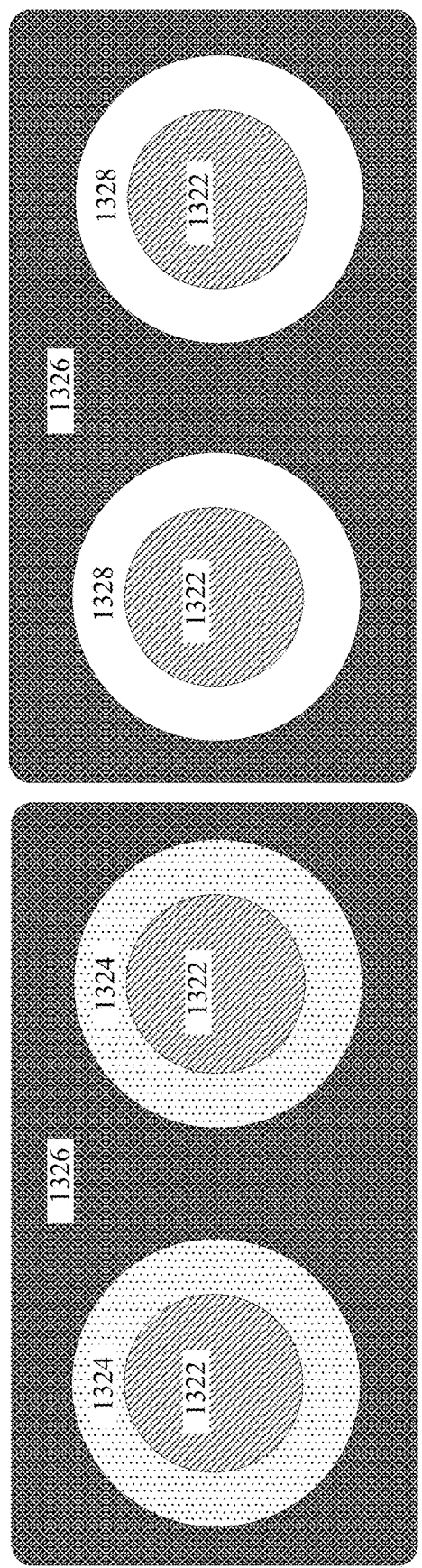
FIG. 13F
FIG. 13H

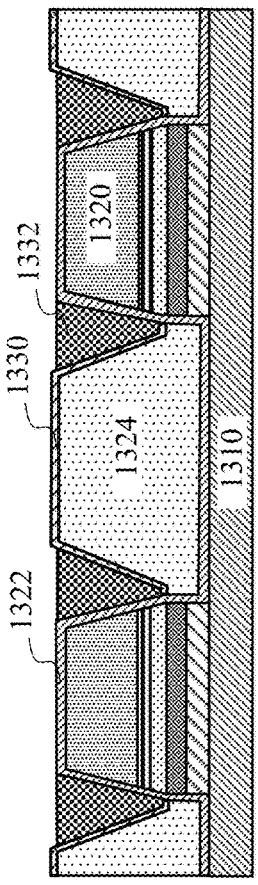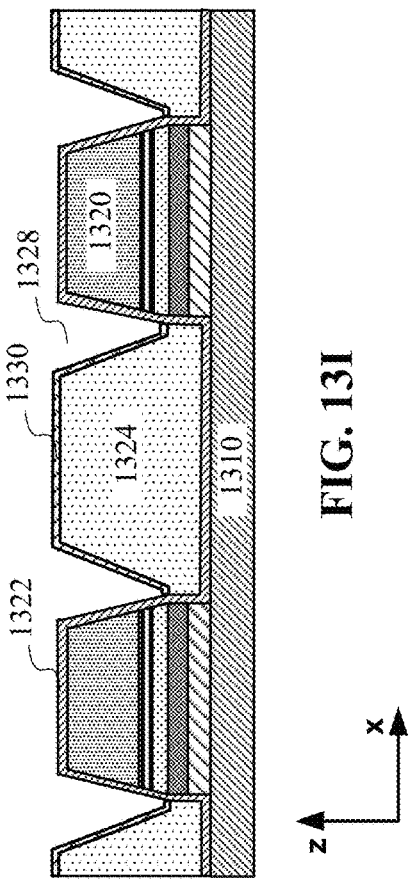
FIG. 13I
FIG. 13K
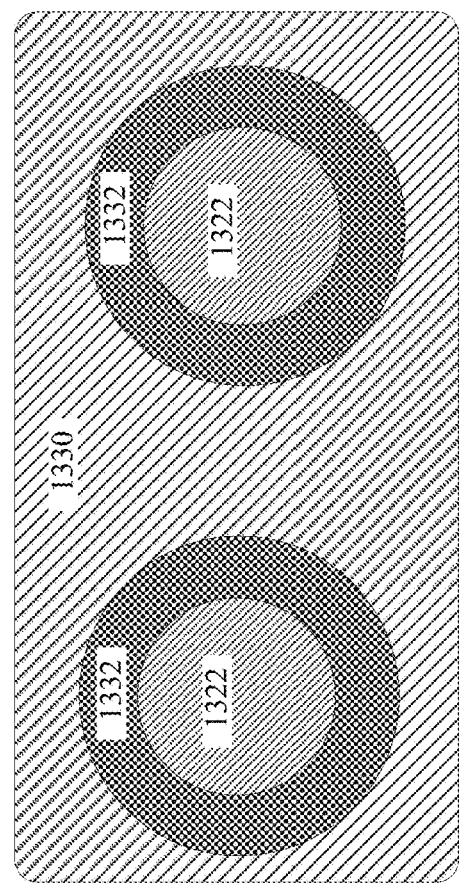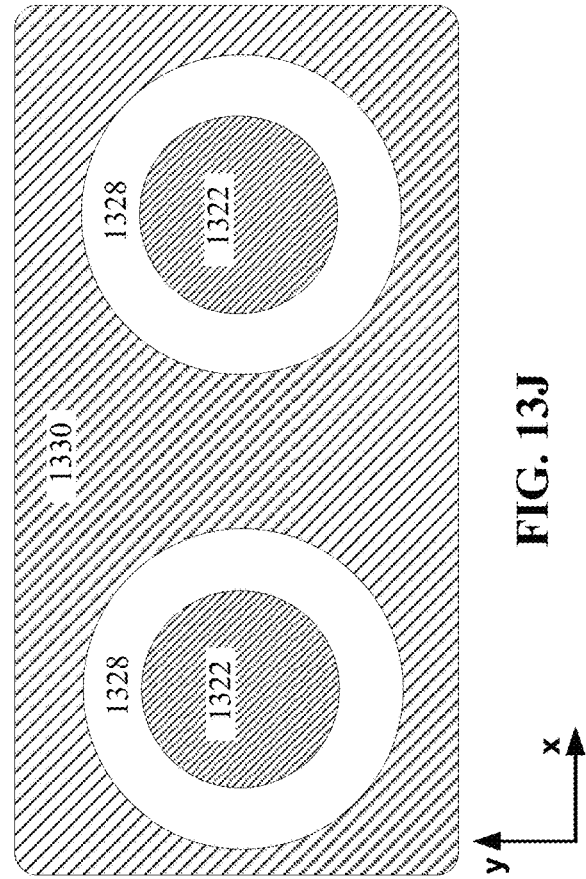
FIG. 13J
FIG. 13L

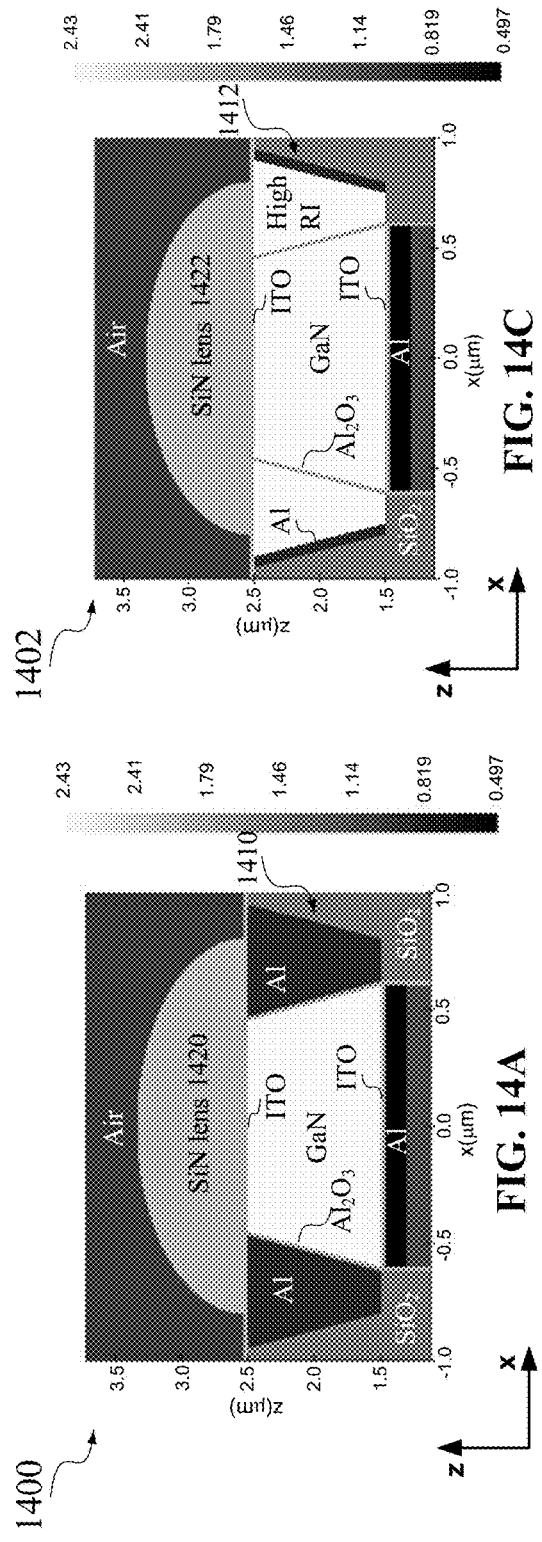
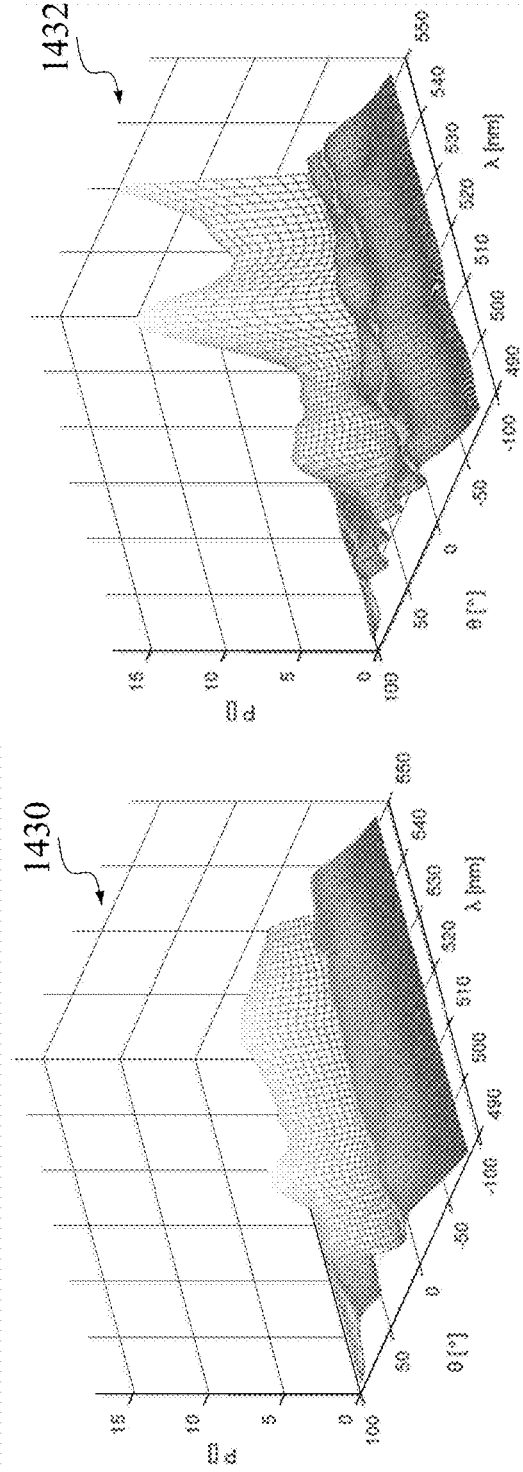
FIG. 14A
FIG. 14C
FIG. 14B
FIG. 14D

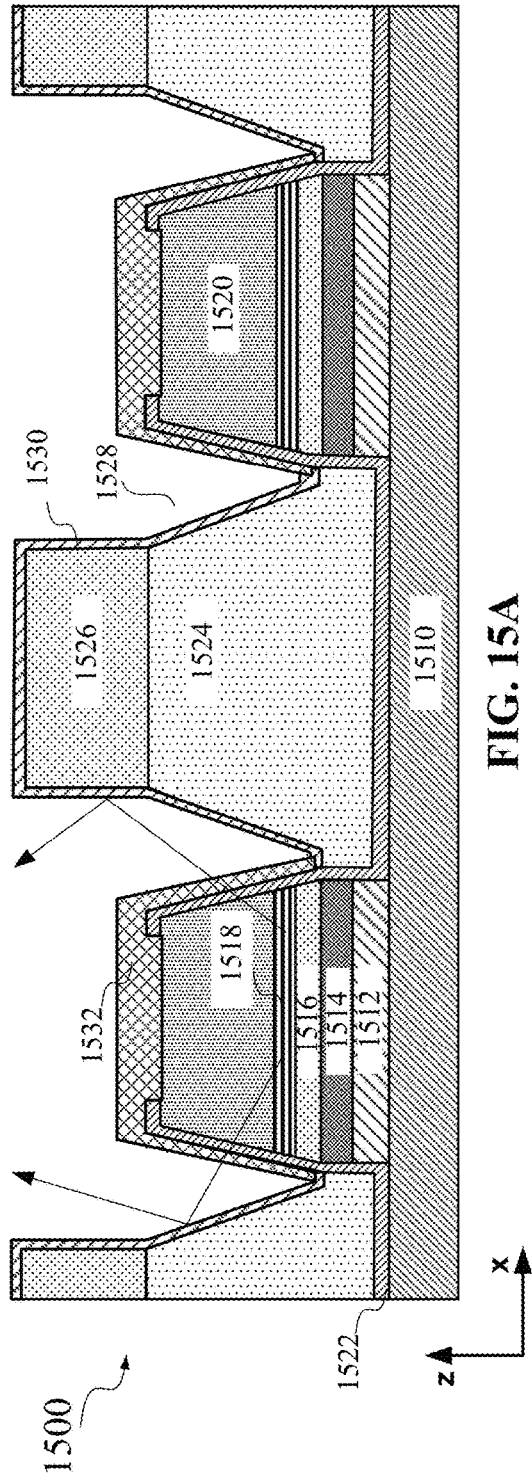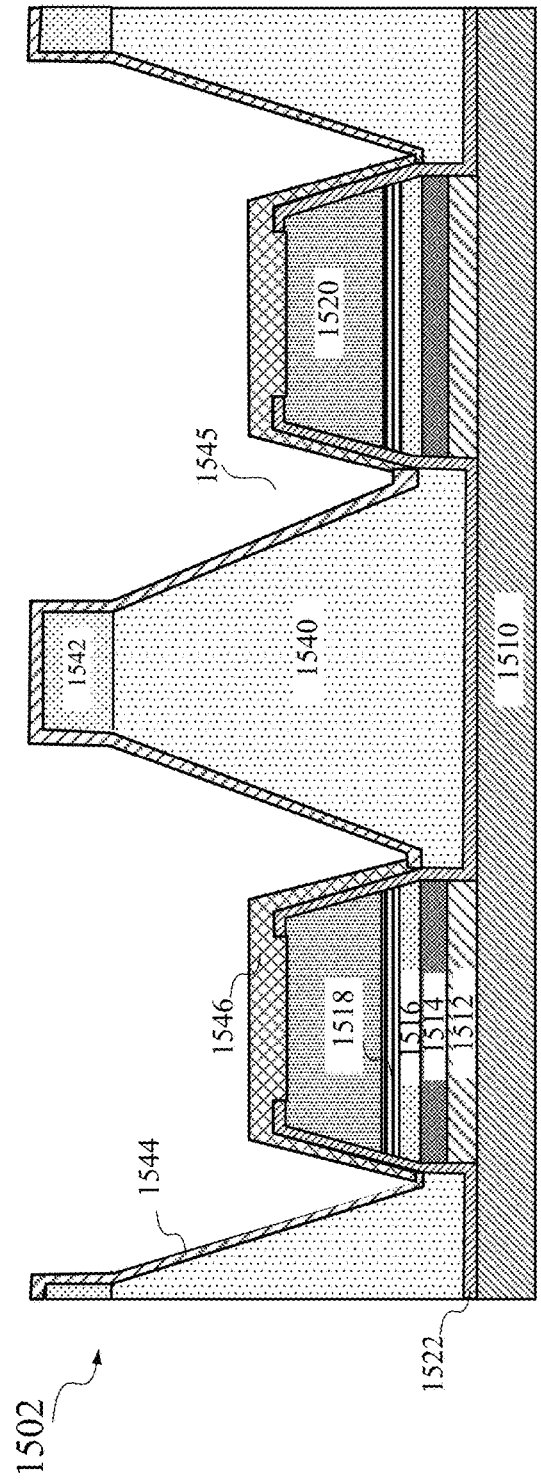

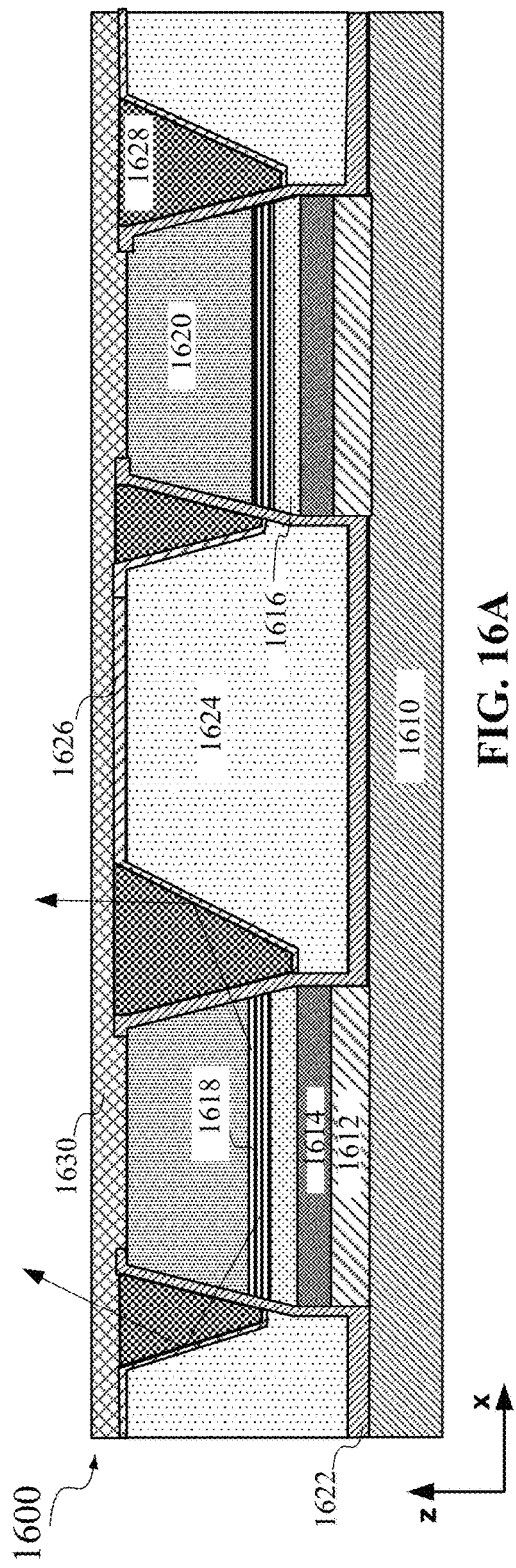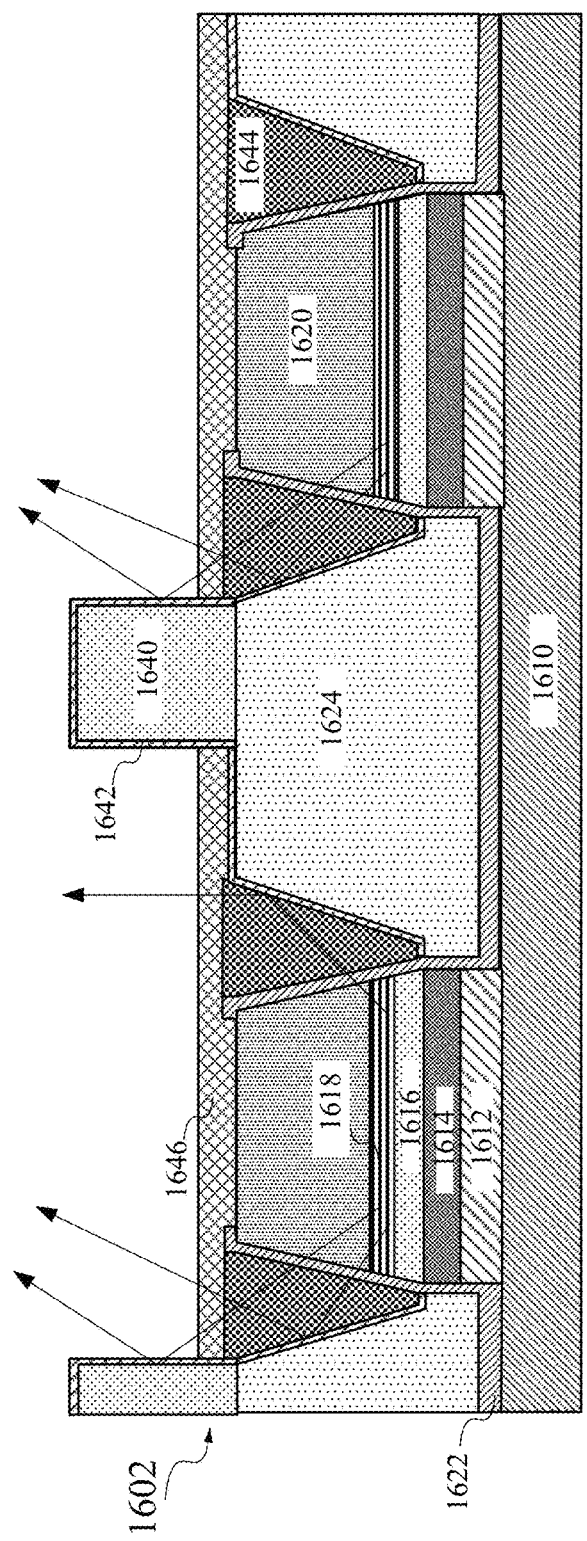

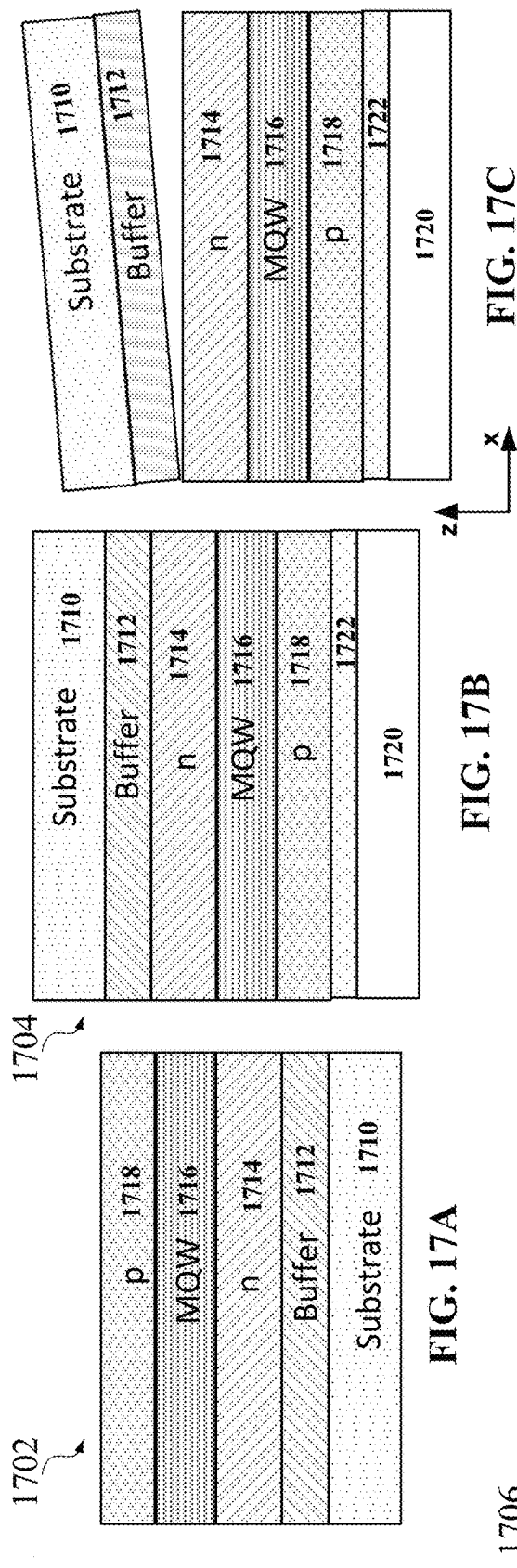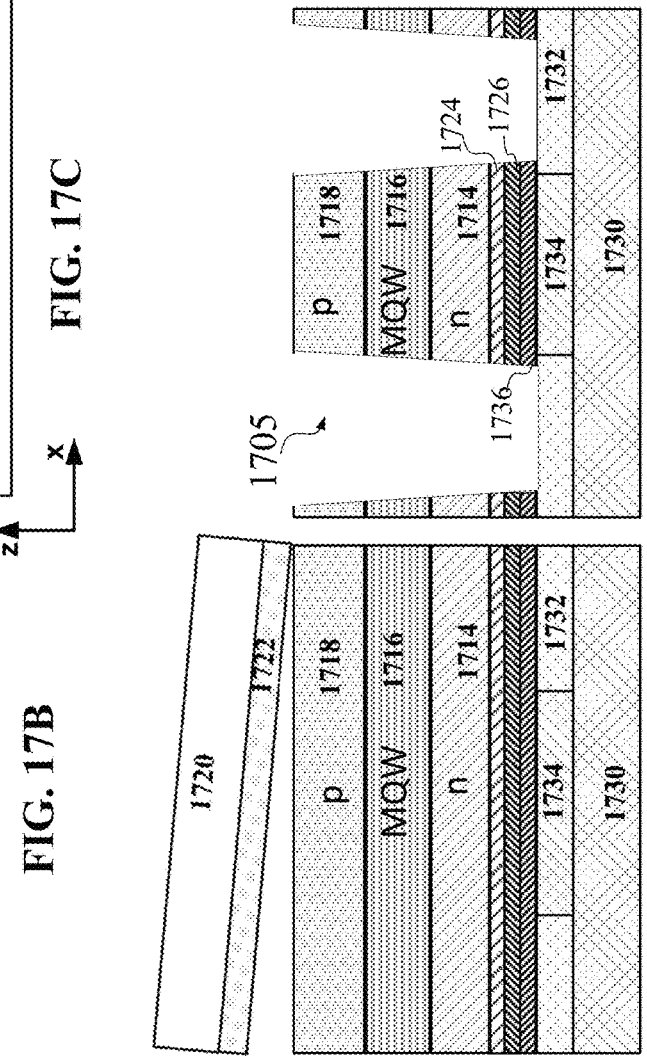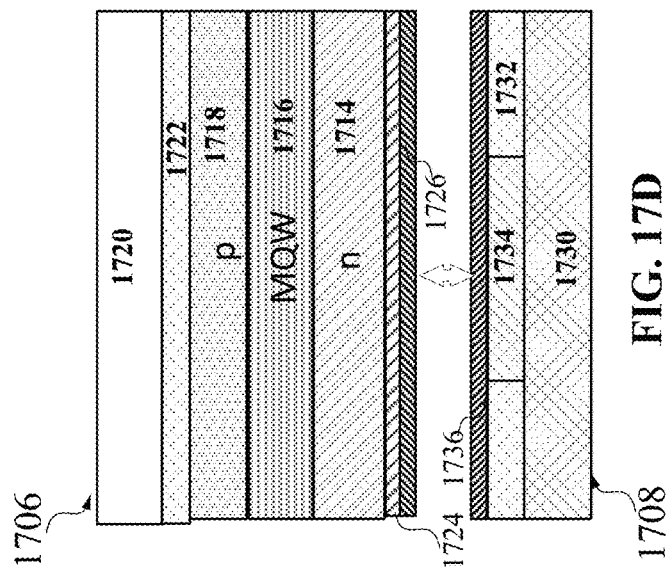

MICRODISPLAY ARCHITECTURE WITH LIGHT EXTRACTION EFFICIENCY ENHANCEMENT

BACKGROUND

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. Micro-LEDs ("μLEDs") based on III-V semiconductors, such as alloys of AlN, GaN, InN, AlGaInP, other ternary and quaternary nitride, phosphide, and arsenide compositions, have begun to be developed for various display applications due to their small size (e.g., with a linear dimension less than 100 μm, less than 50 μm, less than 10 μm, or less than 5 μm), high packing density (and hence higher resolution), and high brightness. For example, micro-LEDs that emit light of different colors (e.g., red, green, and blue) can be used to form the sub-pixels of a display system, such as a television or a near-eye display system.

SUMMARY

This disclosure relates generally to micro-light emitting diodes (micro-LEDs). More specifically, this disclosure relates to micro-LED devices fabricated by alignment-free bonding and post-bonding mesa etching and modification to improve the beam profiles and light extraction efficiencies of micro-LEDs in the micro-LED devices. Various inventive embodiments are described herein, including devices, systems, methods, processes, materials, and the like.

According to certain embodiments, a light source may include a backplane wafer including electrical circuits fabricated thereon, and an array of LEDs coupled to the backplane wafer. Each LED of the array of LEDs may include a mesa structure including semiconductor epitaxial layers and characterized by inwardly tilted mesa sidewalls, a high-refractive index material region (e.g., with a refractive index greater than about 1.75 for visible light) surrounding the semiconductor epitaxial layers of the mesa structure and including outwardly tilted sidewalls, and a reflective layer on the outwardly tilted sidewalls of the high-refractive index material region. In some embodiments, the refractive index of the high-refractive index material region may be equal to or greater than a refractive index of the semiconductor epitaxial layers. The high-refractive index material region may include, for example, $TiO_2$, SiN, or an undoped semiconductor material (e.g., undoped GaN or SiC).

In some embodiments of the light source, the semiconductor epitaxial layers may include an n-type semiconductor layer, an active layer configured to emit visible light, and a p-type semiconductor layer. Each LED of the array of LEDs may include a passivation layer on the inwardly tilted mesa sidewalls of the mesa structure. The mesa structure may also include a back reflector layer coupled to the semiconductor epitaxial layers, and a bonding layer electrically connected to the back reflector layer and bonded to the backplane wafer. In some embodiments, the back reflector layer may be coupled to the p-type semiconductor layer, and the array of LEDs may include a transparent conductive layer electrically coupled to the n-type semiconductor layer of the mesa structure of each LED of the array of LEDs. In some embodiments, the back reflector layer may be coupled to the n-type semiconductor layer, and the array of LEDs may include a transparent conductive layer electrically coupled to the p-type semiconductor layer of the mesa structure of each LED of the array of LEDs.

In some embodiments, the reflective layer on the outwardly tilted sidewalls of the high-refractive index material region may form a compound parabolic concentrator. In some embodiments, the high-refractive index material region may be asymmetrical with respect to a center of the mesa structure. In some embodiments, the light source may include an array of micro-lenses on the array of LEDs, wherein a width of each micro-lens of the array of micro-lenses may be greater than a width of each LED of the array of LEDs. In some embodiments, the light source may include dielectric material regions surrounding each LED of the array of LEDs, where the reflective layer may be formed on surfaces of the dielectric material regions. In some embodiments, at least a region of the dielectric material regions surrounding an LED of the array of LEDs may be higher than the mesa structure of the LED. In some embodiments, a portion of the reflective layer of an LED of the array of LEDs may be higher than the mesa structure of the LED.

According to some embodiments, a light source may include a backplane wafer including electrical circuits fabricated thereon, and an array of LEDs coupled to the backplane wafer. Each LED of the array of LEDs may include a mesa structure including semiconductor epitaxial layers and characterized by inwardly tilted mesa sidewalls, a passivation layer on the inwardly tilted mesa sidewalls, and a reflective layer surrounding the semiconductor epitaxial layers of the mesa structure and including outwardly tilted inner sidewalls. In some embodiments, the reflective layer may form a compound parabolic concentrator that is configured to collimate light emitted from the mesa structure. In some embodiments, the light source may include a high-refractive index material between the passivation layer and the reflective layer, the high-refractive index material characterized by a refractive index equal to or greater than a refractive index of the semiconductor epitaxial layers. In some embodiments, the reflective layer surrounding the semiconductor epitaxial layers of the mesa structure may be asymmetrical with respect to a center of the mesa structure. In some embodiments, a portion of the reflective layer is higher than the mesa structure and the passivation layer. In some embodiments, the light source may include dielectric material regions surrounding each LED of the array of LEDs, where the reflective layer may be on surfaces of the dielectric material regions.

According to some embodiments, a method may include obtaining a wafer stack that includes a backplane wafer, and semiconductor epitaxial layers, a back reflector layer, and a metal bonding layer on the backplane wafer; etching through the semiconductor epitaxial layers, the back reflector layer, and the metal bonding layer to form mesa structures that have inwardly tilted sidewalls; depositing a dielectric layer in regions between the mesa structures; etching the dielectric layer to form cavities surrounding the semiconductor epitaxial layers of the mesa structures and having outwardly tilted sidewalls; depositing a reflective layer on surfaces of the dielectric layer; and forming a transparent electrode layer on the semiconductor epitaxial layers.

In some embodiments, the method may also include, before depositing the dielectric layer, forming a passivation layer on the inwardly tilted sidewalls of the mesa structures. In some embodiments, the method may also include depositing a high-refractive index material in the cavities, where the high-refractive index material may be characterized by a refractive index greater than about 1.75 for visible light. In some embodiments, obtaining the wafer stack may include obtaining a first wafer that includes a first substrate and the semiconductor epitaxial layers grown on the first substrate; bonding a second substrate to the semiconductor epitaxial layers of the first wafer; removing the first substrate of the first wafer; depositing the back reflector layer on the semiconductor epitaxial layers; forming a first metal layer on the back reflector layer; bonding a second metal layer on the backplane wafer to the first metal layer, the metal bonding layer including the first metal layer and the second metal layer; and removing the second substrate.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIGS. 11A-11F illustrate an example of a method of fabricating a micro-LED device using alignment-free metal-to-metal bonding and post-bonding mesa formation.

FIG. 12A illustrates an example of a micro-LED device fabricated using the method described with respect to FIGS. 11A-11F.

FIG. 12B illustrates an example of a micro-LED device fabricated using the method described with respect to FIGS. 8A-8D.

FIGS. 13A-13M illustrate an example of a method of fabricating a micro-LED device according to certain embodiments.

FIG. 14A illustrates an example of a simulation model for a micro-LED device fabricated using the method described with respect to FIGS. 11A-11F.

FIG. 14B illustrates simulation results using the example of the simulation model of FIG. 14A.

FIG. 14C illustrates an example of a simulation model for a micro-LED device fabricated using the method described with respect to FIGS. 13A-13M according to certain embodiments.

FIG. 14D illustrates simulation results using the example of the simulation model of FIG. 14C.

FIG. 15A illustrates an example of a common-cathode GaN-based micro-LED device according to certain embodiments.

FIG. 15B illustrates another example of a common-cathode GaN-based micro-LED device according to certain embodiments.

FIGS. 16A-16E illustrate examples of micro-LED devices according to certain embodiments.

FIGS. 17A-17G illustrate an example of a process for fabricating a common-anode GaN-based micro-LED device according to certain embodiments.

Figure 1:
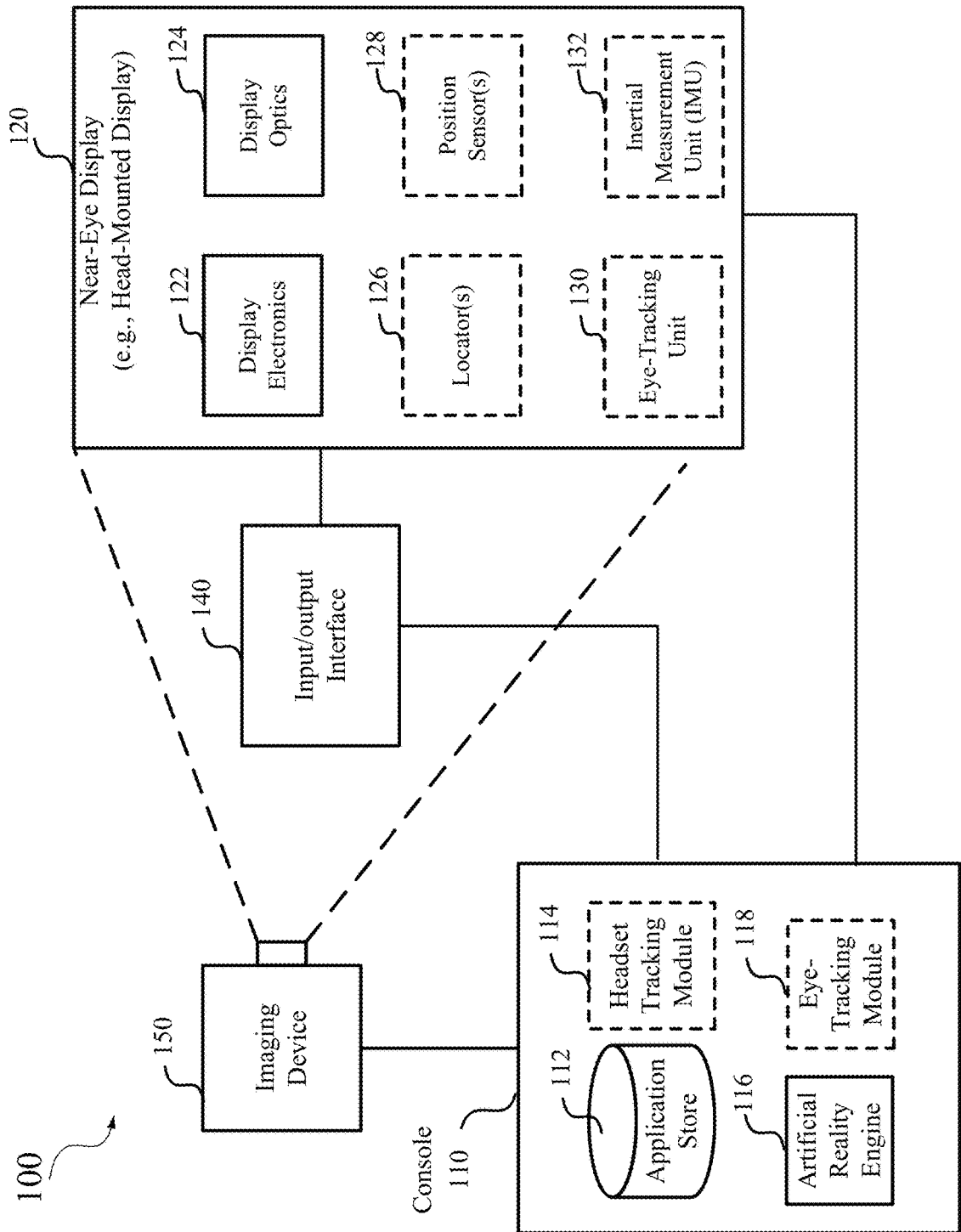
FIG. 1 is a simplified block diagram of an example of an artificial reality system environment including a near-eye display according to certain embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to micro-light emitting diodes (micro-LEDs). More specifically, this disclosure relates to micro-LED devices fabricated by alignment-free bonding and post-bonding mesa etching and modification to improve the beam profiles and light extraction efficiencies of micro-LEDs in the micro-LED devices. Various inventive embodiments are described herein, including devices, systems, methods, processes, materials, and the like.

LEDs with small pitches (e.g., less than about 10 μm, less than about 5 μm, less than about 3 μm, or less than about 2 μm) may be used in high-resolution display systems. For example, augmented reality (AR) and virtual reality (VR) applications may use near-eye displays that include tiny light emitters such as micro-LEDs. Micro-LEDs in high-resolution display systems may be controlled by drive circuits that provide drive currents (and thus injected carriers) to the micro-LEDs based on pixel data of the display images, such that the micro-LEDs may emit light with appropriate intensities to form the display images. Micro-LEDs may be fabricated by epitaxially growing III-V semiconductor material layers on a growth substrate, whereas the drive circuits are generally fabricated on silicon wafers using processing technology developed for fabricating complementary metal-oxide-semiconductor (CMOS) integrated circuits. The wafer that includes CMOS drive circuits fabricated thereon is referred to herein as a backplane wafer or a CMOS backplane. A Micro-LED array on a die or a wafer may be bonded to a CMOS backplane, such that the individual micro-LEDs in the micro-LED array may be electrically connected to the corresponding pixel drive circuits on the CMOS backplane and thus may become individually addressable to receive drive signals for driving respective micro-LEDs.

Due to the small pitches of the micro-LED arrays and the small dimensions of individual micro-LEDs, it can be difficult to electrically connect the drive circuits to the electrodes of individual micro-LEDs. In some implementations, the micro-LED arrays may be bonded face-to-face with the drive circuits using bonding pads or bumps on surfaces of the micro-LED arrays and bonding pads or bumps on the drive circuits, such that no routing wires may be needed and the interconnects between the micro-LEDs and the drive circuits can be short, which may enable high-density and high-performance interconnects. However, it is challenging to precisely align the bonding pads on the micro-LED arrays with the bonding pads on the drive circuits and form reliable bonding at the bonding interfaces that may include both dielectric materials (e.g., $SiO_2$, SiN, or SiCN) and metal (e.g., Cu, Au, Ti, or Al) bonding pads. For example, when the pitch of the micro-LED device is about 2 to 4 microns or lower, the bonding pads may have a linear dimension less than about 1 μm in order to avoid shorting to adjacent micro-LEDs and to achieve sufficiently high bonding strength through the dielectric bonding. Small bonding pads may be less tolerant to misalignments between the bonding pads, which may reduce the metal bonding area, increase the contact resistance (or may even be an open circuit), and/or cause diffusion of metal atoms into the semiconductor materials and the dielectric materials. Thus, precise alignment of the bonding pads at the bonding surface of a micro-LED array and the bonding pads at the bonding surface of a backplane wafer may be needed. However, the accuracy of die-to-wafer or wafer-to-wafer bonding alignment using state-of-art equipment may be on the order of about 0.5 μm or about 1 μm, which may not be adequate for bonding small-pitch micro-LED arrays (e.g., with a pitch-≤about 2 μm and a linear dimension of the bonding pads on the order of 1 μm or shorter) to CMOS drive circuits.

In some implementations, to avoid precise alignment for the bonding, a micro-LED wafer may be bonded to a backplane wafer after the growth of the epitaxial layers but before the formation of individual micro-LEDs on the micro-LED wafer, where the micro-LED wafer and the backplane wafer may be bonded together through alignment-free metal-to-metal bonding of two solid metal bonding layers on the two wafers. After the bonding, the substrate of the micro-LED wafer may be removed, and the epitaxial layers and the metal bonding layers in the bonded wafer stack may be etched to form mesa structures for individual micro-LEDs. The etching process can have much higher alignment accuracy than the bonding process and thus may form individual micro-LEDs that align with the underlying pixel drive circuits.

In this process, the mesa structures formed by etching after the wafer bonding and the removal of the substrate of the micro-LED wafer may have inwardly tilted sidewalls. In addition, the epitaxial layers (e.g., GaN-based epitaxial layers) of the micro-LED wafer are generally grown by growing a thicker n-type semiconductor layer first, followed by an active region (including light-emitting quantum well layers) and a thinner p-type semiconductor layer. Therefore, the micro-LED wafer may often be bonded to the backplane wafer with the p-type semiconductor layer closer to the backplane wafer, and thus the active region may be close to the bottom of the mesa structure of each micro-LED. Therefore, the efficiency of extracting light emitted in the action region out of the micro-LED (referred to as the light extraction efficiency (LEE)) may be low. As a result, the external quantum efficiency (EQE) of the micro-LED, which may be a product of the internal quantum efficiency and the light extraction efficiency of the micro-LED, may be low.

According to certain embodiments, after etching the epitaxial layers to form individual mesa structures for an array of micro-LEDs, the mesa structures with inwardly tilted mesa sidewalls may be modified to have outwardly tilted sidewalls and a reflective layer on the outwardly tilted sidewalls. For example, a passivation layer may be formed on the inwardly tilted mesa sidewalls, a dielectric material may be deposited on the passivation layer and in regions between the mesa structures, the dielectric material surrounding each mesa structure may be etched to form a cavity that surrounds the mesa structure and has outwardly tilted sidewalls, the reflective layer may be formed on the outwardly tilted sidewalls of the cavity, and, in some embodiments, a high-refractive index material (e.g., with a refractive index matching or greater than a refractive index of the epitaxial layers) may be deposited into the cavity and on the reflective layer to surround the mesa structure. Therefore, the etched mesa structure may be modified to include the initially etched mesa structure, the passivation layer, the high-refractive index material surrounding the initially etched mesa structure, and the reflective layer surrounding the high-refractive index material. Thus, the modified mesa structure of a micro-LED may have outwardly tilted sidewalls with the reflective layer formed thereon, and may have a larger aperture at the light emitting side of the micro-LED. As such, the light extraction efficiency of the micro-LED may be improved. In some embodiments, the dielectric material may be etched to form a cavity with a certain shape such that the reflective layer formed on the sidewalls of the cavity (e.g., surfaces of the dielectric material after the etching) may form various optical devices for beam shaping and/or deflecting, such as a compound parabolic concentrator (CPC) for beam collimation or a beam deflector for beam deflecting.

Techniques disclosed herein may be used to modify the shapes of the mesa structures and/or form beam shaping and/or deflecting devices in, for example, a common-cathode micro-LED device, a common-cathode micro-LED device, a micro-LED device formed by singulation after bonding, a micro-LED device formed by singulation before bonding, and the like. Therefore, techniques disclosed herein may improve the light extraction efficiencies and the emitted beam profiles of the micro-LEDs in any of these micro-LED devices.

The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (μLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices).

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120.

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. Artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to determine the eye's orientation more accurately.

Figure 2:
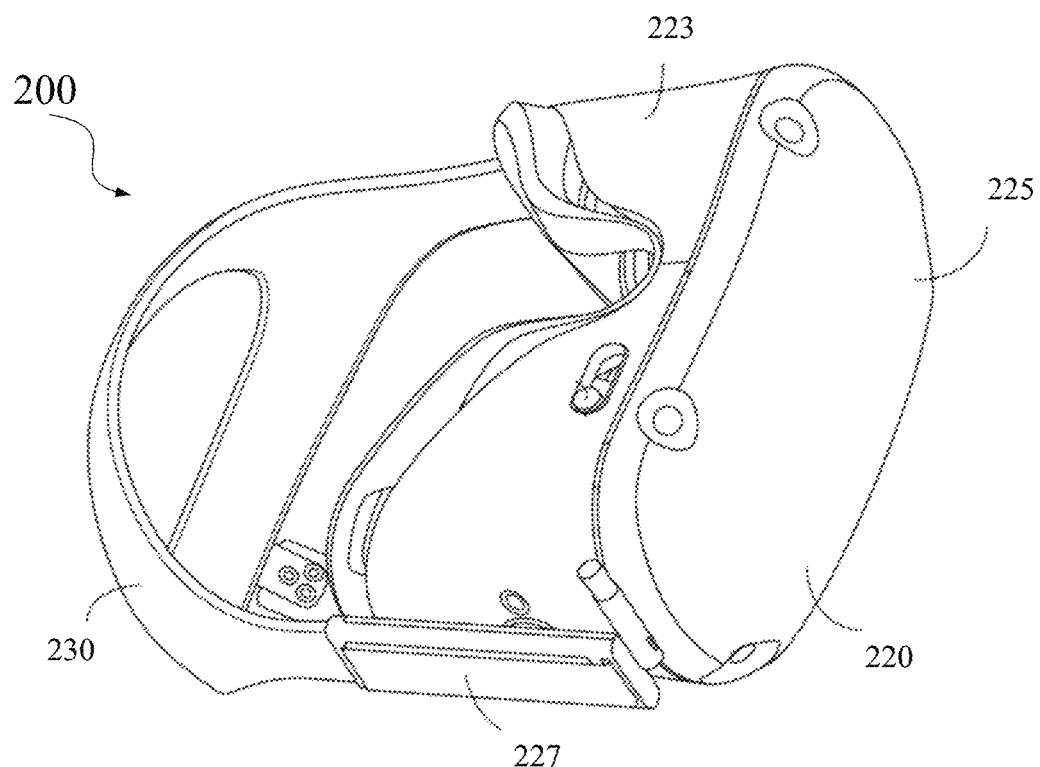
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a µLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
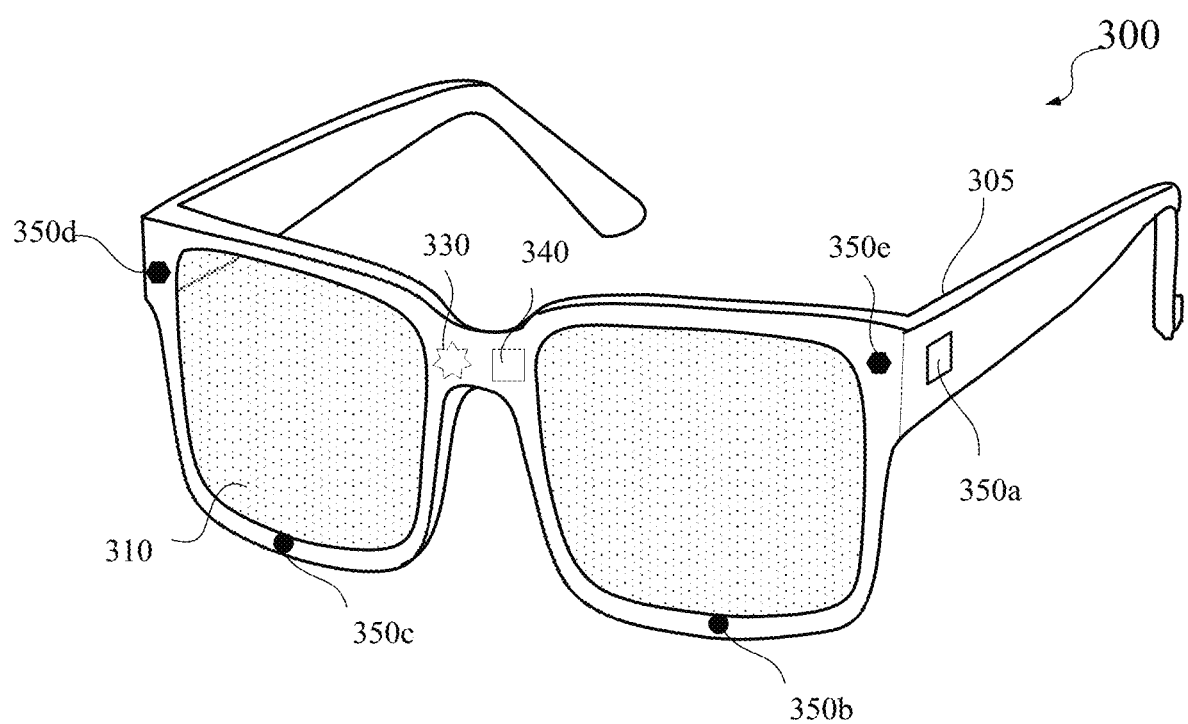
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
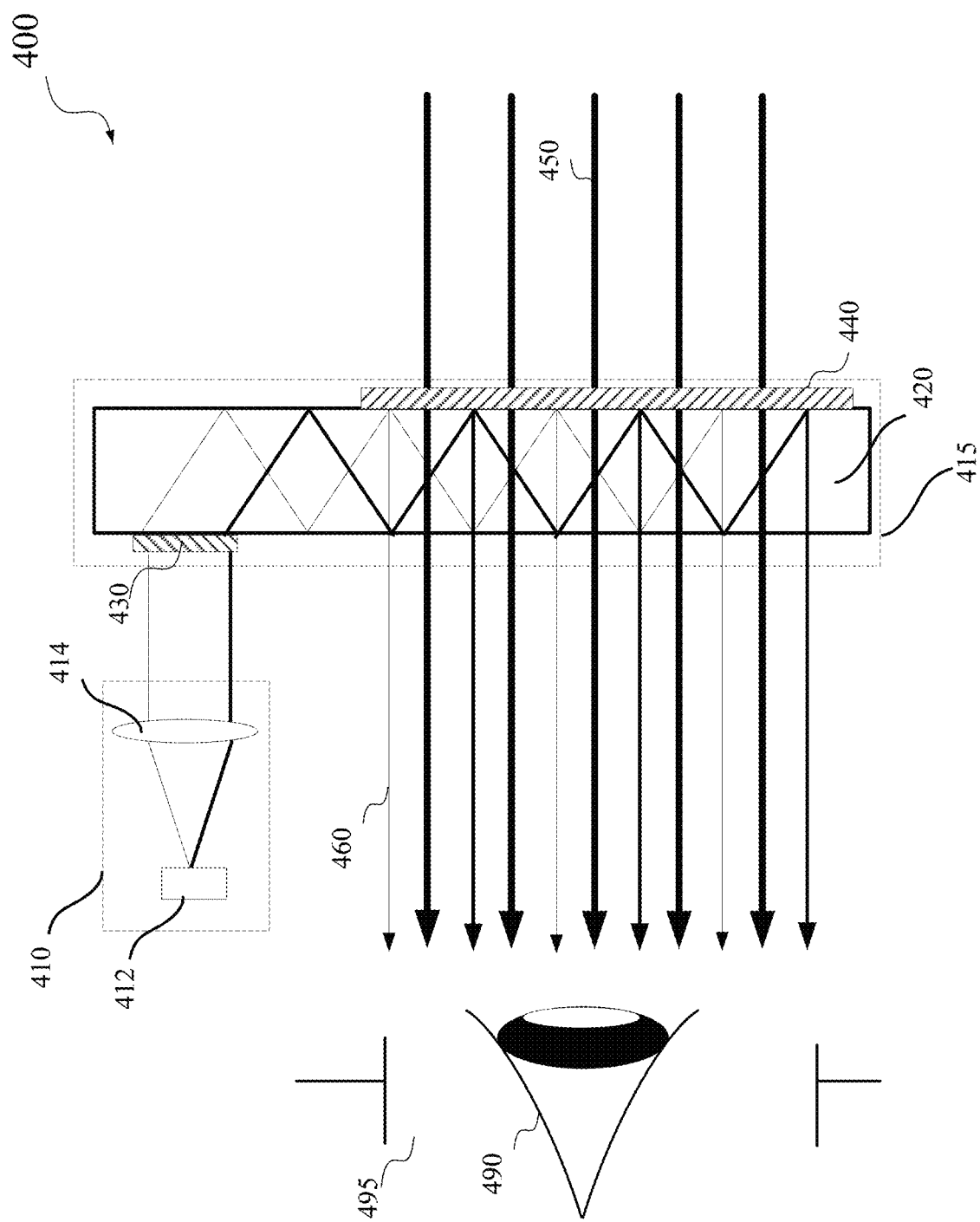
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

Figure 5B:
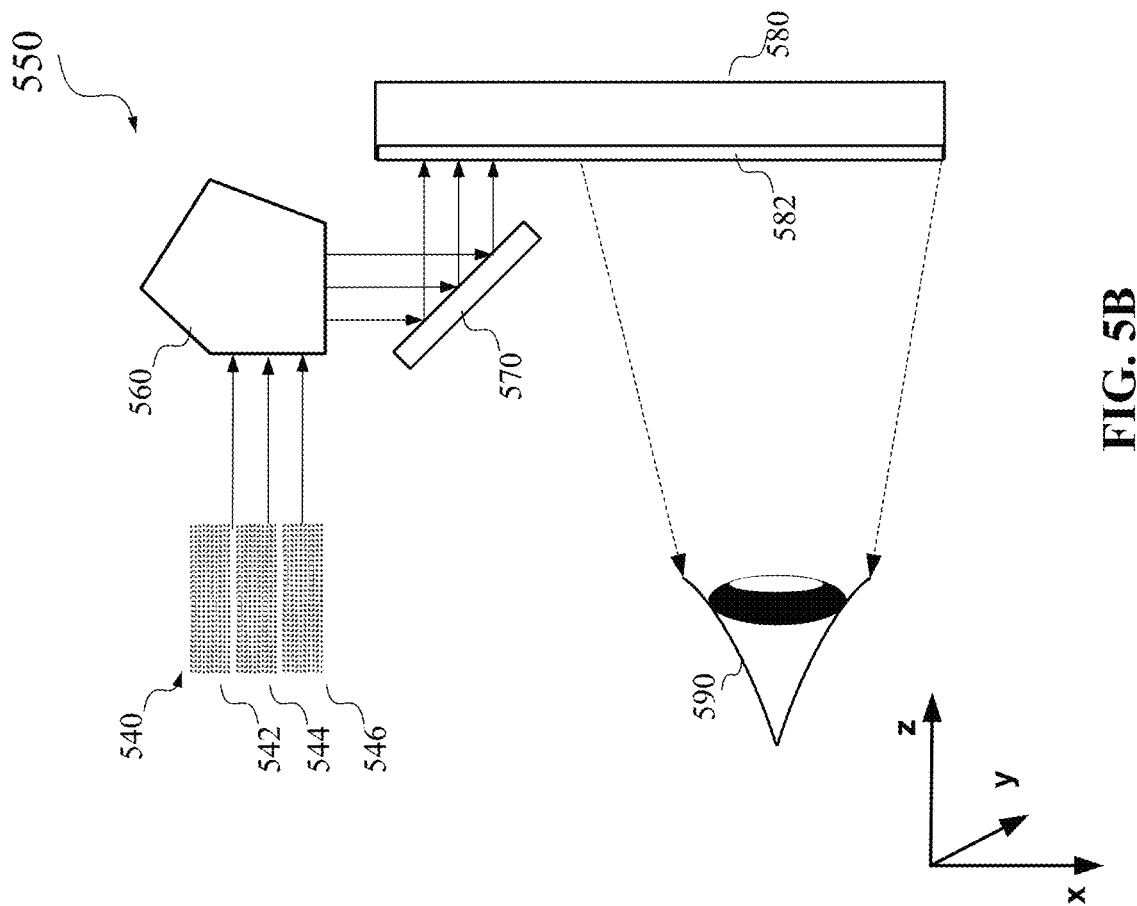
FIG. 5B illustrates an example of a near-eye display device including a waveguide display according to certain embodiments.
Figure 5A:
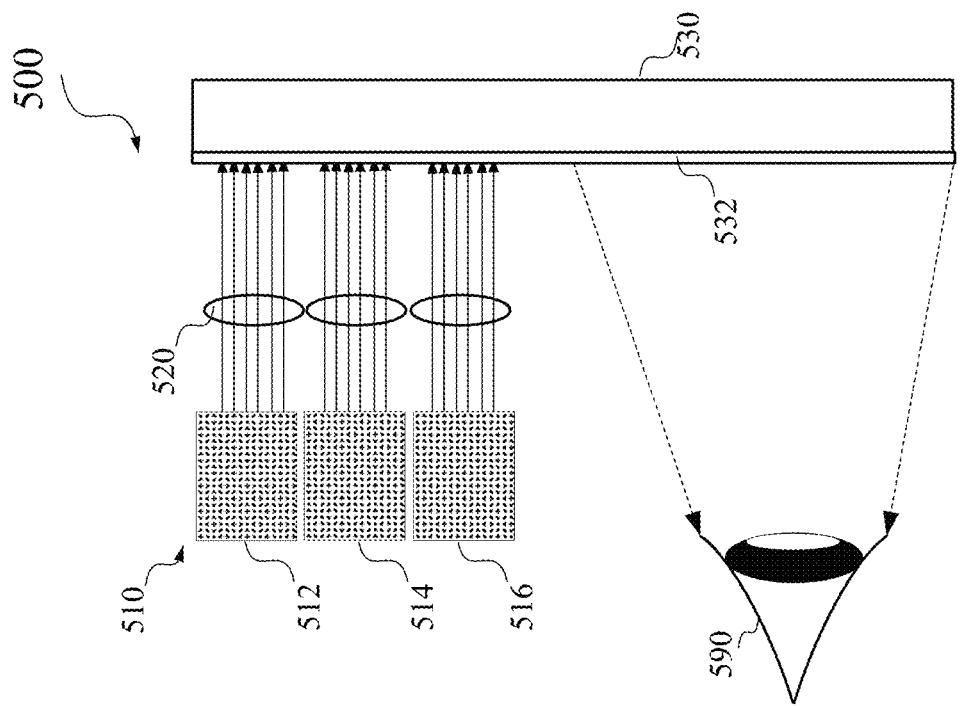
FIG. 5A illustrates an example of a near-eye display device including a waveguide display according to certain embodiments.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 μm (e.g., about 1.2 μm) and the pitch may be less than 2 μm (e.g., about 1.5 μm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 µm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
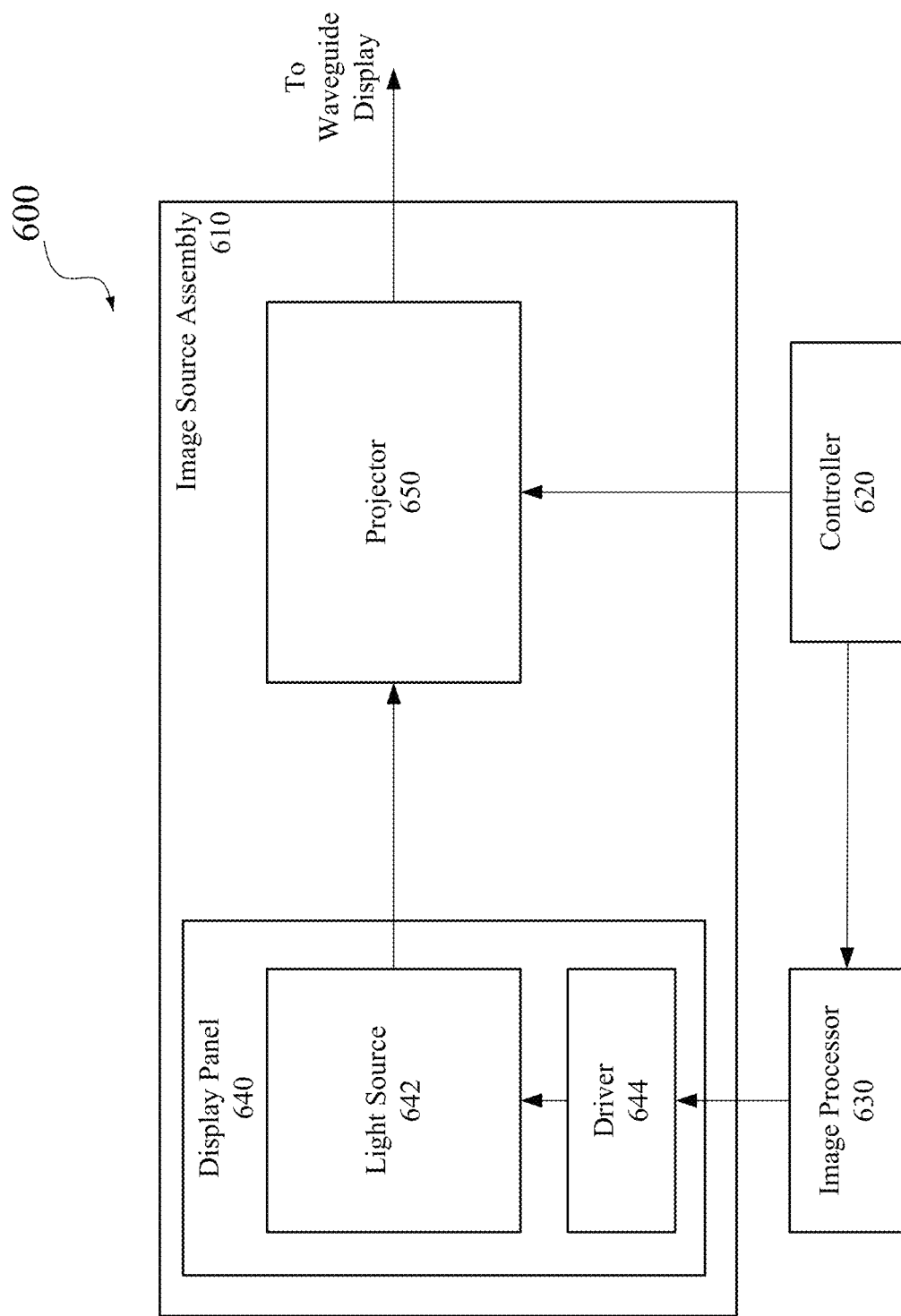
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a drive circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and drive circuit 644, image processor 630 may be a sub-unit of controller 620 or drive circuit 644 in other embodiments. In other words, in those embodiments, controller 620 or drive circuit 644 may perform various image processing functions of image processor 630. Image processor 630 may also be referred to as an image processing circuit.

In the example shown in FIG. 6, light source 642 may be driven by drive circuit 644, based on data or instructions (e.g., display and scanning instructions) sent from controller 620 or image processor 630. In one embodiment, drive circuit 644 may include a circuit panel that connects to and mechanically holds various light emitters of light source 642. Light source 642 may emit light in accordance with one or more illumination parameters that are set by the controller 620 and potentially adjusted by image processor 630 and drive circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

In semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device.

The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. For LEDs, and in particular, micro-LEDs with reduced physical dimensions, improving the internal and external quantum efficiency and/or controlling the emission spectrum may be challenging. In some embodiments, to increase the light extraction efficiency, a mesa that includes at least some of the layers of semiconductor materials may be formed.

Figure 7A:
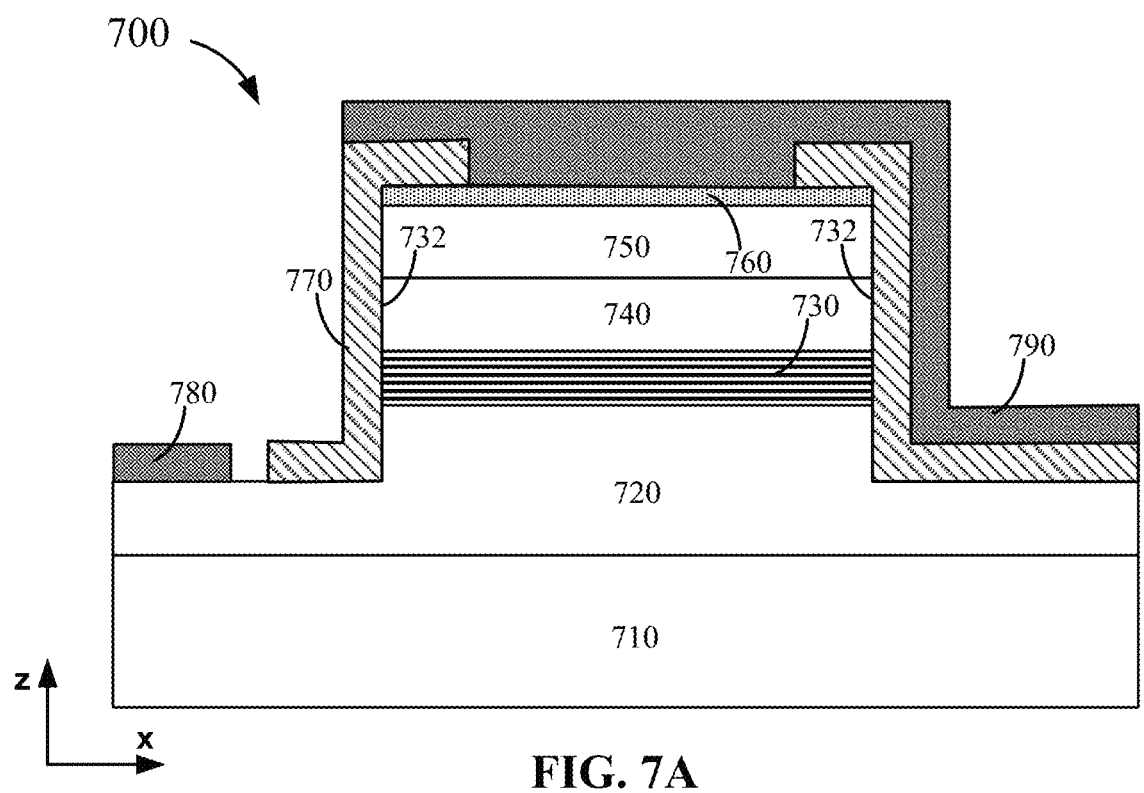
FIG. 7A illustrates an example of a light emitting diode (LED) having a vertical mesa structure according to certain embodiments.

FIG. 7A illustrates an example of an LED 700 having a vertical mesa structure. LED 700 may be a light emitter in light source 510, 540, or 642. LED 700 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-$LiAlO_2$ structure, where the substrate may be cut in a specific direction to expose a specific plane as the growth surface.

In the example shown in FIG. 7A, LED 700 may include a substrate 710, which may include, for example, a sapphire substrate or a GaN substrate. A semiconductor layer 720 may be grown on substrate 710. Semiconductor layer 720 may include a III-V material, such as GaN, and may be p-doped (e.g., with Mg, Ca, Zn, or Be) or n-doped (e.g., with Si or Ge). One or more active layers 730 may be grown on semiconductor layer 720 to form an active region. Active layer 730 may include III-V materials, such as one or more InGaN layers, one or more AlInGaP layers, and/or one or more GaN layers, which may form one or more heterostructures, such as one or more quantum wells or MQWs. A semiconductor layer 740 may be grown on active layer 730. Semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. Semiconductor layer 720 and semiconductor layer 740 sandwich active layer 730 to form the light emitting region. For example, LED 700 may include a layer of InGaN situated between a layer of p-type GaN doped with magnesium and a layer of n-type GaN doped with silicon or oxygen. In some embodiments, LED 700 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 7A) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 750, such as a $P^+$ or $P^{++}$ semiconductor layer, may be formed on semiconductor layer 740 and act as a contact layer for forming an ohmic contact and reducing the contact impedance of the device. In some embodiments, a conductive layer 760 may be formed on heavily-doped semiconductor layer 750. Conductive layer 760 may include, for example, an indium tin oxide (ITO) or Al/Ni/Au film. In one example, conductive layer 760 may include a transparent ITO layer.

To make contact with semiconductor layer 720 (e.g., an n-GaN layer) and to more efficiently extract light emitted by active layer 730 from LED 700, the semiconductor material layers (including heavily-doped semiconductor layer 750, semiconductor layer 740, active layer 730, and semiconductor layer 720) may be etched to expose semiconductor layer 720 and to form a mesa structure that includes layers 720-760. The mesa structure may confine the carriers within the device. Etching the mesa structure may lead to the formation of mesa sidewalls 732 that may be orthogonal to the growth planes. A passivation layer 770 may be formed on mesa sidewalls 732 of the mesa structure. Passivation layer 770 may include an oxide layer, such as a $SiO_2$ layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 790, such as an Al/Ni/Au metal layer, may be formed on conductive layer 760 and may act as another electrode of LED 700.

When a voltage signal is applied to contact layers 780 and 790, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlInGaP active layers may emit red, orange, yellow, or green light. The emitted photons may be reflected by passivation layer 770 and may exit LED 700 from the top (e.g., conductive layer 760 and contact layer 790) or bottom (e.g., substrate 710).

In some embodiments, LED 700 may include one or more other components, such as a lens, on the light emission surface, such as substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 7B:
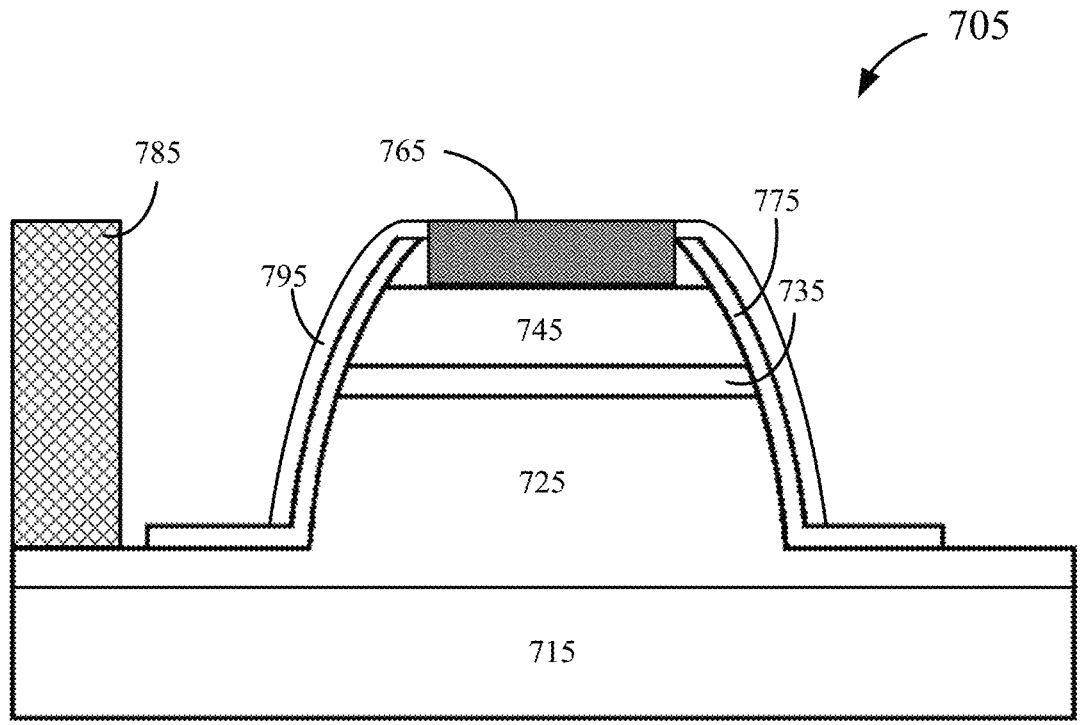
FIG. 7B is a cross-sectional view of an example of an LED having a parabolic mesa structure according to certain embodiments.

FIG. 7B is a cross-sectional view of an example of an LED 705 having a parabolic mesa structure. Similar to LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on substrate 715. Semiconductor layer 725 may include a III-V material, such as GaN, and may be p-doped (e.g., with Mg, Ca, Zn, or Be) or n-doped (e.g., with Si or Ge). One or more active layer 735 may be grown on semiconductor layer 725. Active layer 735 may include III-V materials, such as one or more InGaN layers, one or more AlInGaP layers, and/or one or more GaN layers, which may form one or more heterostructures, such as one or more quantum wells. A semiconductor layer 745 may be grown on active layer 735. Semiconductor layer 745 may include a III-V material, such as GaN, and may be p-doped (e.g., with Mg, Ca, Zn, or Be) or n-doped (e.g., with Si or Ge). One of semiconductor layer 725 and semiconductor layer 745 may be a p-type layer and the other one may be an n-type layer.

To make contact with semiconductor layer 725 (e.g., an n-type GaN layer) and to more efficiently extract light emitted by active layer 735 from LED 705, the semiconductor layers may be etched to expose semiconductor layer 725 and to form a mesa structure that includes layers 725-745. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of layers 725-745.

As shown in FIG. 7B, LED 705 may have a mesa structure that includes a flat top. A dielectric layer 775 (e.g., SiO$_2$ or SiN) may be formed on the facets of the mesa structure. In some embodiments, dielectric layer 775 may include multiple layers of dielectric materials. In some embodiments, a metal layer 795 may be formed on dielectric layer 775. Metal layer 795 may include one or more metal or metal alloy materials, such as aluminum (Al), silver (Ag), gold (Au), platinum (Pt), titanium (Ti), copper (Cu), or any combination thereof. Dielectric layer 775 and metal layer 795 may form a mesa reflector that can reflect light emitted by active layer 735 toward substrate 715. In some embodiments, the mesa reflector may be parabolic-shaped to act as a parabolic reflector that may at least partially collimate the emitted light.

Electrical contact 765 and electrical contact 785 may be formed on semiconductor layer 745 and semiconductor layer 725, respectively, to act as electrodes. Electrical contact 765 and electrical contact 785 may each include a conductive material, such as Al, Au, Pt, Ag, Ni, Ti, Cu, or any combination thereof (e.g., Ag/Pt/Au or Al/Ni/Au), and may act as the electrodes of LED 705. In the example shown in FIG. 7B, electrical contact 785 may be an n-contact, and electrical contact 765 may be a p-contact. Electrical contact 765 and semiconductor layer 745 (e.g., a p-type semiconductor layer) may form a back reflector for reflecting light emitted by active layer 735 back toward substrate 715. In some embodiments, electrical contact 765 and metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across electrical contacts 765 and 785, electrons and holes may recombine in active layer 735. The recombination of electrons and holes may cause photon emission, thus producing light. The wavelength and energy of the emitted photons may depend on the energy bandgap between the valence band and the conduction band in active layer 735. For example, InGaN active layers may emit green or blue light, while AlInGaP active layers may emit red, orange, yellow, or green light. The emitted photons may propagate in many different directions, and may be reflected by the mesa reflector and/or the back reflector and may exit LED 705, for example, from the bottom side (e.g., substrate 715) shown in FIG. 7B. One or more other secondary optical components, such as a lens or a grating, may be formed on the light emission surface, such as substrate 715, to focus or collimate the emitted light and/or couple the emitted light into a waveguide.

One or two-dimensional arrays of the LEDs described above may be manufactured on a wafer to form light sources (e.g., light source 642). Drive circuits (e.g., drive circuit 644) may be fabricated, for example, on a silicon wafer using CMOS processes. The LEDs and the drive circuits on wafers may be diced and then bonded together, or may be bonded on the wafer level and then diced. Various bonding techniques can be used for bonding the LEDs and the drive circuits, such as adhesive bonding, metal-to-metal bonding, metal oxide bonding, wafer-to-wafer bonding, die-to-wafer bonding, hybrid bonding, and the like.

Figure 8A:
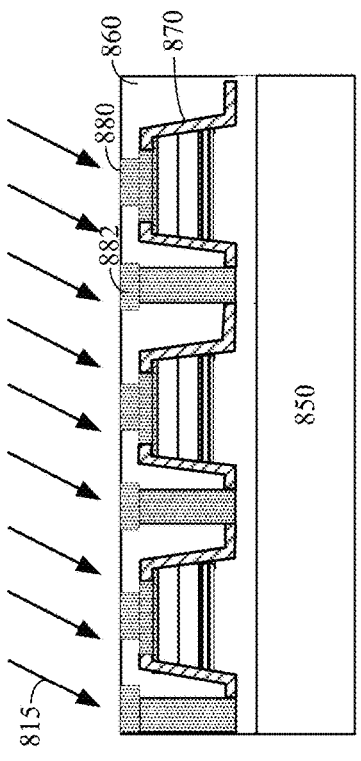
FIGS. 8A-8D illustrate an example of a method of hybrid bonding for arrays of LEDs according to certain embodiments.
Figure 8B:
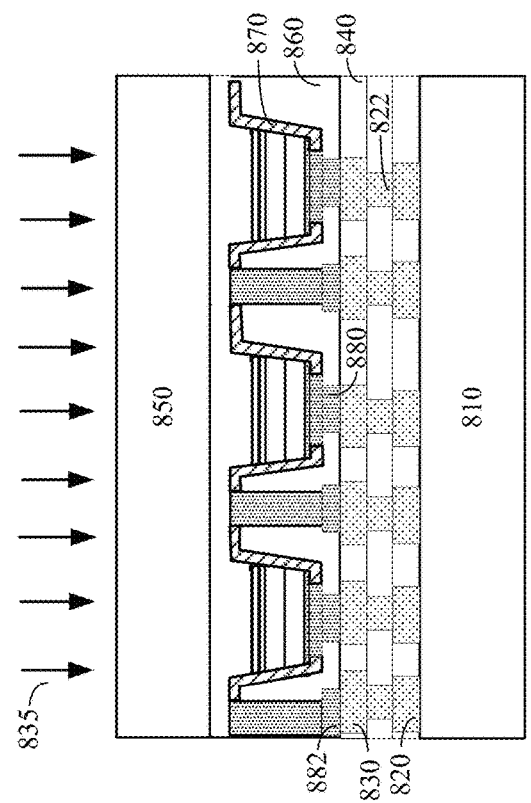

FIGS. 8A-8D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 8A shows a substrate 810 with passive or active circuits 820 manufactured thereon. As described above with respect to FIGS. 8A-8B, substrate 810 may include, for example, a silicon wafer. Circuits 820 may include drive circuits for the arrays of LEDs. A bonding layer may include dielectric regions 840 and contact pads 830 connected to circuits 820 through electrical interconnects 822. Contact pads 830 may include, for example, Cu, Ag, Au, Al, W, Mo, Ni, Ti, Pt, Pd, or the like. Dielectric materials in dielectric regions 840 may include SiCN, $SiO_2$, SiN, $Al_2O_3$, $HfO_2$, $ZrO_2$, $Ta_2O_5$, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 805. The activated surface may be atomically clean and may be reactive for formation of direct bonds between wafers when they are brought into contact, for example, at room temperature.

FIG. 8B illustrates a wafer 850 including an array of micro-LEDs 870 fabricated thereon as described above with respect to, for example, FIGS. 7A-8B. Wafer 850 may be a carrier wafer and may include, for example, GaAs, InP, GaN, AlN, sapphire, SiC, Si, or the like. Micro-LEDs 870 may include an n-type layer, an active region, and a p-type layer epitaxially grown on wafer 850. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 880 and n-contacts 882 may be formed in a dielectric material layer 860 deposited on the mesa structures and may make electrical contacts with the p-type layer and the n-type layers, respectively. Dielectric materials in dielectric material layer 860 may include, for example, SiCN, $SiO_2$, SiN, $Al_2O_3$, $HfO_2$, $ZrO_2$, $Ta_2O_5$, or the like. P-contacts 880 and n-contacts 882 may include, for example, Cu, Ag, Au, Al, W, Mo, Ni, Ti, Pt, Pd, or the like. The top surfaces of p-contacts 880, n-contacts 882, and dielectric material layer 860 may form a bonding layer. The bonding layer may be planarized and polished using, for example, chemical mechanical polishing, where the polishing may cause dishing in p-contacts 880 and n-contacts 882. The bonding layer may then be cleaned and activated by, for example, an ion (e.g., plasma) or fast atom (e.g., Ar) beam 815. The activated surface may be atomically clean and reactive for formation of direct bonds between wafers when they are brought into contact, for example, at room temperature.

Figure 8C:
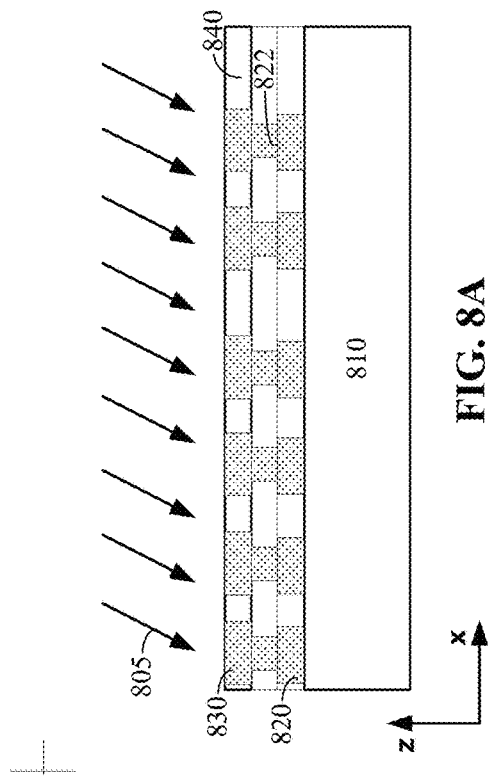

FIG. 8C illustrates a room temperature bonding process for bonding the dielectric materials in the bonding layers. For example, after the bonding layer that includes dielectric regions 840 and contact pads 830 and the bonding layer that includes p-contacts 880, n-contacts 882, and dielectric material layer 860 are surface activated, wafer 850 and micro-LEDs 870 may be turned upside down and brought into contact with substrate 810 and the circuits formed thereon. In some embodiments, compression pressure 825 may be applied to substrate 810 and wafer 850 such that the bonding layers are pressed against each other. Due to the surface activation and the dishing in the contacts, dielectric regions 840 and dielectric material layer 860 may be in direct contact because of the surface attractive force, and may react and form chemical bonds between them because the surface atoms may have dangling bonds and may be in unstable energy states after the activation. Thus, the dielectric materials in dielectric regions 840 and dielectric material layer 860 may be bonded together with or without heat treatment or pressure.

Figure 8D:
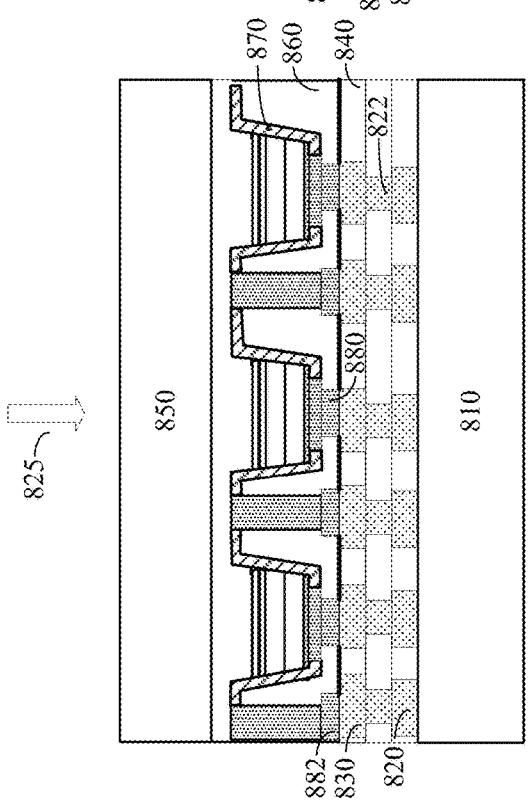

FIG. 8D illustrates an annealing process for bonding the contacts in the bonding layers after bonding the dielectric materials in the bonding layers. For example, contact pads 830 and p-contacts 880 or n-contacts 882 may be bonded together by annealing at, for example, about 200-400° C. or higher. During the annealing process, heat 835 may cause the contacts to expand more than the dielectric materials (due to different coefficients of thermal expansion), and thus may close the dishing gaps between the contacts such that contact pads 830 and p-contacts 880 or n-contacts 882 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the drive circuits, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

Figure 9:
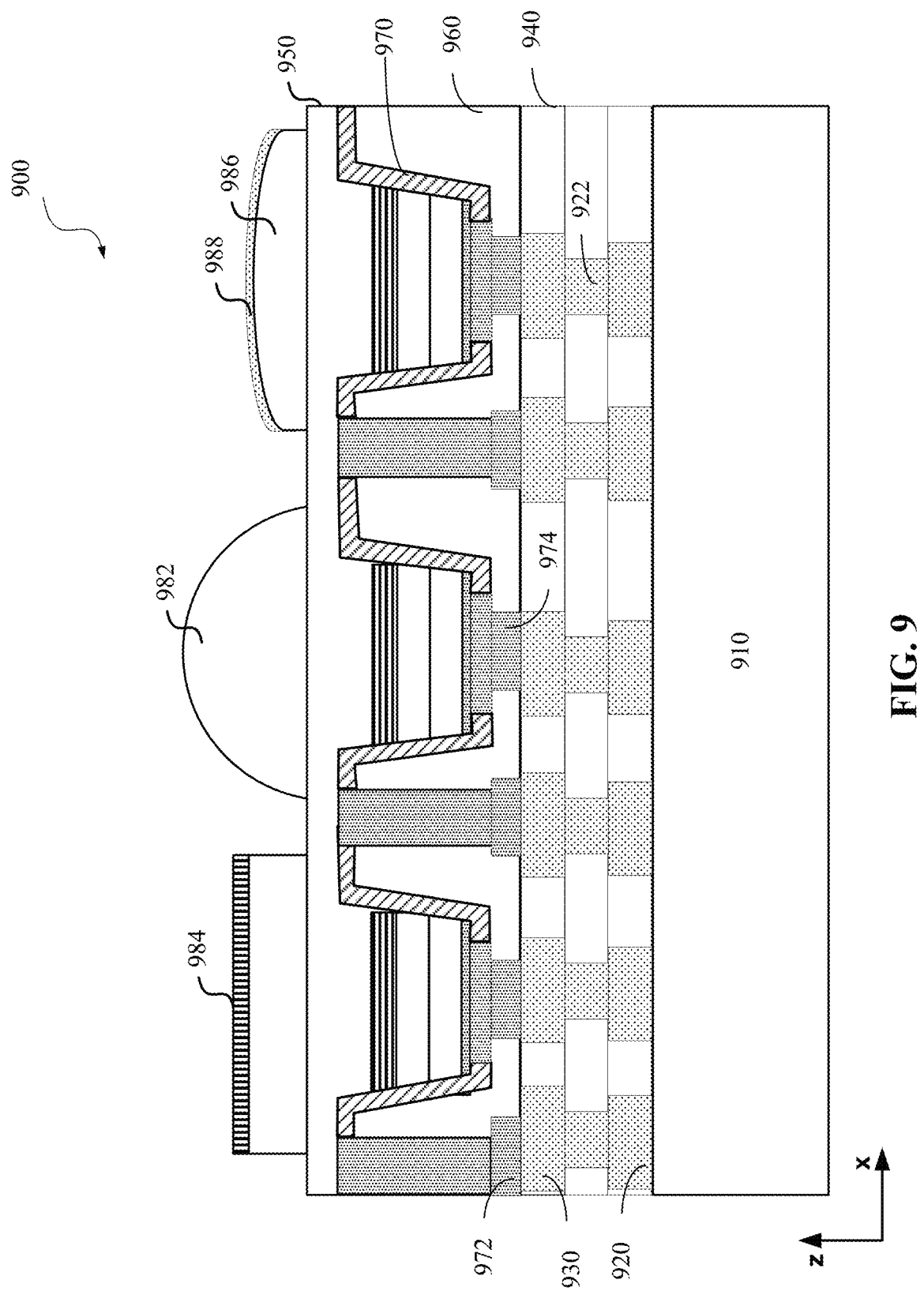
FIG. 9 illustrates an example of an LED array with secondary optical components fabricated thereon according to certain embodiments.

FIG. 9 illustrates an example of an LED array 900 with secondary optical components fabricated thereon according to certain embodiments. LED array 900 may be made by bonding an LED chip or wafer with a silicon wafer including electrical circuits fabricated thereon, using any suitable bonding techniques described above with respect to, for example, FIGS. 8A-8D. In the example shown in FIG. 9, LED array 900 may be bonded using a wafer-to-wafer hybrid bonding technique as described above with respect to FIG. 8A-8D. LED array 900 may include a substrate 910, which may be, for example, a silicon wafer. Integrated circuits 920, such as LED drive circuits, may be fabricated on substrate 910. Integrated circuits 920 may be connected to p-contacts 974 and n-contacts 972 of micro-LEDs 970 through interconnects 922 and contact pads 930, where contact pads 930 may form metallic bonds with p-contacts 974 and n-contacts 972. Dielectric layer 940 on substrate 910 may be bonded to dielectric layer 960 through fusion bonding.

The substrate (not shown) of the LED chip or wafer may be thinned or may be removed to expose the n-type layer 950 of micro-LEDs 970. Various secondary optical components, such as a spherical micro-lens 982, a grating 984, a micro-lens 986, an antireflection layer 988, and the like, may be formed in or on top of n-type layer 950. For example, spherical micro-lens arrays may be etched in the semiconductor materials of micro-LEDs 970 using a gray-scale mask and a photoresist with a linear response to exposure light, or using an etch mask formed by thermal reflowing of a patterned photoresist layer. The secondary optical components may also be etched in a dielectric layer deposited on n-type layer 950 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, $SiO_2$, SiN, $Al_2O_3$, $HfO_2$, $ZrO_2$, $Ta_2O_5$, or the like. In some embodiments, a micro-LED 970 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 9 to show some examples of secondary optical components that can be formed on micro-LEDs 970, which does not necessary imply that different secondary optical components are used simultaneously for every LED array.

Figures 10A, 10B:
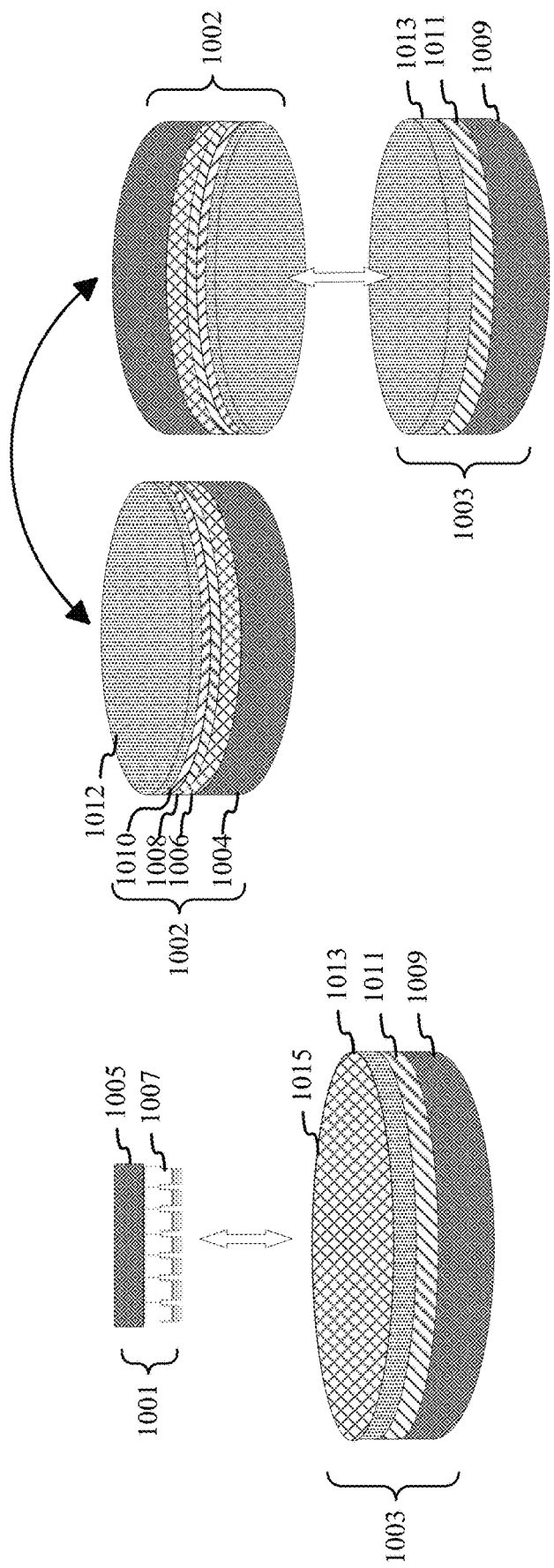
FIG. 10A illustrates an example of a method of die-to-wafer bonding for arrays of LEDs according to certain embodiments.
FIG. 10B illustrates an example of a method of wafer-to-wafer bonding for arrays of LEDs according to certain embodiments.

FIG. 10A illustrates an example of a method of die-to-wafer bonding for arrays of LEDs according to certain embodiments. In the example shown in FIG. 10A, an LED array 1001 may include a plurality of LEDs 1007 on a carrier substrate 1005. Carrier substrate 1005 may include various materials, such as GaAs, InP, GaN, AlN, sapphire, SiC, Si, or the like. LEDs 1007 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal or a metal alloy.

A wafer 1003 may include a base layer 1009 having passive or active integrated circuits (e.g., drive circuits 1011) fabricated thereon. Base layer 1009 may include, for example, a silicon wafer. Drive circuits 1011 may be used to control the operations of LEDs 1007. For example, the drive circuit for each LED 1007 may include a 2T1C pixel structure that has two transistors and one capacitor. Wafer 1003 may also include a bonding layer 1013. Bonding layer 1013 may include various materials, such as a metal, an oxide, a dielectric, CuSn, AuTi, and the like. In some embodiments, a patterned layer 1015 may be formed on a surface of bonding layer 1013, where patterned layer 1015 may include a metallic grid made of a conductive material, such as Cu, Ag, Au, Al, or the like.

LED array 1001 may be bonded to wafer 1003 via bonding layer 1013 or patterned layer 1015. For example, patterned layer 1015 may include metal pads or bumps made of various materials, such as CuSn, AuSn, or nanoporous Au, that may be used to align LEDs 1007 of LED array 1001 with corresponding drive circuits 1011 on wafer 1003. In one example, LED array 1001 may be brought toward wafer 1003 until LEDs 1007 come into contact with respective metal pads or bumps corresponding to drive circuits 1011. Some or all of LEDs 1007 may be aligned with drive circuits 1011, and may then be bonded to wafer 1003 via patterned layer 1015 by various bonding techniques, such as metal-to-metal bonding. After LEDs 1007 have been bonded to wafer 1003, carrier substrate 1005 may be removed from LEDs 1007.

For high-resolution micro-LED display panel, due to the small pitches of the micro-LED array and the small dimensions of individual micro-LEDs, it can be challenging to electrically connect the drive circuits to the electrodes of the LEDs. For example, in the face-to-face bonding techniques describe above, it is difficult to precisely align the bonding pads on the micro-LED devices with the bonding pads on the drive circuits and form reliable bonding at the interfaces that may include both dielectric materials (e.g., $SiO_2$, SiN, or SiCN) and metal (e.g., Cu, Au, or Al) bonding pads. In particular, when the pitch of the micro-LED device is about 2 or 3 microns or lower, the bonding pads may have a linear dimension less than about 1 μm in order to avoid shorting to adjacent micro-LEDs and to improve bonding strength for the dielectric bonding. However, small bonding pads may be less tolerant to misalignments between the bonding pads, which may reduce the metal bonding area, increase the contact resistance (or may even be an open circuit), and/or cause diffusion of metals to the dielectric materials and the semiconductor materials. Thus, precise alignment of the bonding pads on surfaces of the micro-LED arrays and bonding pads on surfaces of CMOS backplane may be needed in the conventional processes. However, the accuracy of die-to-wafer or wafer-to-wafer bonding alignment using state-of-art equipment may be on the order of about 0.5 μm or about 1 μm, which may not be adequate for bonding the small-pitch micro-LED arrays (e.g., with a linear dimension of the bonding pads on the order of 1 μm or shorter) to CMOS drive circuits.

In some implementations, to avoid precise alignment for the bonding, a micro-LED wafer may be bonded to a CMOS backplane after the epitaxial layer growth and before the formation of individual micro-LED on the micro-LED wafer, where the micro-LED wafer and the CMOS backplane may be bonded through metal-to-metal bonding of two solid metal bonding layers on the two wafers. No alignment would be needed to bond the solid contiguous metal bonding layers. After the bonding, the epitaxial layers on the micro-LED wafer and the metal bonding layers may be etched to form individual micro-LEDs. The etching process may have much higher alignment accuracy and thus may form individual micro-LEDs that align with the underlying pixel drive circuits.

FIG. 10B illustrates an example of a method of wafer-to-wafer bonding for arrays of LEDs according to certain embodiments. As shown in FIG. 10B, a first wafer 1002 may include a substrate 1004, a first semiconductor layer 1006, active layers 1008, and a second semiconductor layer 1010. Substrate 1004 may include various materials, such as GaAs, InP, GaN, AlN, sapphire, SiC, Si, or the like. First semiconductor layer 1006, active layers 1008, and second semiconductor layer 1010 may include various semiconductor materials, such as GaN, InGaN, (AlGaIn)P, (AlGaIn)AsP, (AlGaIn)AsN, (AlGaIn)Pas, (Eu:InGa)N, (AlGaIn)N, or the like. In some embodiments, first semiconductor layer 1006 may be an n-type layer, and second semiconductor layer 1010 may be a p-type layer. For example, first semiconductor layer 1006 may be an n-doped GaN layer (e.g., doped with Si or Ge), and second semiconductor layer 1010 may be a p-doped GaN layer (e.g., doped with Mg, Ca, Zn, or Be). Active layers 1008 may include, for example, one or more GaN layers, one or more InGaN layers, one or more AlInGaP layers, and the like, which may form one or more heterostructures, such as one or more quantum wells or MQWs.

In some embodiments, first wafer 1002 may also include a bonding layer. Bonding layer 1012 may include various materials, such as a metal, an oxide, a dielectric, CuSn, AuTi, or the like. In one example, bonding layer 1012 may include p-contacts and/or n-contacts (not shown). In some embodiments, other layers may also be included on first wafer 1002, such as a buffer layer between substrate 1004 and first semiconductor layer 1006. The buffer layer may include various materials, such as polycrystalline GaN or AlN. In some embodiments, a contact layer may be between second semiconductor layer 1010 and bonding layer 1012. The contact layer may include any suitable material for providing an electrical contact to second semiconductor layer 1010 and/or first semiconductor layer 1006.

First wafer 1002 may be bonded to wafer 1003 that includes drive circuits 1011 and bonding layer 1013 as described above, via bonding layer 1013 and/or bonding layer 1012. Bonding layer 1012 and bonding layer 1013 may be made of the same material or different materials. Bonding layer 1013 and bonding layer 1012 may be substantially flat. First wafer 1002 may be bonded to wafer 1003 by various methods, such as metal-to-metal bonding, eutectic bonding, metal oxide bonding, anodic bonding, thermo-compression bonding, ultraviolet (UV) bonding, and/or fusion bonding.

As shown in FIG. 10B, first wafer 1002 may be bonded to wafer 1003 with the p-side (e.g., second semiconductor layer 1010) of first wafer 1002 facing down (i.e., toward wafer 1003). After bonding, substrate 1004 may be removed from first wafer 1002, and first wafer 1002 may then be processed from the n-side. The processing may include, for example, the formation of certain mesa shapes for individual LEDs, as well as the formation of optical components corresponding to the individual LEDs.

FIGS. 11A-11F illustrate an example of a method of fabricating a micro-LED device using alignment-free metal-to-metal bonding and post-bonding mesa formation processes. FIG. 11A shows a micro-LED wafer 1102 including epitaxial layers grown on a substrate 1110. As described above, substrate 1110 may include, for example, a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-$LiAlO_2$ structure, where the substrate may be cut in a specific direction to expose a specific plane (e.g., a c-plane or a semipolar plane) as the growth surface. In some embodiments, a buffer layer 1112 may be formed on substrate 1110 to improve the lattice matching between the growth substrate and the epitaxial layers, thereby reducing stress and defects in the epitaxial layers. The epitaxial layers may include an n-type semiconductor layer 1114 (e.g., a GaN layer doped with Si or Ge), an active region 1116, and a p-type semiconductor layer 1118 (e.g., a GaN layer doped with Mg, Ca, Zn, or Be). Active region 1116 may include multiple quantum wells or an MQW formed by quantum well layers (e.g., InGaN layer) sandwiched by barrier layers (e.g., GaN layer) as described above. The epitaxial layers may be grown layer-by-layer on substrate 1110 or buffer layer 1112 using techniques such as VPE, LPE, MBE, or MOCVD.

In the epitaxial growth processes, dopants (e.g., Mg) used to dope the p-type semiconductor layer (e.g., Mg-doped GaN layer) may remain in the reactor and/or on the epitaxial surface after the introduction of Mg precursors into the reactor. For example, the source for Mg doping (e.g., bis (cyclopentadienyl) magnesium ($Cp_2Mg$)) may be adsorbed onto reactor lines and walls and may be released in the gas phase in subsequent processes. A surface riding effect can also contribute to the residual Mg due to a Mg-rich layer formed on the surface of the p-GaN layer. Thus, if the quantum-well layers are grown on the Mg-rich p-GaN layer after the growth of the p-GaN layer with Mg dopants, the quantum-well layers may be contaminated with Mg dopants even after the Mg source is turned off, which may be referred to as the Mg-memory effect and may manifest as a slow decay tail of Mg into subsequent epitaxial layers. Mg can contaminate the MQW layers to form non-radiative recombination centers caused by, for example, Mg-related point defects, Mg interstitials, or Mg-related complexes.

In addition, for p-type GaN layers formed using, for example, MOCVD, the dopants (e.g., Mg) may be passivated due to the incorporation of atomic hydrogen (which exists in the form of $H^+$) during growth and the formation of Mg—H complexes. Therefore, a post-growth activation of the dopants is generally performed to release mobile holes. The activation of the dopants in the p-GaN layer may include breaking the Mg—H bonds and driving the $H^+$ out of the p-GaN layer at elevated temperatures (e.g., above 700° C.) to activate the Mg dopants. Insufficient activation of the Mg dopants in the p-GaN layer may lead to an open circuit, a poor performance, or a premature punch-through breakdown of the LED device. If p-type GaN layer is grown before the growth of the active region and the n-type layer, to drive out hydrogen, positively charged $H^+$ ions need to diffuse across the p-n junction and through the n-GaN layer that is exposed. However, because of the depletion field in the p-n junction (with a direction from the n-type layer to the p-type layer), positively charged $H^+$ ions may not be able to diffuse from the p-type layer to the n-type layer across the p-n junction. Furthermore, hydrogen may have a much higher diffusion barrier and thus a much lower diffusivity in n-type GaN compared with in p-type GaN. Thus, the hydrogen ions may not diffuse through the n-type layer to the exposed top surface of the n-type layer. Moreover, the activation may not be performed right after the p-doping and before the growth of the active region either, because the subsequent growth may be performed in the presence of high pressure ammonia ($NH_3$) in order to avoid decomposition of GaN at the high growth temperatures, and thus a semiconductor layer (e.g., the p-type semiconductor layer) that was activated may be re-passivated due to the presence of ammonia.

Therefore, in general, during the growth of the epitaxial layers, n-type semiconductor layer 1114 may be grown first. P-type semiconductor layer 1118 may be grown after the growth of active region 1116 to avoid contamination of active region 1116 and facilitate activation of the dopants in the p-type semiconductor layer.

FIG. 11B shows a reflector layer 1120 and a bonding layer 1122 formed on p-type semiconductor layer 1118. Reflector layer 1120 may include, for example, a metal layer such as an aluminum layer, a silver layer, or a metal alloy layer. In some embodiments, reflector layer 1120 may include a distributed Bragg reflector formed by conductive materials (e.g., semiconductor materials or conductive oxides) or including conductive vias. In some embodiments, reflector layer 1120 may include one or more sublayers. Reflector layer 1120 may be formed on p-type semiconductor layer 1118 in a deposition process. Bonding layer 1122 may include a metal layer, such as a titanium layer, a copper layer, an aluminum layer, a gold layer, or a metal alloy layer. In some embodiments, bonding layer 1122 may include a eutectic alloy, such as Au—In, Au—Sn, Au—Ge, or Ag—In. Bonding layer 1122 may be formed on reflector layer 1120 by a deposition process and may include one or more sublayers.

FIG. 11C shows a backplane wafer 1104 that includes a substrate 1130 with electrical circuits formed thereon. The electrical circuits may include digital and analog pixel drive circuits for driving individual micro-LEDs. A plurality of metal pads 1134 (e.g., copper or tungsten pads) may be formed in a dielectric layer 1132 (e.g., including $SiO_2$ or SiN). In some embodiments, each metal pad 1134 may be an electrode (e.g., anode or cathode) for a micro-LED. In some embodiments, pixel drive circuits for each micro-LED may be formed in an area matching the size of a micro-LED (e.g., about 2 µm×2 µm), where the pixel drive circuits and the micro-LED may collectively form a pixel of a micro-LED display panel. Even though FIG. 11C only shows metal pads 1134 formed in one metal layer in one dielectric layer 1132, backplane wafer 1104 may include two or more metal layers formed in dielectric materials and interconnected by, for example, metal vias, as in many CMOS integrated circuits. In some embodiments, a planarization process, such as a CMP process, may be performed to planarize the exposed surfaces of metal pads 1134 and dielectric layer 1132. A bonding layer 1140 may be formed on dielectric layer 1132 and may be in physical and electrical contact with metal pads 1134. As bonding layer 1122, bonding layer 1140 may include a metal layer, such as a titanium layer, a copper layer, an aluminum layer, a gold layer, a metal alloy layer, or a combination thereof. In some embodiments, bonding layer 1140 may include a eutectic alloy. In some embodiments, only one of bonding layer 1140 or bonding layer 1122 may be used.

FIG. 11D shows that micro-LED wafer 1102 and backplane wafer 1104 may be bonded together to form a wafer stack 1106. Micro-LED wafer 1102 and backplane wafer 1104 may be bonded by the metal-to-metal bonding of bonding layer 1122 and bonding layer 1140. The metal-to-metal bonding may be based on chemical bonds between the metal atoms at the surfaces of the metal bonding layers. The metal-to-metal bonding may include, for example, thermocompression bonding, eutectic bonding, or transient liquid phase (TLP) bonding. The metal-to-metal bonding process may include, for example, surface planarization, wafer cleaning (e.g., using plasma or solvents) at room temperatures, and compression and annealing at elevated temperatures, such as about 250° C. or higher, to cause diffusion of atoms. In eutectic bonding, a eutectic alloy including two or more metals and with a eutectic point lower than the melting point of the two or more metals may be used for low-temperature wafer bonding. Because the eutectic alloy may become a liquid at the elevated temperature, eutectic bonding may be less sensitive to surface flatness irregularities, scratches, particles contamination, and the like. After the bonding, buffer layer 1112 and substrate 1110 may be thinned or removed by, for example, etching, back grinding, or laser lifting, to expose n-type semiconductor layer 1114.

FIG. 11E shows that wafer stack 1106 may be etched from the side of the exposed n-type semiconductor layer 1114 to form mesa structures 1108 for individual micro-LEDs. As shown in FIG. 11E, the etching may include etching through n-type semiconductor layer 1114, active region 1116, p-type semiconductor layer 1118, reflector layer 1120, and bonding layers 1122 and 1140, in order to singulate and electrically isolate mesa structures 1108. Thus, each singulated mesa structure 1108 may include n-type semiconductor layer 1114, active region 1116, p-type semiconductor layer 1118, reflector layer 1120, and bonding layers 1122 and 1140. To perform the etching, an etch mask layer may be formed on n-type semiconductor layer 1114. The etch mask layer may be patterned by aligning a photomask with the backplane wafer (e.g., using alignment marks on backplane wafer 1104) such that the patterned etch mask formed in the etch mask layer may align with metal pads 1134. Therefore, regions of the epitaxial layers and bonding layers above metal pads 1134 may not be etched. Dielectric layer 1132 may be used as the etch-stop layer for the etching. Even though FIG. 11E shows that mesa structures 1108 have substantially vertical sidewalls, mesa structures 1108 may have other shapes as described above, such as a conical shape, a parabolic shape, or a truncated pyramid shape.

FIG. 11F shows that a passivation layer 1150 may be formed on sidewalls of mesa structures 1108, and a sidewall reflector layer 1152 may be formed on passivation layer 1150. Passivation layer 1150 may include a dielectric layer (e.g., $SiO_2$, SiN, or $Al_2O_3$) or an undoped semiconductor layer. Sidewall reflector layer 1152 may include, for example, a metal (e.g., Al) or a metal alloy. In some embodiments, gaps between mesa structures 1108 may be filled with a dielectric material 1154 and/or a metal. Passivation layer 1150, sidewall reflector layer 1152, and/or dielectric material 1154 may be formed using suitable deposition techniques, such as chemical vapor deposition (CVD), physical vapor deposition (PVD), plasma-enhanced chemical vapor deposition (PECVD), atomic-layer deposition (ALD), laser metal deposition (LMD), or sputtering. In some embodiments, sidewall reflector layer 1152 may fill the gaps between mesa structures 1108. In some embodiments, a planarization process may be performed after the deposition of passivation layer 1150, sidewall reflector layer 1152, and/or dielectric material 1154. A common electrode layer 1160, such as a transparent conductive oxide (TCO) layer (e.g., an ITO layer) or a thin metal layer that may be transparent to light emitted in active region 1116, may be formed on the n-type semiconductor layer 1114 to form n-contacts and a common-cathode for the micro-LEDs.

FIG. 12A illustrates an example of a micro-LED device 1200 fabricated using the process shown in FIGS. 11A-11F. A cross-sectional view of micro-LED device 1200 is shown in FIG. 12A. In the illustrated example, micro-LED device 1200 may include an array of micro-LEDs bonded to or otherwise formed on a backplane wafer 1210. Backplane wafer 1210 may include a substrate (e.g., a silicon substrate) including pixel drive circuits formed thereon. The pixel drive circuits may include CMOS circuits, such as CMOS transistors. Backplane wafer 1210 may also include one or more dielectric layers (e.g., $SiO_2$ layers) and metal interconnects formed therein, such as metal (e.g., copper or tungsten) interconnects or plugs. One or more etch stop layers may be between two or more dielectric layers such that etching a dielectric layer to form metal interconnects in the dielectric layer may not etch into another dielectric layer or metal interconnects formed in another dielectric layer.

A micro-LED wafer including a substrate and an epitaxial layer stack may be bonded to backplane wafer 1210 through a bonding layer 1212 (which may include bonding layers 1122 and 1140). After the bonding, the substrate of the micro-LED wafer may be removed to expose the epitaxial layer stack, and the epitaxial layer stack may be etched down to bonding layer 1212 to form an array of micro-LEDs. Bonding layer 1212 may be etched to form individual electrodes for the array of micro-LEDs. Each micro-LED of the array of micro-LEDs may include a mesa structure that includes a reflector layer 1214 (e.g., including a reflective metal such as Al, Ag, Ni, Au, or Cu, and/or an ITO layer), a p-type semiconductor layer 1216 (e.g., a p-GaN layer), an active region 1218 (e.g., including an MQW), and an n-type semiconductor layer 1220 (e.g., an n-GaN layer). N-type semiconductor layer 1220 may be much thicker than active region 1218 and p-type semiconductor layer 1216. A passivation layer 1222 may be deposited on sidewalls of the mesa structures to electrically isolate the mesa structures. A reflective material layer 1224 (e.g., Al, Cu, or Au) may be formed on passivation layer 1222 to form sidewall reflectors that optically isolate individual micro-LEDS. A dielectric material 1226 (e.g., silicon oxide or silicon nitride) and/or a metal material (e.g., W, Al, Au, or Cu) may be deposited in regions between the mesa structures. An n-contact layer 1230 (e.g., a transparent conductive layer, such as an ITO layer) may be formed on the mesa structures before the etching or after the deposition of dielectric material 1226.

Since the mesa structures are formed by bonding a micro-LED wafer to backplane wafer 1210, removing the substrate of the micro-LED wafer to expose n-type semiconductor layer 1220, and etching from the side of n-type semiconductor layer 1220, each mesa structure may have inwardly tilted mesa sidewalls with respect to the z direction as shown in the illustrated example. Light emitted in active region 1218 may exit the mesa structure directly through n-type semiconductor layer 1220 and n-contact layer 1230, or may be reflected by reflector layer 1214 and/or reflective material layer 1224 and then exit the mesa structure through n-type semiconductor layer 1220 and n-contact layer 1230. Some light may be reflected back to the mesa structure by the light-emitting surface of the micro-LED (e.g., at the interface between n-contact layer 1230 and air) through total internal reflection and/or Fresnel reflection. Some light reflected back to the mesa structure may be trapped in the mesa structure and may eventually be absorbed. The inwardly tilted mesa sidewalls with reflective material layer 1224 formed thereon and the high thickness of n-type semiconductor layer 1220 may cause a large proportion of the emitted light to be trapped in the mesa structure. Thus, the efficiency of extracting the light emitted in active region 1218 out of the micro-LED may be low.

FIG. 12B illustrates an example of a micro-LED device 1202 fabricated using the method described above with respect to FIGS. 8A-8D. A cross-sectional view of micro-LED device 1202 is shown in FIG. 12B. In the illustrated example, micro-LED device 1202 may include an array of micro-LEDs bonded to a backplane wafer 1250. Backplane wafer 1250 may include a substrate (e.g., a silicon substrate) including pixel drive circuits formed thereon. The pixel drive circuits may include CMOS circuits, such as CMOS transistors. Backplane wafer 1250 may also include one or more dielectric layers 1255 (e.g., SiO$_2$ layers) and metal interconnects 1252 formed therein, such as metal (e.g., copper tungsten) interconnects or plugs.

The array of micro-LEDs may be fabricated on a micro-LED wafer that includes a substrate and an epitaxial layer stack, and may then be bonded to backplane wafer 1210 through dielectric layers 1255 and metal interconnects 1252. The epitaxial layer stack may include an n-type semiconductor layer 1260 (e.g., an n-GaN layer) grown on the substrate, an active region 1258 (e.g., including an MQW) grown on n-type semiconductor layer 1260, and a p-type semiconductor layer 1256 (e.g., a p-GaN layer) grown on active region 1258. The array of micro-LEDs may be fabricated by etching the epitaxial layer stack from the side of p-type semiconductor layer 1256 to form an array of mesa structure, depositing a passivation layer 1262 on sidewalls of the mesa structures to electrically isolate the mesa structures, depositing a metal reflector layer 1264 on passivation layer 1262 to optically isolate individual micro-LEDs, depositing a dielectric material 1266 (e.g., silicon oxide or silicon nitride) in regions between the mesa structures, and forming a p-contact 1254 on p-type semiconductor layer 1256 of each mesa structure. P-contact 1254 may include, for example, an ITO layer and/or a reflector layer that includes Al, Ag, Ni, Au, Cu, or a combination. P-contacts 1254 may be bonded to metal interconnects 1252 when the micro-LED wafer is bonded to backplane wafer 1250, for example, through hybrid bonding. The substrate of the micro-LED wafer may be removed after the bonding to form micro-LED device 1202 show in FIG. 12B.

Since the mesa structures are formed by etching from the side of p-type semiconductor layer 1256, each mesa structure in micro-LED device 1202 may have a smaller area at the side of p-type semiconductor layer 1256 and a larger area at the side of n-type semiconductor layer 1260. Therefore, after bonding the micro-LED wafer to backplane wafer 1250 with p-type semiconductor layer 1256 close to backplane wafer 1250 and removing the substrate of the micro-LED wafer, each mesa structure may have outwardly tilted mesa sidewalls with respect to the z direction as shown in the illustrated example. Thus, the efficiency of extracting the light emitted in active region 1258 out of the micro-LED may be higher compared with the example shown in FIG. 12A. However, as described above, when the pitch of the micro-LEDs on a micro-LED wafer is small, it may be difficult to precisely align and bond a backplane wafer with the micro-LED wafer that includes singulated micro-LEDs.

According to certain embodiments, the mesa structures with inwardly tilted mesa sidewalls in the micro-LED devices (e.g., micro-LED device 1200) fabricated using the process described above with respect to FIGS. 11A-11F may be modified to have an outwardly tilted sidewalls and a reflective layer on the outwardly tilted sidewalls. For example, a passivation layer may be formed on the inwardly tilted mesa sidewalls, a dielectric material may be deposited on the passivation layer and in regions between the mesa structures, the dielectric material surrounding each mesa structure may be etched to form a cavity that surrounds the mesa structure and has outwardly tilted sidewalls, the reflective layer may be formed on the outwardly tilted sidewalls of the cavity, and, in some embodiments, a high-refractive index material (e.g., with a refractive index matching or greater than a refractive index of the epitaxial layers) may be deposited into the cavity and on the reflective layer to surround the mesa structure. Therefore, the etched mesa structure may be modified to include the initially etched mesa structure, the passivation layer, the high-refractive index material surrounding the initially etched mesa structure, and the reflective layer surrounding the high-refractive index material. Thus, the modified mesa structure of a micro-LED may have outwardly tilted sidewalls with the reflective layer formed thereon, and may have a larger aperture at the light emitting side of the micro-LED. As such, the light extraction efficiency of the micro-LED may be improved. In some embodiments, the dielectric material may be etched to form a cavity with a certain shape such that the reflective layer formed on the sidewalls of the cavity (e.g., surfaces of the dielectric material after the etching) may form various optical devices for beam shaping and/or deflecting, such as a compound parabolic concentrator (CPC) for beam collimation or a beam deflector for beam deflecting.

Figure 13M:
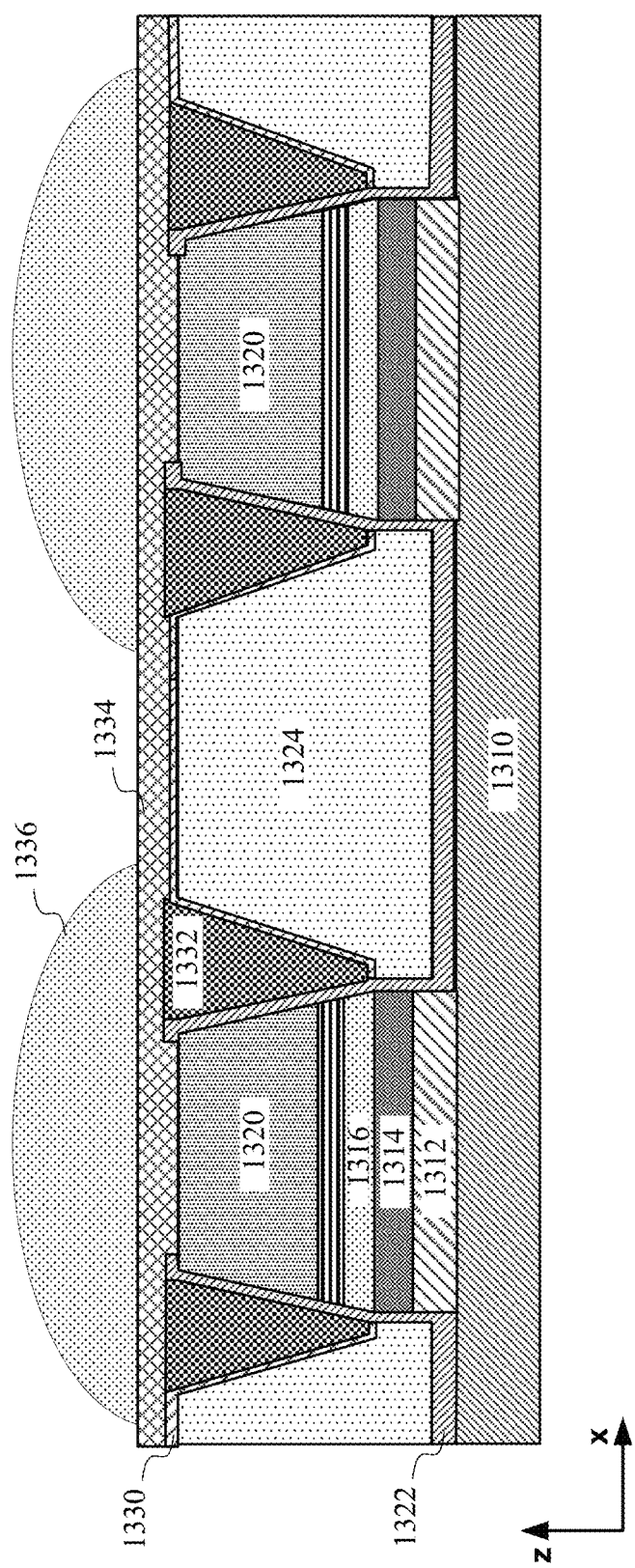

FIGS. 13A-13M illustrate an example of a process for fabricating a micro-LED device according to certain embodiments. FIG. 13A shows a wafer stack 1300 including a backplane wafer 1310 bonded to a micro-LED wafer in an alignment-free bonding process, where the substrate of the micro-LED wafer may be removed after the bonding. Wafer stack 1300 may be similar to wafer stack 1106 and may be fabricated as described above with respect to FIGS. 11A-11D. In the illustrated example, wafer stack 1300 may include backplane wafer 1310, a bonding metal layer 1312 (e.g., including Ti), a back reflector layer 1314 (e.g., including a reflective metal layer and/or an ITO layer), a p-type semiconductor layer 1316 (e.g., a p-doped GaN layer), an active layer 1318 (e.g., including a MQW), and an n-type semiconductor layer 1320 (e.g., an n-doped GaN layer).

FIG. 13B shows that wafer stack 1300 may be etched as described above with respect to FIG. 11E to form individual mesa structures 1302. Each mesa structure 1302, when viewed from the top (in-z direction), may have a shape of a circle, an oval, a square, a rectangle, a hexagon, or another polygon. Since wafer stack 1300 is etched from the side of n-type semiconductor layer 1320, the area of each mesa structure 1302 at p-type semiconductor layer 1316 may be larger than the area of each mesa structure 1302 at n-type semiconductor layer 1320. Therefore, sidewalls of each mesa structure 1302 may be inwardly tilted with respect to the z direction as shown in FIG. 13B.

FIG. 13C shows that a passivation layer 1322 may be conformally deposited on mesa structures 1302. Passivation layer 1322 may include, for example, $Al_2O_3$, and may be deposited on sidewalls and top surfaces of mesa structures 1302 and regions between mesa structures 1302. In one example, passivation layer 1322 may be deposited on mesa structures 1302 using ALD. Passivation layer 1322 may electrically isolate the semiconductor materials in adjacent mesa structures, and may be transparent to light emitted in active layer 1318.

FIG. 13D shows that a dielectric material 1324 (e.g., $SiO_2$) may be deposited on passivation layer 1322 and may fill regions between mesa structures 1302. The deposited dielectric material 1324 may be planarized using, for example, a CMP process, to form a flat top surface. In some embodiments, the top surface of dielectric material 1324 may align with the top surfaces of passivation layer 1322. In some embodiments, the top surface of dielectric material 1324 may be higher than the top surfaces of passivation layer 1322.

FIGS. 13E and 13F show that a patterned mask layer 1326 may be formed on the flat top surface of dielectric material 1324. FIG. 13E is a cross-section view of the structure with patterned mask layer 1326, and FIG. 13F is a top view of the structure. Patterned mask layer 1326 may be formed by coating a mask layer and patterning the mask layer using, for example, photolithography or e-beam lithography techniques. In some embodiments, features of patterned mask layer 1326 may have tapered sidewalls with desired tilt angles.

FIGS. 13G and 13H show that dielectric material 1324 may be etched using patterned mask layer 1326. FIG. 13G is a cross-section view of the structure formed after the etching, and FIG. 13H is a top view of the structure. Since the features of patterned mask layer 1326 may have tapered sidewalls and/or dielectric material 1324 may be etched using slanted etching processes (e.g., using slanted ion beams), cavities 1328 formed in regions where dielectric material 1324 is removed by the etching process may have a tapered shape with sidewalls outwardly tilted with respect to the z direction.

FIGS. 13I and 13J show that patterned mask layer 1326 may be removed and a reflective metal layer 1330 may be formed on surfaces of dielectric material 1324. FIG. 13I is a cross-section view of the structure formed, and FIG. 13J is a top view of the structure. Reflective metal layer 1330 may include, for example, Al. Because cavities 1328 formed in the layer of dielectric material 1324 and surrounding the mesa structures have outwardly tilted sidewalls with respect to the z direction, reflective metal layer 1330 surrounding the mesa structures may form a concave-shaped reflector. In embodiments where the top surface of dielectric material 1324 is higher than the top surface of passivation layer 1322, reflective metal layer 1330 formed on the surfaces of dielectric material 1324 may include a portion that is higher than the top surface of passivation layer 1322 in the z direction.

FIGS. 13K and 13L show that a high-refractive index material 1332 may be deposited into cavities 1328. FIG. 13K is a cross-section view of the structure formed, and FIG. 13L is a top view of the structure formed. High-refractive index material 1332 may include, for example, a dielectric material (e.g., $TiO_2$, $ZrO_2$, $HfO_2$, $Ta_2O_5$, $WO_3$, $Nb_2O_5$, $Si_3N_4$, TiN, ZrN, or HfN) or a semiconductor material (e.g., GaN or SiC). High-refractive index material 1332 may have a refractive index greater than, for example, about 1.75 for visible light. In some embodiments, high-refractive index material 1332 may have a refractive index equal to or greater than a refractive index of the epitaxial layers of the mesa structures for visible light. High-refractive index material 1332 may be deposited on the structure shown in FIG. 13I and may then be planarized using, for example, CMP. The deposited high-refractive index material 1332 may have outwardly tilted outer sidewalls that contact reflective metal layer 1330. As shown in FIG. 13K, the modified mesa structure for each micro-LED may include the initial mesa structure formed in the epitaxial layers, passivation layer 1322, high-refractive index material 1332, and reflective metal layer 1330, and may have outwardly tilted sidewalls as in micro-LED device 1202.

FIG. 13M shows that passivation layer 1322 on top of the mesa structures may be removed to expose n-type semiconductor layer 1320, and a transparent conductive layer 1334 may be deposited on the exposed n-type semiconductor layer 1320 and high-refractive index material 1332 to form a common-cathode for the micro-LEDs. Optionally, an array of micro-lenses 1336 may be formed in a dielectric material layer (e.g., SiN) deposited on transparent conductive layer 1334. The array of micro-lenses 1336 may be used to extract and collimate the light emitted by the micro-LEDs. The width of each micro-lens 1336 may be less than or equal to a pitch of the micro-LEDs.

FIG. 14A illustrates an example of a simulation model 1400 for a micro-LED device fabricated using the process described above with respect to FIGS. 11A-11F. Different grayscale tones in simulation model 1400 indicate different refractive indices of different materials. The micro-LED device shown in simulation model 1400 may include a micro-LED 1410 that is similar to the micro-LEDs shown in FIG. 12A, and may also include a SiN micro-lens 1420 formed on micro-LED 1410. In the example illustrated in FIG. 14A, the back reflector layer and p-contact (e.g., reflector layer 1214) may include an aluminum layer and an ITO layer, the p-type semiconductor layer (e.g., p-type semiconductor layer 1216) and the n-type semiconductor layer (e.g., n-type semiconductor layer 1220) may include GaN, the n-contact (e.g., n-contact layer 1230) may include ITO, the passivation layer (e.g., passivation layer 1222) may include $Al_2O_3$, the sidewall reflector (e.g., reflective material layer 1224) may include aluminum, and the dielectric material (e.g., dielectric material 1226) in regions between the mesa structures may include $SiO_2$.

FIG. 14B includes a diagram 1430 illustrating results of simulation using simulation model 1400 of FIG. 14A. FIG. 14B shows the power of the emitted light at different light emission angles for different wavelengths. The simulation results show that the total light extraction efficiency for light in all emission angles may be about 22%, and the total light extraction efficiency for light with emission angles within ±18.5° may be about 3.13%.

FIG. 14C illustrates an example of a simulation model 1402 for a micro-LED device fabricated using the method described above with respect to FIGS. 13A-13M. Different grayscale tones in simulation model 1402 indicate different refractive indices of different materials. The micro-LED device in simulation model 1402 may include a micro-LED 1412 that may be similar to the micro-LEDs shown in FIG. 13M, and may also include a SiN micro-lens 1422 formed on micro-LED 1412. In the example illustrated in FIG. 14C, the back reflector layer and p-contact (e.g., back reflector layer 1314) may include an aluminum layer and an ITO layer, the p-type semiconductor layer (e.g., p-type semiconductor layer 1316) and the n-type semiconductor layer (e.g., n-type semiconductor layer 1320) may include GaN, the n-contact (e.g., transparent conductive layer 1334) may include ITO, the passivation layer (e.g., passivation layer 1322) may include $Al_2O_3$, the high-refractive index material (e.g., high-refractive index material 1332) adjacent to the passivation layer may include a material with a refractive index matching or greater than the refractive index of GaN, and the sidewall reflector (e.g., reflective metal layer 1330) may include aluminum and may have a concave shape with sidewalls outwardly tilted in the z direction.

FIG. 14D includes a diagram 1432 illustrating results of simulation using the simulation model of FIG. 14C. FIG. 14D shows the power of the emitted light at different light emission angles for different wavelengths. FIG. 14D shows that, compared with the micro-LED shown in simulation model 1400, the micro-LED shown in simulation model 1402 may have much higher intensities at small emission angles for light with wavelengths around 530 nm. The total light extraction efficiency for light in all emission angles may be about 31.3%, and the total light extraction efficiency for light with emission angles within ±18.5° may be about 4.41%, which is about 40% higher than the 3.13% light extraction efficiency of the micro-LED shown in simulation model 1400.

FIG. 15A illustrates an example of a common-cathode GaN-based micro-LED device 1500 according to certain embodiments. Micro-LED device 1500 may include an array of micro-LEDs formed on a backplane wafer 1510. Backplane wafer 1510 may include a substrate (e.g., a silicon substrate) including pixel drive circuits formed thereon. The pixel drive circuits may include CMOS circuits, such as CMOS transistors. Backplane wafer 1510 may also include one or more dielectric layers (e.g., $SiO_2$ layers) and metal interconnects formed therein, such as metal (e.g., copper or tungsten) interconnects or plugs.

A micro-LED wafer including a substrate and an epitaxial layer stack may be bonded to backplane wafer 1510 through a bonding layer 1512. After the bonding, the substrate of the micro-LED wafer may be removed to expose n-type semiconductor layer 1520, and the epitaxial layer stack may be etched from the side of n-type semiconductor layer 1520 down to bonding layer 1512. Bonding layer 1512 may be etched to form individual electrodes for the array of micro-LEDs. Each micro-LED of the array of micro-LEDs may include an etch mesa structure that includes a back reflector layer 1514 (e.g., including a reflective metal such as Al, Ag, Ni, Au, or Cu, and/or an ITO layer), a p-type semiconductor layer 1516 (e.g., a p-GaN layer), an active layer 1518 (e.g., including an MQW), an n-type semiconductor layer 1520 (e.g., an n-GaN layer). N-type semiconductor layer 1520 may be much thicker than active layer 1518 and p-type semiconductor layer 1516. A passivation layer 1522 may be deposited on sidewalls (and top surfaces) of the mesa structures to electrically isolate the mesa structures. A dielectric material 1524 (e.g., silicon oxide or silicon nitride) and/or a metal material (e.g., W, Al, Au, or Cu) may be deposited in regions between the mesa structures.

Regions of dielectric material 1524 surrounding the epitaxial layers of the mesa structures may be etched as described above with respect to FIGS. 13E-13H to form cavities 1528 surrounding the mesa structures. A second dielectric layer 1526 may be formed on dielectric material 1524 and may be patterned. In some embodiments, second dielectric layer 1526 may be deposited on dielectric material 1524 and may be etched before dielectric material 1524 is etched. A reflective metal layer 1530 may be deposited on exposed surfaces of dielectric material 1524 and second dielectric layer 1526. As shown in FIG. 15A, a top portion of reflective metal layer 1530 may be higher than the mesa structures in the z direction. A center region of passivation layer 1522 on top of n-type semiconductor layer 1520 in each mesa structure may be removed to expose n-type semiconductor layer 1520, and a transparent conductive layer 1532 (e.g., an ITO layer that may function as an n-contact layer) may be formed on the exposed n-type semiconductor layer 1520 and passivation layer 1522.

Reflective metal layer 1530 deposited on exposed surfaces of dielectric material 1524 and second dielectric layer 1526 may form a compound parabolic concentrator (CPC). The CPC may collimate the light emitted by active layer 1518, such that more light emitted by active layer 1518 and coupled out of micro-LED device 1500 may have emission angles within about ±18.5°. Therefore, a micro-lens (e.g., micro-lens 1336) may not be needed.

In some embodiments, a high-refractive index material (e.g., high-refractive index material 1332, not shown in FIG. 15A) may be deposited in cavities 1528 surrounding the epitaxial layers of the mesa structures, for example, before forming transparent conductive layer 1532. After depositing the high-refractive index material in cavities 1528, the center region of passivation layer 1522 on top of n-type semiconductor layer 1520 in each mesa structure may be removed to expose n-type semiconductor layer 1520, and transparent conductive layer 1532 (which may function as an n-contact) may be formed on the exposed n-type semiconductor layer 1520, passivation layer 1522, and the high-refractive index material.

FIG. 15B illustrates another example of a common-cathode GaN-based micro-LED device 1502 according to certain embodiments. Micro-LED device 1502 may be similar to micro-LED device 1500, and may include backplane wafer 1510 and mesa structures that each include bonding layer 1512, back reflector layer 1514, p-type semiconductor layer 1516, active layer 1518, n-type semiconductor layer 1520. Passivation layer 1522 may be formed on sidewalls and top surfaces of the mesa structures. A thick dielectric material layer 1540 may be deposited in regions between the mesa structure and on top of the mesa structures, and may be etched as described above with respect to FIGS. 13E-13H to remove the dielectric material in regions above and surrounding the mesa structures to form cavities 1545 surrounding the mesa structures. A second dielectric layer 1542 may be formed on dielectric material layer 1540 and may be patterned. In some embodiments, second dielectric layer 1542 may be deposited on dielectric material layer 1540 and may be etched before dielectric material layer 1540 is etched. A reflective metal layer 1544 may be deposited on exposed surfaces of dielectric material layer 1540 and second dielectric layer 1542. A center region of passivation layer 1522 on top of n-type semiconductor layer 1520 in each mesa structure may be removed to expose n-type semiconductor layer 1520, and a transparent conductive layer 1546 (which may function as an n-contact) may be formed on the exposed n-type semiconductor layer 1520 and passivation layer 1522.

Reflective metal layer 1544 deposited on exposed surfaces of dielectric material layer 1540 and second dielectric layer 1542 may form a CPC with sidewalls that are much taller than the sidewalls of the CPCs of micro-LED device 1500. Thus, the CPCs of micro-LED device 1502 may collimate the light emitted in active layer 1518 better than the CPCs of micro-LED device 1500. Therefore, more light emitted in active layer 1518 and coupled out of micro-LED device 1502 may have emission angles within about ±18.5°, without using a micro-lens (e.g., micro-lens 1336).

In some embodiments, a high-refractive index material (e.g., high-refractive index material 1332, not shown in FIG. 15B) may be deposited in cavities 1545 before forming transparent conductive layer 1546. After depositing the high-refractive index material in cavities 1545, a center region of passivation layer 1522 on top of n-type semiconductor layer 1520 in each mesa structure may be removed to expose n-type semiconductor layer 1520, and transparent conductive layer 1546 (which may function as an n-contact) may be formed on the exposed n-type semiconductor layer 1520, passivation layer 1522, and the high-refractive index material.

FIG. 16A illustrates an example of a micro-LED device 1600 according to certain embodiments. Micro-LED device 1600 may be similar to the micro-LED device shown in FIG. 13M, but may have asymmetric high-refractive index material regions surrounding the epitaxial layers of the mesa structures. In the illustrated example, micro-LED device 1600 may include backplane wafer 1610 and mesa structures that each include a metal bonding layer 1612, a back reflector layer 1614, a p-type semiconductor layer 1616, an active layer 1618, an n-type semiconductor layer 1620, and a passivation layer 1622. A dielectric material layer 1624 may be deposited on passivation layer 1622 and in regions between the mesa structures, and may be etched as described above with respect to FIGS. 13E-13H to remove the dielectric material in regions surrounding the epitaxial layers of the mesa structures, thereby forming cavities surrounding the epitaxial layers of the mesa structures. The etch mask and the etching process may be selected such that dielectric material layer 1624 surrounding the mesa structures may be etched asymmetrically to form cavities that are asymmetrical with respect to the centers of the etched mesa structure. A reflective metal layer 1626 may be deposited on exposed surfaces of dielectric material layer 1624 and may have an asymmetrical shape with respect to the centers of the etched mesa structures due to the asymmetrical shape of the cavities. A high-refractive index material 1628 may be deposited in the cavities surrounding the mesa structures. High-refractive index material 1628 may include, for example, a dielectric material (e.g., $TiO_2$, $ZrO_2$, $HfO_2$, $Ta_2O_5$, $WO_3$, $Nb_2O_5$, $Si_3N_4$, TiN, ZrN, or HfN) or a semiconductor material (e.g., GaN or SiC). In some embodiments, high-refractive index material 1628 may have a refractive index equal to or greater than a refractive index of the epitaxial layers of the mesa structures for visible light. The regions of the deposited high-refractive index material 1628 may be asymmetrical with respect to the centers of the etched mesa structures due to the asymmetrical shape of the cavities. The center region of passivation layer 1622 on top of n-type semiconductor layer 1620 in each mesa structure may be etched to expose n-type semiconductor layer 1620, and a transparent conductive layer 1630 (e.g., a common cathode) may be formed on the exposed n-type semiconductor layer 1620, passivation layer 1622, and high-refractive index material 1628. Due to its asymmetric shape, reflective metal layer 1626 may deflect the light emitted in the active region asymmetrically, such that the chief ray of the light beam emitted by a micro-LED may be in a direction different from the surface-normal direction (e.g., the z direction).

FIG. 16B illustrates another example of a micro-LED device 1602 according to certain embodiments. Micro-LED device 1602 may include backplane wafer 1610 and mesa structures that each include metal bonding layer 1612, back reflector layer 1614, p-type semiconductor layer 1616, active layer 1618, n-type semiconductor layer 1620, and passivation layer 1622. Dielectric material layer 1624 may be deposited on passivation layer 1622 and in regions between the mesa structures, and may be etched as described above with respect to FIGS. 13E-13H to remove the dielectric material in regions surrounding the mesa structures and form cavities surrounding the mesa structures. A second dielectric layer 1640 may be formed on dielectric material layer 1624 and may be patterned as shown in FIG. 16B. In some embodiments, second dielectric layer 1640 may be deposited on dielectric material layer 1624 and etched before dielectric material layer 1624 is etched. Second dielectric layer 1640 may include patterns that are asymmetrical with respect to centers of the etched mesa structures. A reflective metal layer 1642 may be deposited on exposed surfaces of dielectric material layer 1624 and second dielectric layer 1640. A high-refractive index material 1644 may be deposited in the cavities surrounding the mesa structures. A center region of passivation layer 1622 on top of n-type semiconductor layer 1620 in each mesa structure may be etched to expose n-type semiconductor layer 1620, and a transparent conductive layer 1646 (which may function as n-contacts) may be formed on the exposed n-type semiconductor layer 1620 and passivation layer 1622. As shown in FIG. 16B, second dielectric layer 1640 may be patterned asymmetrically with respect to each mesa structure, and thus sidewalls of reflective metal layer 1642 may have an asymmetric shape. Therefore, light may be reflected asymmetrically by reflective metal layer 1642 such that the chief ray angle of the light beam emitted from a micro-LED may not be in the surface-normal direction (e.g., z direction) of micro-LED device 1602.

Figure 16C:
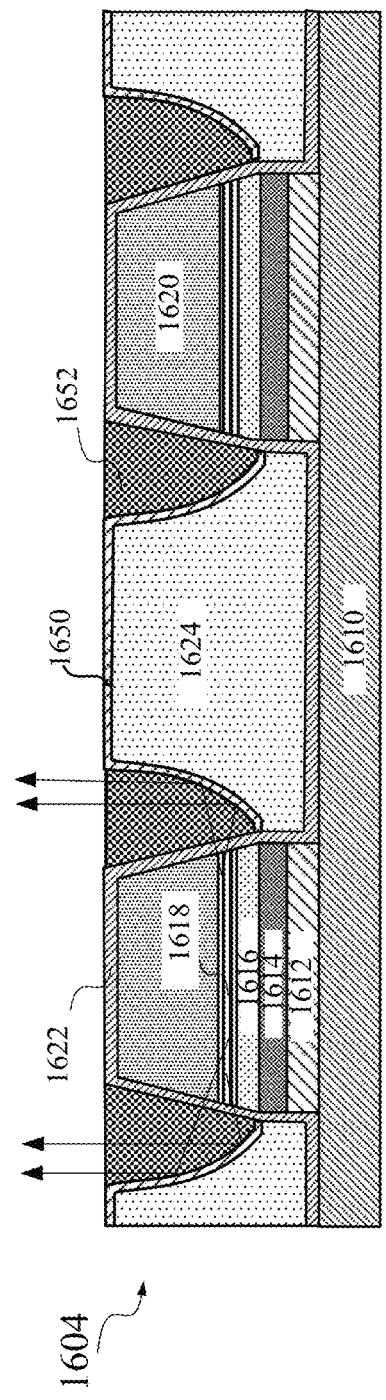

FIG. 16C illustrates another example of a micro-LED device 1604 according to certain embodiments. Micro-LED device 1604 may be similar to micro-LED device 1600 shown in FIG. 16A, but the high-refractive index material regions surrounding the epitaxial layers of the mesa structures in micro-LED device 1604 may have parabolic-shaped outer sidewalls on a parabolic-shaped reflective material layer. In the illustrated example, micro-LED device 1604 may include backplane wafer 1610 and mesa structures that each include metal bonding layer 1612, back reflector layer 1614, p-type semiconductor layer 1616, active layer 1618, n-type semiconductor layer 1620, and passivation layer 1622. Dielectric material layer 1624 may be deposited on passivation layer 1622 and in regions between the mesa structures, and may be etched as described above with respect to FIGS. 13E-13H to remove the dielectric material in regions surrounding the epitaxial layers of the mesa structures, thereby forming cavities surrounding the epitaxial layers of the mesa structures. The etch mask and the etching process may be selected such that dielectric material layer 1624 surrounding the mesa structures may be etched to form cavities with parabolic-shaped sidewalls. For example, dielectric material layer 1624 may be etched using wet etching processes to form cavities with parabolic-shaped sidewalls. A reflective metal layer 1650 may be deposited on exposed surfaces of dielectric material layer 1624 and thus may form parabolic-shaped reflectors at the parabolic-shaped sidewalls of the cavities. A high-refractive index material 1652 may be deposited in the cavities surrounding the mesa structures. High-refractive index material 1652 may include, for example, a dielectric material (e.g., $TiO_2$, $ZrO_2$, $HfO_2$, $Ta_2O_5$, $WO_3$, $Nb_2O_5$, $Si_3N_4$, TIN, ZrN, or HfN) or a semiconductor material (e.g., GaN or SiC). In some embodiments, high-refractive index material 1652 may have a refractive index equal to or greater than a refractive index of the epitaxial layers of the mesa structures for visible light. Even though not shown in FIG. 16C, the center region of passivation layer 1622 on top of n-type semiconductor layer 1620 in each mesa structure may be etched to expose n-type semiconductor layer 1620, and a transparent conductive layer (e.g., an ITO layer) may be formed on the exposed n-type semiconductor layer 1620, passivation layer 1622, and high-refractive index material 1652. In micro-LED device 1604, active layer 1618 in each mesa structure may be at the focal point of a corresponding parabolic-shaped reflector formed by reflective metal layer 1650, and thus the parabolic-shaped reflector may collimate light emitted in active layer 1618. The collimated light incident on the interface between air and high-refractive index material 1652 (or the transparent conductive layer) may have small incident angles and thus may not be reflected back due to TIR. Therefore, the light extraction efficiencies of the micro-LEDs in micro-LED device 1604 may be improved. In micro-LED device 1604, a micro-lens array may not be used since the light emitted in active layer 1618 may have been collimated by the parabolic-shaped reflectors.

Figure 16D:
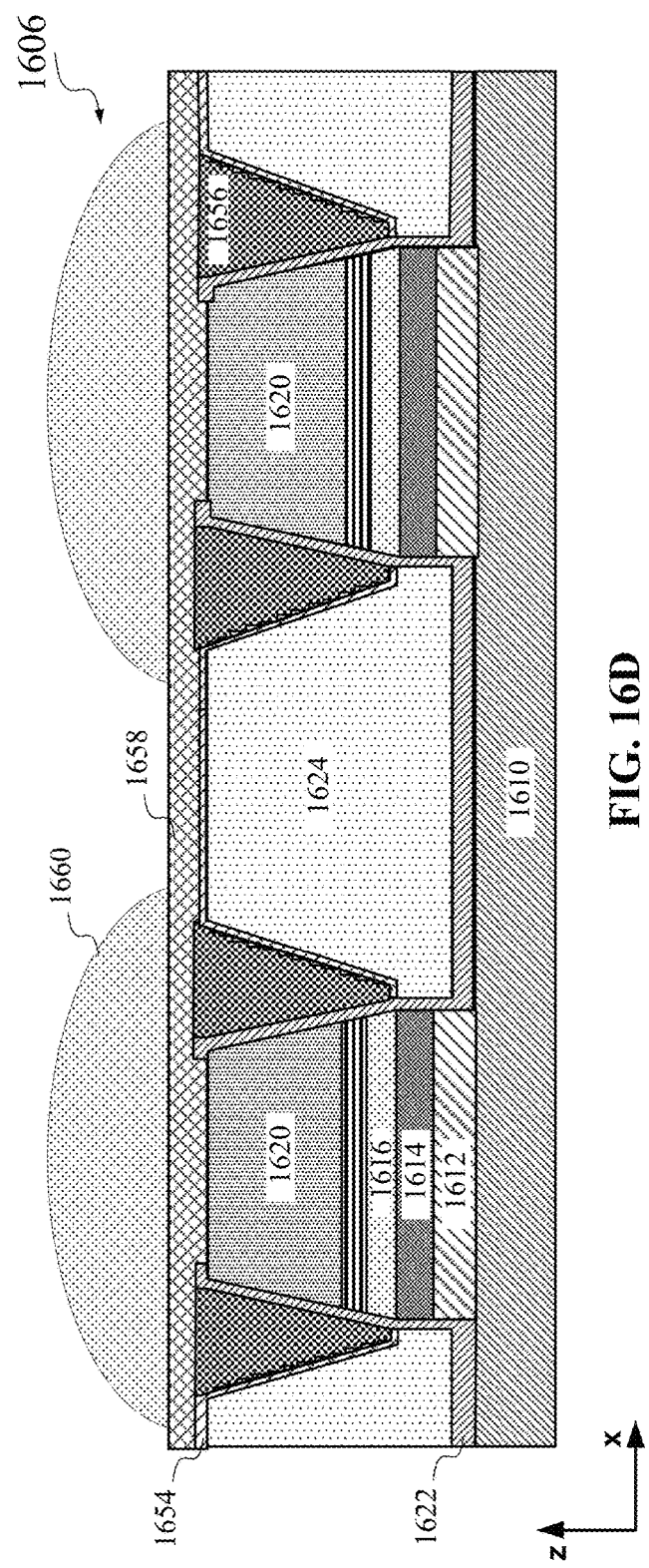

FIG. 16D illustrates another example of a micro-LED device 1606 according to certain embodiments. Micro-LED device 1606 may be similar to the micro-LED device shown in FIG. 13M, but the high-refractive index material regions, the dielectric material regions, and/or the reflective metal layer may have rough surfaces. In the illustrated example, micro-LED device 1606 may include backplane wafer 1610 and mesa structures that each include metal bonding layer 1612, back reflector layer 1614, p-type semiconductor layer 1616, active layer 1618, n-type semiconductor layer 1620, and passivation layer 1622. Dielectric material layer 1624 may be deposited on passivation layer 1622 and in regions between the mesa structures, and may be etched as described above with respect to FIGS. 13E-13H to remove the dielectric material in regions surrounding the epitaxial layers of the mesa structures, thereby forming cavities surrounding the epitaxial layers of the mesa structures. The etching process may be selected such that exposed surfaces of dielectric material layer 1624 (i.e., sidewalls of the cavities) surrounding the mesa structures may be rough. A reflective metal layer 1654 may be deposited on the exposed rough surfaces of dielectric material layer 1624 and may form reflectors with rough surfaces on the rough sidewalls of the cavities. A high-refractive index material 1656 may be deposited in the cavities surrounding the mesa structures and on reflective metal layer 1654. High-refractive index material 1656 may include, for example, a dielectric material (e.g., $TiO_2$, $ZrO_2$, $HfO_2$, $Ta_2O_5$, $WO_3$, $Nb_2O_5$, $Si_3N_4$, TIN, ZrN, or HfN) or a semiconductor material (e.g., GaN or SiC). In some embodiments, high-refractive index material 1656 may have a refractive index equal to or greater than a refractive index of the epitaxial layers of the mesa structures for visible light. The center region of passivation layer 1622 on top of n-type semiconductor layer 1620 in each mesa structure may be etched to expose n-type semiconductor layer 1620, and a transparent conductive layer 1658 (e.g., an ITO layer) may be formed on the exposed n-type semiconductor layer 1620, passivation layer 1622, and high-refractive index material 1656. An array of micro-lenses 1660 may be formed in a dielectric material layer (e.g., SiN) deposited on transparent conductive layer 1658. The array of micro-lenses 1660 may be used to extract and collimate the light emitted by the micro-LEDs. The width of each micro-lens 1660 may be less than or equal to a pitch of the micro-LEDs. In micro-LED device 1606, the rough surfaces at reflective metal layer 1654 may diffusely reflect light emitted in active layer 1618, thereby increasing the light extraction efficiency of the micro-LEDs in micro-LED device 1606.

Figure 16E:
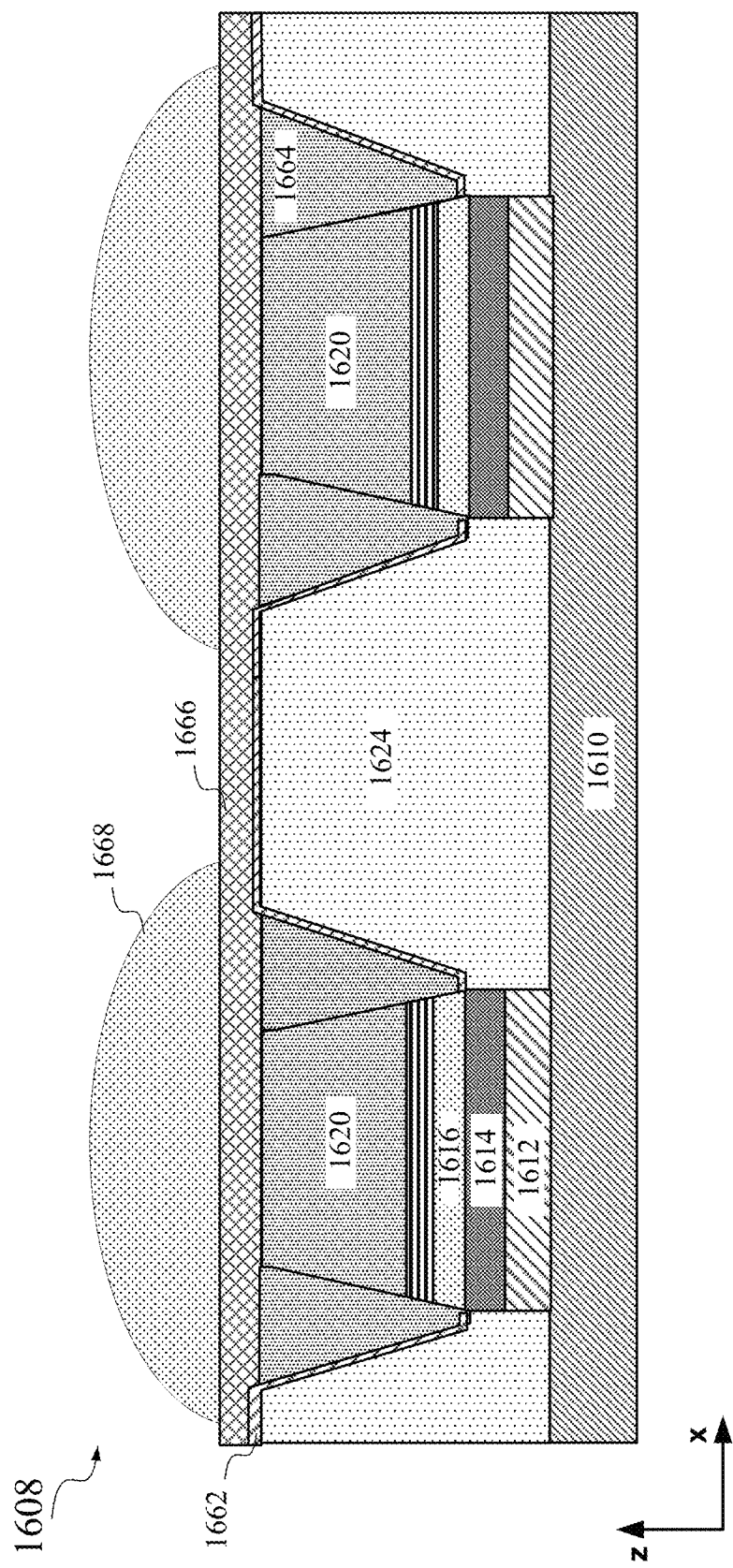

FIG. 16E illustrates yet another example of a micro-LED device 1608 according to certain embodiments. In the illustrated example, micro-LED device 1606 may include backplane wafer 1610 and mesa structures that each include metal bonding layer 1612, back reflector layer 1614, p-type semiconductor layer 1616, active layer 1618, and n-type semiconductor layer 1620. Dielectric material layer 1624 may be deposited on sidewalls of the mesa structures and in regions between the mesa structures, and may be etched as described above with respect to FIGS. 13E-13H to remove the dielectric material in regions surrounding the epitaxial layers of the mesa structures, thereby forming cavities surrounding the epitaxial layers of the mesa structures. A reflective metal layer 1662 may be deposited on exposed surfaces of dielectric material layer 1624 and may form reflectors on the sidewalls of the cavities. An undoped semiconductor material 1664 (e.g., undoped GaN or AlGaN) may be grown on sidewalls of the mesa structures and may fill the cavities that surround the epitaxial layers of the mesa structures, thereby forming modified mesa structures with outwardly tilted mesa sidewalls. Undoped semiconductor material 1664 may act as both a mesa sidewall passivation layer and an index-matching layer. A transparent conductive layer 1666 (e.g., an ITO layer) may be formed on the n-type semiconductor layer 1620 and undoped semiconductor material 1664. An array of micro-lenses 1668 may be formed in a dielectric material layer (e.g., SiN) deposited on transparent conductive layer 1666. The array of micro-lenses 1668 may be used to extract and collimate the light emitted by the micro-LEDs. The width of each micro-lens 1668 may be less than or equal to a pitch of the micro-LEDs.

In the examples described above with respect to FIGS. 11A-16E, the micro-LED wafer may be bonded to the backplane wafer with the p-type semiconductor layer closer to the backplane wafer, and the active region may be close to the metal bonding layer at the bottom of the mesa structure of each micro-LED. Thus, light emitted in the active region that is close to the bottom of the mesa structure may need to be extracted out of the micro-LED through the thicker n-type semiconductor layer. Therefore, the light extract efficiency may still be low. In addition, in processes where the micro-LEDs are singulated after the alignment-free wafer bonding, a deep etching process may be used to etch through the epitaxial layers and the metal bonding layers. Since the active region may be close to the metal bonding layers, etching the metal bonding layers after etching the epitaxial layers may redeposit metals on the sidewalls of the active region and contaminate the active region, thereby reducing the internal quantum efficiency (IQE) of the micro-LEDs. As a result, the external quantum efficiency of the micro-LED, which may be a product of the internal quantum efficiency and the light extraction efficiency of the micro-LED, may still be low.

FIGS. 17A-17G illustrate an example of a process for fabricating a common-anode GaN-based micro-LED devices according to certain embodiments. It is noted that the operations and processes illustrated in FIGS. 17A-17G provide particular processes for fabricating common-anode micro-LED devices. Other sequences of operations can also be performed according to alternative embodiments. For example, alternative embodiments may perform the operation in a different order. Moreover, the individual operations illustrated in FIGS. 17A-17G can include multiple sub-operations that can be performed in various sequences as appropriate for the individual operation. Furthermore, some operations can be added or removed depending on the particular applications. In some implementations, two or more operations may be performed in parallel. One of ordinary skill in the art would recognize many variations, modifications, and alternatives.

FIG. 17A shows a first wafer 1702 (e.g., a micro-LED wafer) that may be fabricated or otherwise obtained. First wafer 1702 may be similar to micro-LED wafer 1102 describe above with respect to FIG. 11A and may be fabricated using similar epitaxial growth processes, and thus is not described again in detail in this section. In the illustrated example, first wafer 1702 may include a first substrate 1710 and epitaxial layers grown on first substrate 1710. The epitaxial layers may include an optional buffer layer 1712, an n-type semiconductor layer 1714 (e.g., an n-doped GaN layer), an active light-emitting layer 1716 (e.g., including InGaN/GaN MQW layers), and a p-type semiconductor layer 1718 (e.g., a p-doped GaN layer). First substrate 1710 may include, for example, GaN, sapphire, silicon, or other substrates described above with respect to, for example, FIG. 7A and FIG. 11A. In the illustrated example, buffer layer 1712 may be grown on first substrate 1710, and n-type semiconductor layer 1714 may be grown on buffer layer 1712, for example, using techniques discussed above such as VPE, LPE, MBE, or MOCVD. Active light-emitting layer 1716 may be grown on n-type semiconductor layer 1714, and then p-type semiconductor layer 1718 may be grown on active light-emitting layer 1716.

FIG. 17B shows a wafer stack 1704 including a second substrate 1720 (e.g., a temporary substrate) bonded to p-type semiconductor layer 1718 of first wafer 1702 using a temporary bonding layer 1722 in a first alignment-free bonding process. In some embodiments, second substrate 1720 may be made of a substantially same or similar material as first substrate 1710. In some embodiments, second substrate 1720 may include a material different from first substrate 1710, such as a dielectric substrate (e.g., a glass substrate, a ceramic substrate, a SiN substrate, or a metal oxide substrate), a semiconductor substrate (e.g., a silicon substrate), or another carrier substrate (e.g., a metal plate). In some embodiments, second substrate 1720 may be perforated. Temporary bonding layer 1722 may include, for example, an adhesive (e.g., a UV-curable adhesive such as an epoxy resin) or a thermoplastic bonding material (e.g., polyimide). In some embodiments, temporary bonding layer 1722 may also include a low-surface-energy polymeric release material layer, such as a polymeric release material layer. The bonding process for bonding first wafer 1702 and second substrate 1720 may include, for example, applying (e.g., spin-coating) temporary bonding layer 1722 on second substrate 1720 and/or first wafer 1702, baking temporary bonding layer 1722, and bonding second substrate 1720 to first wafer 1702 using temporary bonding layer 1722 through thermo-compression bonding. The bonding of second substrate 1720 to p-type semiconductor layer 1718 may result in a wafer stack 1704 including first substrate 1710 and second substrate 1720 on each side of wafer stack 1704, as illustrated in FIG. 17B. The temporary bonding may advantageously enable a crack-free debonding (e.g., laser lift off) process and a high-yield thermo-compression bonding of the backplane wafer and epitaxial layers in a subsequent process.

FIG. 17C shows that first substrate 1710 and buffer layer 1712 of first wafer 1702 may be removed or thinned to expose n-type semiconductor layer 1714. First substrate 1710 and buffer layer 1712 may be removed or thinned using, for example, mechanical back-grinding, chemical mechanical planarization (CMP), wet etching, atmospheric downstream plasma dry chemical etching, wafer lapping, or other suitable wafer thinning techniques. Second substrate 1720 may remain bonded to p-type semiconductor layer 1718 of the epitaxial layers during the removal or thinning of first substrate 1710 to support the epitaxial layers. In some embodiments, a portion of n-type semiconductor layer 1714 may also be thinned or removed by the wafer thinning process.

FIG. 17D shows an example of bonding a structure 1706 that includes additional layers formed on the epitaxial layers to a second wafer 1708. In the illustrated example, a reflector layer 1724 may be deposited onto the exposed n-type semiconductor layer 1714, and a first metal bonding layer 1726 may be formed on reflector layer 1724. Reflector layer 1724 may include a suitable metal material that may have a high reflectivity for visible light, such as Al or Ag, such that it may reflect light emitted in active light-emitting layer 1716 towards the light emitting surface of the micro-LED. In some embodiments, reflector layer 1724 may include multiple interleaved layers of two different materials (having different refractive indices) that may form a distributed Bragg reflector (DBR). In some embodiments, first metal bonding layer 1726 may include one or more metal or metal alloy materials, such as Al, Ag, Au, Pt, Ti, Cu, Ni, TiN, or any combination thereof. In some implementations, reflector layer 1724 and first metal bonding layer 1726 may be a same layer. For example, if the electrical conductivity and reflectivity of the first metal bonding layer 1726 is sufficiently high and the absorption of the first metal bonding layer 1726 is sufficiently low, reflector layer 1724 may not be used.

Second wafer 1708 (e.g., a backplane wafer) may be bonded to first metal bonding layer 1726 on structure 1706 in a second alignment-free bonding process. Second wafer 1708 may include a CMOS backplane 1730 that includes pixel drive circuits formed on a silicon substrate. Second wafer 1708 may also include interconnects 1734 (e.g., tungsten plugs or copper vias) formed in one or more dielectric layers 1732 (e.g., $SiO_2$ or SiN layers). In some embodiments, second wafer 1708 may include a second metal bonding layer 1736, such as a layer of Ti, Au, Al, Cu, TiN, or a combination thereof. Second metal bonding layer 1736 may be coupled to interconnects 1734. In some implementations, second metal bonding layer 1736 of second wafer 1708 may be of a substantially same or similar material (e.g., Ti) as first metal bonding layer 1726. In some implementations, second metal bonding layer 1736 of second wafer 1708 may include material(s) different from first metal bonding layer 1726. In some embodiments, first metal bonding layer 1726 and second metal bonding layer 1736 may be bonded by a thermo-compression bonding process. Second metal bonding layer 1736 and first metal bonding layer 1726 may form a metal layer that may be used to form individual electrodes (e.g., cathodes) for the micro-LEDs. In some embodiments, annealing processes or other processes may be performed such that second metal bonding layer 1736 and first metal bonding layer 1726 may form a uniform metal layer where the bonding interface may not easily detectable.

FIG. 17E shows that, after the second alignment-free bonding, second substrate 1720 and temporary bonding layer 1722 may be removed from the bonded wafer stack to expose p-type semiconductor layer 1718. Second wafer 1708 may remain bonded to the epitaxial layers via the metal-to-metal bonding of first metal bonding layer 1726 and second metal bonding layer 1736. Second substrate 1720 may be removed by a low-stress debonding process, such as chemical debonding (e.g., through perforations in second substrate 1720), thermal slide debonding (e.g., heating and sliding), laser debonding (e.g., exposing a release material layer to laser beams), or mechanical debonding (e.g., through a release material layer). In some embodiments, the debonding process may be performed at room temperature. In some embodiments, at least a portion of temporary bonding layer 1722 may remain on p-type semiconductor layer 1718. The residual temporary bonding layer 1722 on p-type semiconductor layer 1718 may be removed by dry etching and/or wet etching.

FIG. 17F shows that p-type semiconductor layer 1718, active light-emitting layer 1716, n-type semiconductor layer 1714, reflector layer 1724, first metal bonding layer 1726, and second metal bonding layer 1736 in the wafer stack may be etched from the side of p-type semiconductor layer 1718 down to second metal bonding layer 1736 to form an array of mesa structures 1705. Various etching techniques, such as dry etching and/or wet etching, may be used for the etching. Dielectric layer 1732 on second wafer 1708 may be used as the etch stop layer. The etching may be performed from the side of p-type semiconductor layer 1718 in multiple etching steps that use a same etch mask layer but different etching recipes. As described above, the etch mask layer may be patterned by aligning a photomask with the second wafer 1708 (e.g., using alignment marks on second wafer 1708) such that the patterned etch mask formed in the etch mask layer may align with interconnects 1734. In some embodiments, each interconnect 1734 may be smaller than the first metal bonding layer 1726 and second metal bonding layer 1736 in each mesa structure, and may overlap laterally with an interior region of second metal bonding layer 1736 in each mesa structure 1705 as shown in FIG. 17F.

Etching the epitaxial layers may lead to the formation of mesa structures 1705 with inwardly tilted sidewalls. Mesa structures 1705 may have various sidewall shapes, such as substantially vertical shapes, parabolic shapes, conic shapes, stepped shapes, and the like. The shape of the mesa structure may affect the light emission profile and the light extraction efficiency. In some embodiments, the sidewalls of mesa structures 1705 may be treated (e.g., using KOH) to remove damaged portions of the semiconductor materials.

Figure 17G:
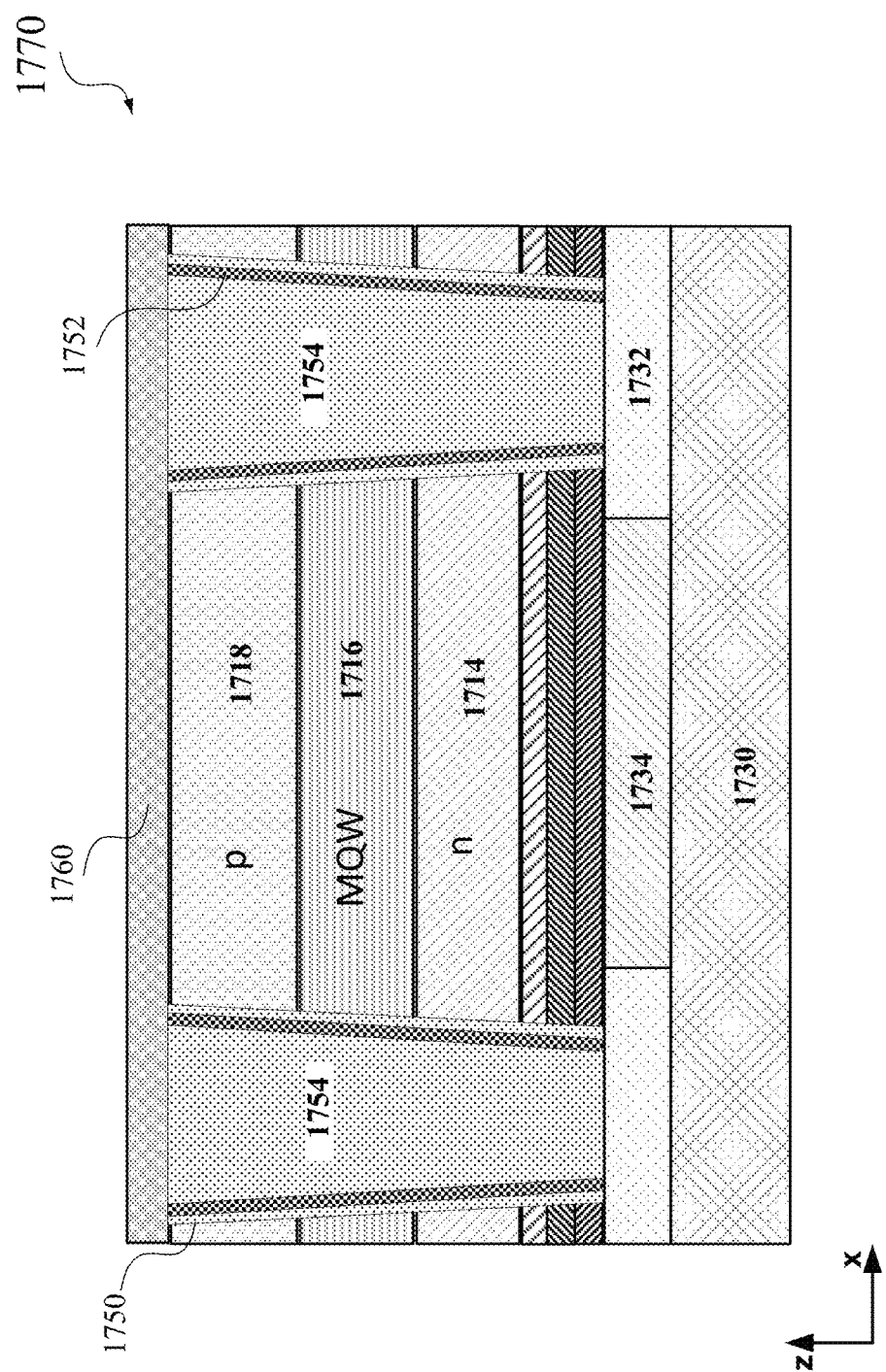

FIG. 17G shows a micro-LED device 1770 formed by p-side processes after the formation of the array of mesa structures 1705. As illustrated, one or more passivation layers 1750 (e.g., a $SiO_2$, $Al_2O_3$, or SiN layer) may be deposited on sidewalls of mesa structures 1705. One or more metal materials 1752 (e.g., including a reflective metal such as Al, Ag, or Au, a barrier material such as TiN or TaN, and a filling metal such as Au, Cu, Al, or W) may be deposited on passivation layer 1750 and/or may fill gaps between mesa structures 1705 to form mesa sidewall mirrors. In some embodiments, a dielectric material 1754 may be deposited in regions between the mesa structures. A chemical mechanical planarization (CMP) process may be performed to planarize the top surface of mesa structures 1705 and dielectric material 1754. A transparent conductive layer 1760 (e.g., including a transparent conductive oxide such as ITO) may be formed on p-type semiconductor layer 1718 of mesa structures 1705, for example, to form a common-anode layer for the array of micro-LEDs in micro-LED device 1770.

In various embodiments, the mesa structures with inwardly tilted sidewalls formed by the processes of FIGS. 17A-17F may be modified as described above with respect to FIGS. 13C-13M and 15A-16E to form various light extraction features (e.g., concave reflectors), light collimation features (e.g., CPCs), and/or light deflecting features (e.g., reflectors with asymmetrical shapes), thereby improving the light extraction efficiency and the emitted beam profile of the micro-LEDs.

Figure 18A:
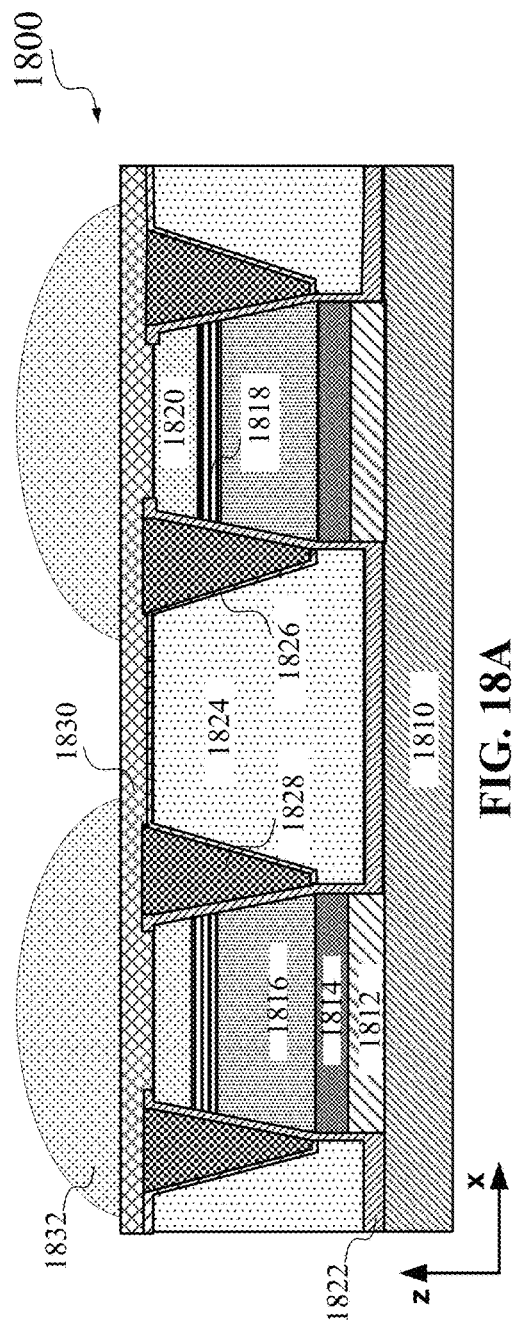
FIG. 18A illustrates an example of a common-anode micro-LED device according to certain embodiments.

FIG. 18A illustrates an example of a common-anode micro-LED device 1800 according to certain embodiments. Common-anode micro-LED device 1800 may be fabricated by the processes of FIGS. 17A-17F followed by the processes of FIGS. 13C-13M. In the illustrated example, common-anode micro-LED device 1800 may include a backplane wafer 1810 and mesa structures that each include a bonding layer 1812, a back reflector layer 1814, an n-type semiconductor layer 1816, an active layer 1818, and a p-type semiconductor layer 1820, as described above with respect to FIGS. 17A-17G. P-type semiconductor layer 1820 may be on top of each mesa structure. A passivation layer 1822 (e.g., including a high-index transparent dielectric such as $Al_2O_3$) may be deposited on sidewalls of each mesa structure as described above with respect to FIG. 13C. A dielectric material layer 1824 may be deposited on passivation layer 1822 and in regions between the mesa structures, and may be etched as described above with respect to FIGS. 13D-13H to remove the dielectric material in regions surrounding the mesa structures and form cavities surrounding the mesa structures. A reflective metal layer 1826 may be deposited on exposed surfaces of dielectric material layer 1824. A high-refractive index material 1828 may be deposited in the cavities surrounding the mesa structures. A center region of passivation layer 1822 on top of p-type semiconductor layer 1820 in each mesa structure may be removed to expose p-type semiconductor layer 1820, and a transparent conductive layer 1830 (e.g., a common anode) may be formed on the exposed p-type semiconductor layer 1820, passivation layer 1822, and high-refractive index material 1828. In some embodiments, an array of micro-lenses 1832 may be formed on transparent conductive layer 1830 to extract and collimate light emitted in active layer 1818.

In common-anode micro-LED device 1800, the modified mesa structures may have outwardly tilted sidewalls at reflective metal layer 1826, and active layer 1818 may be close to the light-emitting surface on the side of p-type semiconductor layer 1820. Therefore, the light extraction efficiency may be improved.

Figure 18C:
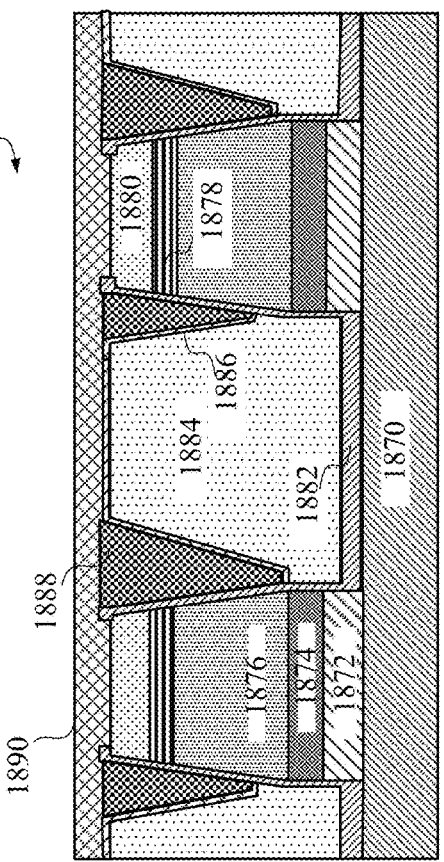
FIG. 18C illustrates yet another example of a common-anode micro-LED device according to certain embodiments.
Figure 18B:
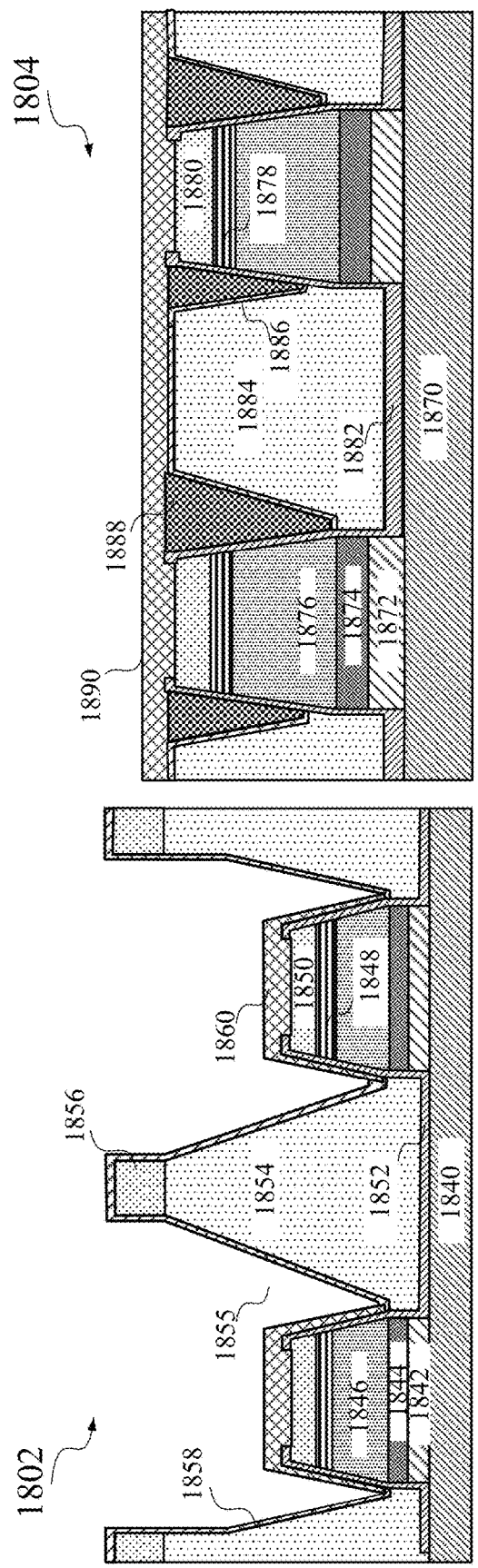
FIG. 18B illustrates another example of a common-anode micro-LED device according to certain embodiments.

FIG. 18B illustrates another example of a common-anode micro-LED device 1802 according to certain embodiments. Micro-LED device 1802 may include a backplane wafer 1840 and mesa structures that each include a bonding layer 1842, a reflector layer 1844, an n-type semiconductor layer 1846, an active layer 1848, and a p-type semiconductor layer 1850, as described above with respect to FIGS. 17A-17G. P-type semiconductor layer 1850 may be on top of each mesa structure. A passivation layer 1852 (e.g., including a high-index transparent dielectric such as $Al_2O_3$) may be deposited on sidewalls of each mesa structure as described above with respect to FIG. 13C. As described above with respect to FIG. 15B, a thick dielectric material layer 1854 may be deposited on passivation layer 1852 and in regions between the mesa structures, and may be etched as described above with respect to FIGS. 13E-13H to remove the dielectric material in regions above and surrounding the mesa structures and form cavities 1855 surrounding the mesa structures. A second dielectric layer 1856 may be deposited on dielectric material layer 1854 and may then be patterned. In some embodiments, second dielectric layer 1856 may be deposited on dielectric material layer 1854 and may then be etched before dielectric material layer 1854 is etched. A reflective metal layer 1858 may be deposited on exposed surfaces of dielectric material layer 1854 and second dielectric layer 1856. A center region of passivation layer 1852 on top of p-type semiconductor layer 1850 in each mesa structure may be removed to expose p-type semiconductor layer 1850, and a transparent conductive layer 1860 (which may function as p-contacts) may be formed on the exposed p-type semiconductor layer 1850 and passivation layer 1852. In some embodiments, a high-refractive index material (e.g., high-refractive index material 1332) may be deposited in cavities 1855 surrounding the mesa structures, before transparent conductive layer 1860 is formed.

Reflective metal layer 1858 deposited on exposed surfaces of dielectric material layer 1854 and second dielectric layer 1856 may form CPCs with high sidewalls. The CPCs of micro-LED device 1802 may collimate the light emitted in active layer 1848. Therefore, more light emitted in active layer 1848 and coupled out of micro-LED device 1802 may have emission angles within about ±18.5°, without using a micro-lens (e.g., micro-lens 1832). In addition, active layer 1848 may be close to the light-emitting surface on the side of p-type semiconductor layer 1850. Therefore, the light extraction efficiency of the micro-LEDs may be improved.

FIG. 18C illustrates another example of a common-anode micro-LED device 1804 according to certain embodiments. In the illustrated example, micro-LED device 1804 may include a backplane wafer 1870 and mesa structures that each include a bonding layer 1872, a reflector layer 1874, an n-type semiconductor layer 1876, an active layer 1878, a p-type semiconductor layer 1880, as described above with respect to FIGS. 17A-17F. P-type semiconductor layer 1880 may be on top of each mesa structure. A passivation layer 1882 (e.g., including a high-index transparent dielectric such as $Al_2O_3$) may be deposited on sidewalls of each mesa structure as described above with respect to FIG. 13C. A dielectric material layer 1884 may be deposited on passivation layer 1882 and in regions between the mesa structures, and may be etched as described above with respect to FIGS. 13E-13H to remove the dielectric material in regions surrounding the mesa structures and form cavities surrounding the mesa structures. As described above with respect to FIG. 16A, the etch mask and the etching process may be selected such that dielectric material layer 1884 surrounding the mesa structures may be etched asymmetrically to form cavities that are asymmetrical with respect to the centers of the mesa structure. A reflective metal layer 1886 may be deposited on exposed surfaces of dielectric material layer 1884 and may have an asymmetrical shape with respect to the centers of the etched mesa structures due to the asymmetrical shape of the cavities. A high-refractive index material 1888 may be deposited in the cavities surrounding the mesa structures. High-refractive index material 1888 may include, for example, a dielectric material (e.g., $TiO_2$, $ZrO_2$, $HfO_2$, $Ta_2O_5$, $WO_3$, $Nb_2O_5$, $Si_3N_4$, TiN, ZrN, or HfN) or a semiconductor material (e.g., GaN or SiC). In some embodiments, high-refractive index material 1888 may have a refractive index equal to or greater than a refractive index of the epitaxial layers of the mesa structures for visible light. A center region of passivation layer 1882 on top of p-type semiconductor layer 1880 in each mesa structure may be removed to expose p-type semiconductor layer 1880, and a transparent conductive layer 1890 (e.g., a common anode) may be formed on the exposed p-type semiconductor layer 1880, passivation layer 1882, and high-refractive index material 1888. Due to its asymmetric shape, reflective metal layer 1886 may deflect the light emitted in the active region asymmetrically, such that the chief ray of the light beam emitted by a micro-LED may be in a direction different from the surface-normal direction (e.g., the z direction), as described above with respect to FIG. 16A.

In common-anode micro-LED device 1804, the modified mesa structure of each micro-LED may include the etched semiconductor mesa structures with inwardly tilted sidewalls, passivation layer 1882 on sidewalls of the etched semiconductor mesa structure, high-refractive index material 1888, and reflective metal layer 1886, and may have outwardly tilted sidewalls at reflective metal layer 1886. In addition, active layer 1878 may be close to the light-emitting surface on the side of p-type semiconductor layer 1880. Therefore, the light extraction efficiency may be improved. Even though not shown in FIG. 18C, in some embodiments, an array of micro-lenses may be formed on transparent conductive layer 1890 to collimate the emitted light.

Figure 19:
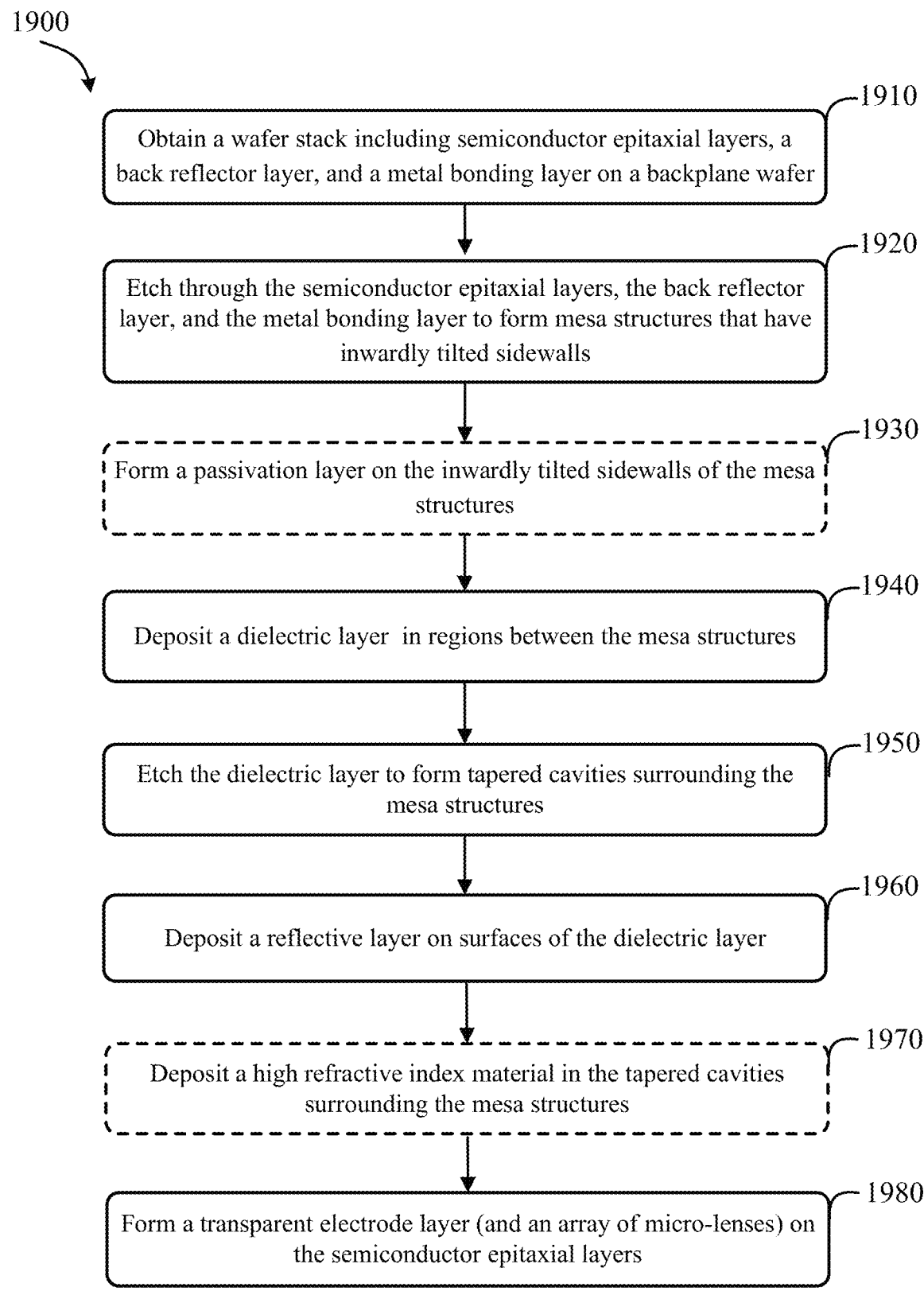
FIG. 19 includes a flowchart illustrating an example of a method of fabricating a micro-LED device with improved light extraction efficiency according to certain embodiments.

FIG. 19 includes a flowchart 1900 illustrating an example of a process of fabricating a micro-LED device according to certain embodiments. It is noted that the specific operations illustrated in FIG. 19 provide a particular process of fabricating a micro-LED device. Other sequences of operations may be performed according to alternative embodiments. Moreover, the individual operations illustrated in FIG. 19 may include multiple sub-steps that may be performed in various sequences as appropriate to the individual operation. Furthermore, additional operations may be added or some operations may not be performed depending on the particular applications. One of ordinary skill in the art would recognize many variations, modifications, and alternatives.

Operations in block 1910 of flowchart 1900 may include obtaining a wafer stack that includes a backplane wafer, and a layer stack bonded to the backplane wafer. The layer stack may include semiconductor epitaxial layers, a back reflector layer, and a metal bonding layer bonded to the backplane wafer. The semiconductor epitaxial layers may include an n-type semiconductor layer (e.g., an n-type GaN layer), an active layer (including QWs configured to emit visible light), and a p-type semiconductor layer (e.g., a p-type GaN layer). As described above with respect to FIGS. 17A-17E, in some embodiments, the wafer stack may be fabricated by obtaining a first wafer that includes a first substrate and the semiconductor epitaxial layers grown on the first substrate, bonding a second substrate to the semiconductor epitaxial layers of the first wafer, removing the first substrate of the first wafer, depositing the back reflector layer on the semiconductor epitaxial layers, forming a first metal layer on the back reflector layer, bonding a second metal layer on the backplane wafer to the first metal layer, and removing the second substrate. In some embodiments, the back reflector layer may be coupled to the p-type semiconductor layer. In some embodiments, the back reflector layer may be coupled to the n-type semiconductor layer.

Operations in block 1920 may include etching through the semiconductor epitaxial layers, the reflector layer, and the metal bonding layer to form individual mesa structures that have inwardly tilted sidewalls, as described above with respect to, for example, FIG. 11E, 13B, or 17F. Operations in block 1930 may include forming a passivation layer (e.g., an $Al_2O_3$ layer) on sidewalls of the mesa structures as described above with respect to, for example, FIGS. 11F, 13C, 15A-16D, 17G, and 18A-18C. Operations in block 1940 may include depositing a dielectric layer (e.g., a $SiO_2$ layer) on the passivation layer and in regions between the mesa structures, as described above with respect to FIGS. 13D, 15A-16E, 17G, and 18A-18C. In some embodiments, two or more dielectric layers may be deposited. The top surface of the dielectric layer may be planarized using, for example, CMP. In some embodiments, the top surface of the dielectric layer may be higher than the top surface of an etched mesa structure and the top surface of the passivation layer.

Operations in block 1950 may include etching the dielectric layer to form cavities surrounding the mesa structures, where the cavities may have outwardly tilted sidewalls, as described above with respect to FIGS. 13G, 15A-16E, and 18A-18C. In some embodiments, the cavities may be asymmetrical with respect to centers of the mesa structures. Operations in block 1960 may include forming a reflective layer (e.g., an Al layer) on exposed surfaces of the dielectric layer, as described above with respect to FIGS. 13I, 15A-16E, and 18A-18C. The reflective layer may form various light extraction features (e.g., concave mirrors), light collimation features (e.g., CPCs), and/or light deflecting features (e.g., reflectors with asymmetrical shapes), thereby improving the light extraction efficiency and/or the emitted beam profile of the micro-LEDs. Optional operations in block 1970 may include depositing a high-refractive index material (e.g., $TiO_2$, SiN, SiC, or sputtered GaN) in the cavities surrounding the mesa structures as described above with respect to, for example, FIGS. 13K, 15A-16E, and 18A-18C. The high-refractive index material may have a refractive index greater than, for example, about 1.75 for visible light. In some embodiments, the refractive index of the high-refractive index material may be equal to or greater than the refractive index of the semiconductor epitaxial layers. Operations in block 1980 may include forming a transparent electrode layer on the mesa structures as described above with respect to, for example, FIGS. 13M, 15A-16E, and 18A-18C. The transparent electrode layer (e.g., an ITO layer) may be the p-contacts or n-contacts of the micro-LEDs. In some embodiments, an array of micro-lenses may be formed on the transparent electrode layer as described above with respect to, for example, FIGS. 13M, 16D, 16E, and 18A.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 20:
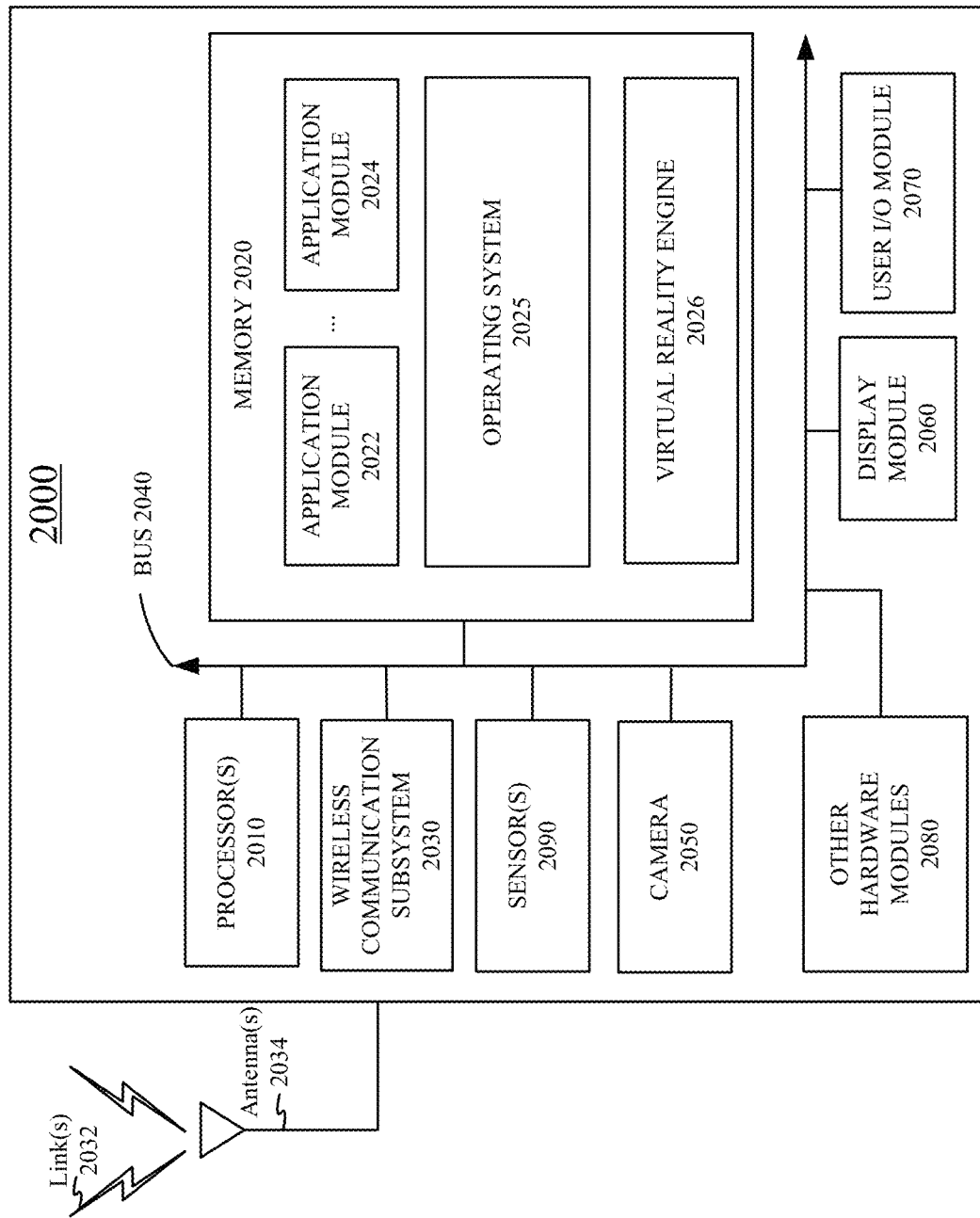
FIG. 20 is a simplified block diagram of an electronic system of an example of a near-eye display according to certain embodiments.

FIG. 20 is a simplified block diagram of an example electronic system 2000 of an example near-eye display (e.g., HMD device) for implementing some of the examples disclosed herein. Electronic system 2000 may be used as the electronic system of an HMD device or other near-eye displays described above. In this example, electronic system 2000 may include one or more processor(s) 2010 and a memory 2020. Processor(s) 2010 may be configured to execute instructions for performing operations at a number of components, and can be, for example, a general-purpose processor or microprocessor suitable for implementation within a portable electronic device. Processor(s) 2010 may be communicatively coupled with a plurality of components within electronic system 2000. To realize this communicative coupling, processor(s) 2010 may communicate with the other illustrated components across a bus 2040. Bus 2040 may be any subsystem adapted to transfer data within electronic system 2000. Bus 2040 may include a plurality of computer buses and additional circuitry to transfer data.

Memory 2020 may be coupled to processor(s) 2010. In some embodiments, memory 2020 may offer both short-term and long-term storage and may be divided into several units. Memory 2020 may be volatile, such as static random access memory (SRAM) and/or dynamic random access memory (DRAM) and/or non-volatile, such as read-only memory (ROM), flash memory, and the like. Furthermore, memory 2020 may include removable storage devices, such as secure digital (SD) cards. Memory 2020 may provide storage of computer-readable instructions, data structures, program modules, and other data for electronic system 2000.

In some embodiments, memory 2020 may store a plurality of application modules 2022 through 2024, which may include any number of applications. Examples of applications may include gaming applications, conferencing applications, video playback applications, or other suitable applications. The applications may include a depth sensing function or eye tracking function. Application modules 2022-2024 may include particular instructions to be executed by processor(s) 2010. In some embodiments, certain applications or parts of application modules 2022-2024 may be executable by other hardware modules 2080. In certain embodiments, memory 2020 may additionally include secure memory, which may include additional security controls to prevent copying or other unauthorized access to secure information.

In some embodiments, memory 2020 may include an operating system 2025 loaded therein. Operating system 2025 may be operable to initiate the execution of the instructions provided by application modules 2022-2024 and/or manage other hardware modules 2080 as well as interfaces with a wireless communication subsystem 2030 which may include one or more wireless transceivers. Operating system 2025 may be adapted to perform other operations across the components of electronic system 2000 including threading, resource management, data storage control and other similar functionality.

Wireless communication subsystem 2030 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 2000 may include one or more antennas 2034 for wireless communication as part of wireless communication subsystem 2030 or as a separate component coupled to any portion of the system. Depending on desired functionality, wireless communication subsystem 2030 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 2030 may permit data to be exchanged with a network, other computer systems, and/or any other devices described herein. Wireless communication subsystem 2030 may include a means for transmitting or receiving data, such as identifiers of HMD devices, position data, a geographic map, a heat map, photos, or videos, using antenna(s) 2034 and wireless link(s) 2032.

Embodiments of electronic system 2000 may also include one or more sensors 2090. Sensor(s) 2090 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor.

Electronic system 2000 may include a display module 2060. Display module 2060 may be a near-eye display, and may graphically present information, such as images, videos, and various instructions, from electronic system 2000 to a user. Such information may be derived from one or more application modules 2022-2024, virtual reality engine 2026, one or more other hardware modules 2080, a combination thereof, or any other suitable means for resolving graphical content for the user (e.g., by operating system 2025). Display module 2060 may use LCD technology, LED technology (including, for example, OLED, ILED, u-LED, AMO-LED, TOLED, etc.), light emitting polymer display (LPD) technology, or some other display technology.

Electronic system 2000 may include a user input/output module 2070. User input/output module 2070 may allow a user to send action requests to electronic system 2000. An action request may be a request to perform a particular action. For example, an action request may be to start or end an application or to perform a particular action within the application. User input/output module 2070 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 2000. In some embodiments, user input/output module 2070 may provide haptic feedback to the user in accordance with instructions received from electronic system 2000. For example, the haptic feedback may be provided when an action request is received or has been performed.

Electronic system 2000 may include a camera 2050 that may be used to take photos or videos of a user, for example, for tracking the user's eye position. Camera 2050 may also be used to take photos or videos of the environment, for example, for VR, AR, or MR applications. Camera 2050 may include, for example, a complementary metal-oxide-semiconductor (CMOS) image sensor with a few millions or tens of millions of pixels. In some implementations, camera 2050 may include two or more cameras that may be used to capture 3-D images.

In some embodiments, electronic system 2000 may include a plurality of other hardware modules 2080. Each of other hardware modules 2080 may be a physical module within electronic system 2000. While each of other hardware modules 2080 may be permanently configured as a structure, some of other hardware modules 2080 may be temporarily configured to perform specific functions or temporarily activated. Examples of other hardware modules 2080 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 2080 may be implemented in software.

In some embodiments, memory 2020 of electronic system 2000 may also store a virtual reality engine 2026. Virtual reality engine 2026 may execute applications within electronic system 2000 and receive position information, acceleration information, velocity information, predicted future positions, or any combination thereof of the HMD device from the various sensors. In some embodiments, the information received by virtual reality engine 2026 may be used for producing a signal (e.g., display instructions) to display module 2060. For example, if the received information indicates that the user has looked to the left, virtual reality engine 2026 may generate content for the HMD device that mirrors the user's movement in a virtual environment. Additionally, virtual reality engine 2026 may perform an action within an application in response to an action request received from user input/output module 2070 and provide feedback to the user. The provided feedback may be visual, audible, or haptic feedback. In some implementations, processor(s) 2010 may include one or more GPUs that may execute virtual reality engine 2026.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean A, B, C, or any combination of A, B, and/or C, such as AB, AC, BC, AA, ABC, AAB, AABBCCC, etc.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A light source comprising:
a backplane wafer including electrical circuits fabricated thereon; and
an array of light emitting diodes (LEDs) coupled to the backplane wafer, each LED of the array of LEDs comprising:
a mesa structure including semiconductor epitaxial layers and characterized by inwardly tilted mesa sidewalls;
a high-refractive index material region surrounding the mesa structure, the high-refractive index material region including outwardly tilted sidewalls and characterized by a refractive index greater than 1.75 for visible light; and
a reflective layer on the outwardly tilted sidewalls of the high-refractive index material region, wherein the high-refractive index material region fills an entire region between the mesa structure and the reflective layer.

2. The light source of claim 1, wherein:
the mesa structure comprises a passivation layer at the inwardly tilted mesa sidewalls of the mesa structure;
the semiconductor epitaxial layers include an n-type semiconductor layer, an active layer configured to emit visible light, and a p-type semiconductor layer; and
the mesa structure further comprises:
a back reflector layer coupled to the semiconductor epitaxial layers; and
a bonding layer electrically connected to the back reflector layer and bonded to the backplane wafer.

3. The light source of claim 2, wherein:
the back reflector layer is coupled to the p-type semiconductor layer; and
the array of LEDs includes a transparent conductive layer electrically coupled to the n-type semiconductor layer of the mesa structure of each LED of the array of LEDs.

4. The light source of claim 2, wherein:
the back reflector layer is coupled to the n-type semiconductor layer; and
the array of LEDs includes a transparent conductive layer electrically coupled to the p-type semiconductor layer of the mesa structure of each LED of the array of LEDs.

5. The light source of claim 1, wherein the reflective layer on the outwardly tilted sidewalls of the high-refractive index material region forms a compound parabolic concentrator.

6. The light source of claim 1, wherein the high-refractive index material region is asymmetrical with respect to a center of the mesa structure.

7. The light source of claim 1, further comprising an array of micro-lenses on the array of LEDs, wherein a width of each micro-lens of the array of micro-lenses is greater than a width of each LED of the array of LEDs.

8. The light source of claim 1, further comprising dielectric material regions surrounding each LED of the array of LEDs, wherein the reflective layer is formed on surfaces of the dielectric material regions.

9. The light source of claim 8, wherein at least a region of the dielectric material regions surrounding an LED of the array of LEDs is higher than the mesa structure of the LED.

10. The light source of claim 8, wherein a portion of the reflective layer of an LED of the array of LEDs is higher than the mesa structure of the LED.

11. The light source of claim 1, wherein the refractive index of the high-refractive index material region is equal to or greater than a refractive index of the semiconductor epitaxial layers.

12. The light source of claim 1, wherein:
The semiconductor epitaxial layers include GaN; and
the high-refractive index material region includes $TiO_2$, SiN, or an undoped semiconductor material.

13. A light source comprising:
a backplane wafer including electrical circuits fabricated thereon; and
an array of light emitting diodes (LEDs) coupled to the backplane wafer, each LED of the array of LEDs including:
a mesa structure including semiconductor epitaxial layers and characterized by inwardly tilted mesa sidewalls;
and a reflective layer surrounding the semiconductor epitaxial layers of the mesa structure and including outwardly tilted inner sidewalls, wherein the reflective layer forms a compound parabolic concentrator that is configured to collimate light emitted from the mesa structure.

14. The light source of claim 13, wherein the mesa structure includes a passivation layer at the inwardly tilted mesa sidewalls.

15. The light source of claim 13, further comprising a high-refractive index material between the inwardly tilted mesa sidewalls and the reflective layer, the high-refractive index material characterized by a refractive index equal to or greater than a refractive index of the semiconductor epitaxial layers.

16. The light source of claim 13, wherein the reflective layer surrounding the semiconductor epitaxial layers of the mesa structure is asymmetrical with respect to a center of the mesa structure.

17. The light source of claim 13, wherein a portion of the reflective layer is higher than the mesa structure.

18. The light source of claim 13, further comprising dielectric material regions surrounding each LED of the array of LEDs, wherein the reflective layer is on surfaces of the dielectric material regions.

* * * * *